(12) United States Patent
Chung et al.

(10) Patent No.: US 10,096,714 B2
(45) Date of Patent: Oct. 9, 2018

(54) INTEGRATED CIRCUIT DEVICE AND METHOD OF MANUFACTURING THE SAME

(71) Applicant: Samsung Electronics Co., Ltd., Suwon-si, Gyeonggi-do (KR)

(72) Inventors: Jae-yup Chung, Yongin-si (KR); Myung-yoon Um, Seoul (KR); Dong-ho Cha, Seongnam-si (KR); Jung-gun You, Ansan-si (KR); Gi-gwan Park, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/446,322

(22) Filed: Mar. 1, 2017

(65) Prior Publication Data

US 2017/0256645 A1    Sep. 7, 2017

(30) Foreign Application Priority Data

Mar. 7, 2016 (KR) .................. 10-2016-0027138

(51) Int. Cl.
*H01L 29/78* (2006.01)
*H01L 21/8238* (2006.01)
(Continued)

(52) U.S. Cl.
CPC .. *H01L 29/7854* (2013.01); *H01L 21/823807* (2013.01); *H01L 21/823814* (2013.01); *H01L 21/823821* (2013.01); *H01L 21/823878* (2013.01); *H01L 27/0924* (2013.01); *H01L 29/0649* (2013.01); *H01L 29/0847* (2013.01); *H01L 29/16* (2013.01); *H01L 29/161* (2013.01);
(Continued)

(58) Field of Classification Search
CPC ......... H01L 21/823878; H01L 21/8239; H01L 21/823885; H01L 29/0649; H01L 27/0924
See application file for complete search history.

(56) References Cited

U.S. PATENT DOCUMENTS 8,987,823 B2    3/2015    Cheng et al.
9,054,211 B2    6/2015    Cheng et al.
(Continued)

FOREIGN PATENT DOCUMENTS

KR    10-1999-0053968 A    7/1999
KR    10-2016-0107009 A    9/2016
(Continued)

*Primary Examiner* — Sonya D McCall Shepard
(74) *Attorney, Agent, or Firm* — Lee & Morse, P.C.

(57) ABSTRACT

An integrated circuit (IC) device includes a pair of fin-shaped active areas that are adjacent to each other with a fin separation area therebetween, the pair of fin-shaped active areas extend in a line, and a fin separation insulating structure in the fin separation area, wherein the pair of fin-shaped active areas includes a first fin-shaped active area having a first corner defining part of the fin separation area, and wherein the fin separation insulating structure includes a lower insulating pattern that covers sidewalls of the pair of fin-shaped active areas, and an upper insulating pattern on the lower insulating pattern to cover at least part of the first corner, the upper insulating pattern having a top surface at a level higher than a top surface of each of the pair of fin-shaped active areas.

18 Claims, 51 Drawing Sheets

(51) Int. Cl.
   *H01L 27/092*   (2006.01)
   *H01L 29/06*    (2006.01)
   *H01L 29/08*    (2006.01)
   *H01L 29/16*    (2006.01)
   *H01L 29/161*   (2006.01)

(52) U.S. Cl.
   CPC ...... *H01L 29/1608* (2013.01); *H01L 29/7843* (2013.01)

(56) References Cited

U.S. PATENT DOCUMENTS

| | | |
|---|---|---|
| 2007/0134884 A1 | 6/2007 | Kim et al. |
| 2015/0050792 A1 | 2/2015 | Samavedam et al. |
| 2015/0279964 A1 | 10/2015 | Duriez et al. |
| 2015/0287829 A1 | 10/2015 | Kim et al. |
| 2015/0295068 A1 | 10/2015 | Yin et al. |
| 2015/0325575 A1 | 11/2015 | Park et al. |
| 2016/0247876 A1* | 8/2016 | Chung ................ H01L 29/0649 |
| 2016/0260715 A1 | 9/2016 | Chung |
| 2016/0284705 A1 | 9/2016 | Chung |
| 2016/0284706 A1 | 9/2016 | Chung et al. |
| 2016/0380075 A1 | 12/2016 | Chung et al. |

FOREIGN PATENT DOCUMENTS

| | | |
|---|---|---|
| KR | 10-2016-0115018 A | 10/2016 |
| KR | 10-2016-0115019 A | 10/2016 |
| KR | 10-2017-0000539 A | 1/2017 |

* cited by examiner

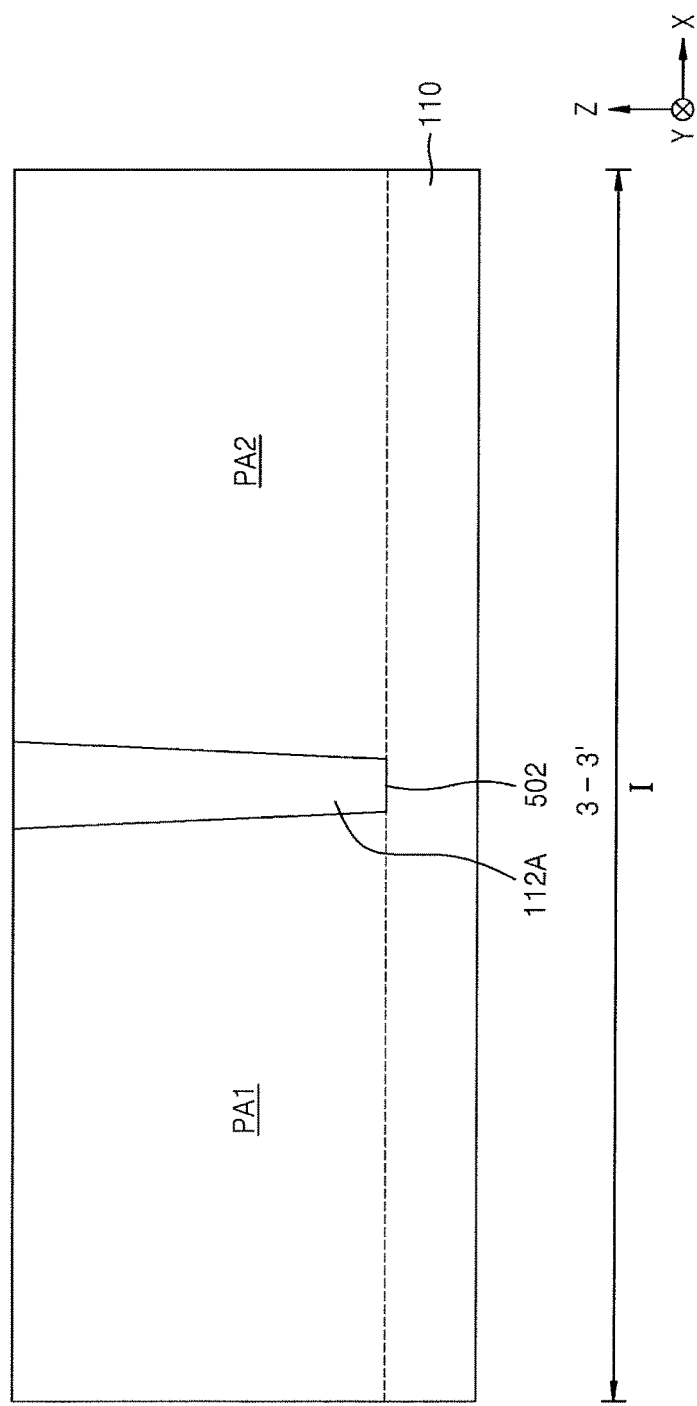

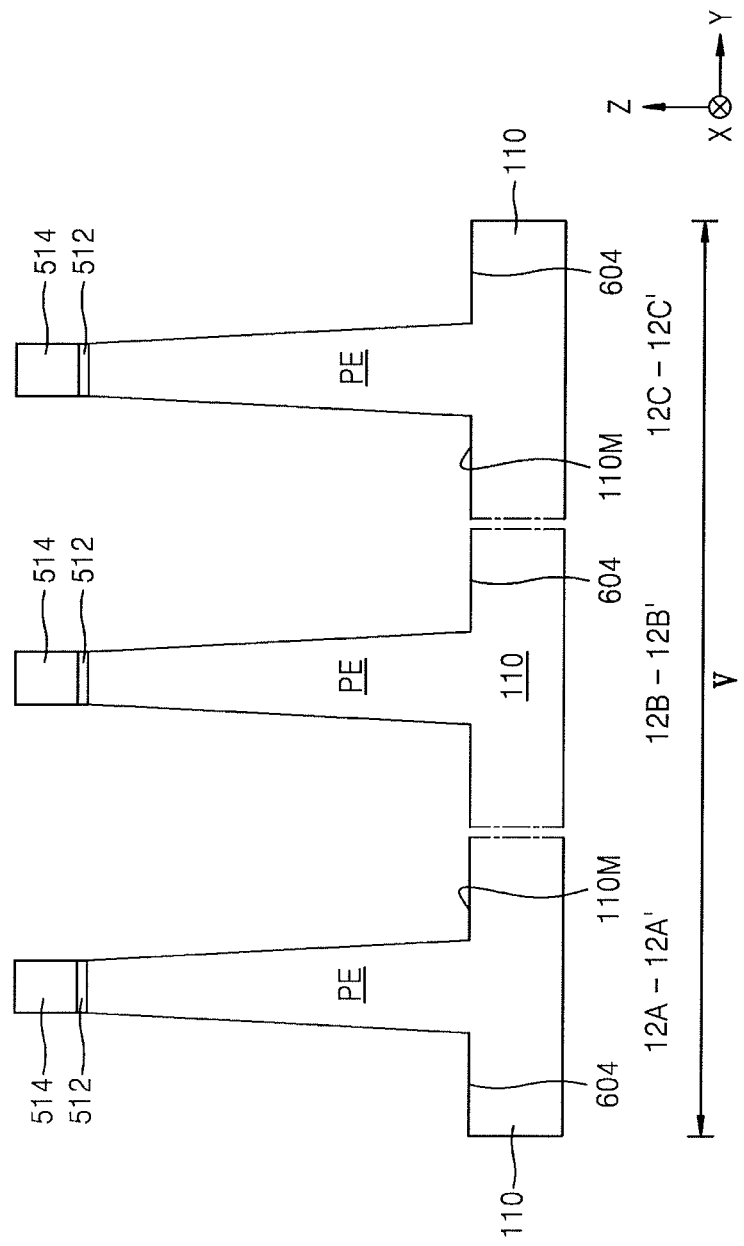

INTEGRATED CIRCUIT DEVICE AND METHOD OF MANUFACTURING THE SAME

CROSS-REFERENCE TO RELATED APPLICATION

Korean Patent Application No. 10-2016-0027138, filed on Mar. 7, 2016, in the Korean Intellectual Property Office, and entitled: "Integrated Circuit Device and Method of Manufacturing the Same," is incorporated by reference herein in its entirety.

BACKGROUND

1. Field

Embodiments relate to an integrated circuit device and a method of manufacturing the same, and more particularly, to an integrated circuit device including a fin field effect transistor, and a method of manufacturing the same.

2. Description of the Related Art

With the development of electronic technology, semiconductor devices have been recently down-scaled. Since a semiconductor device requires both a fast operation speed and operational accuracy, research into structural optimization of transistors of the semiconductor device is being conducted in various aspects. In particular, with the reduction in transistor size, there is a need for technological development to implement an integrated circuit (IC) device that secures a target height and width of a top portion of a fin-shaped active area that provides a channel region of a transistor and has a stable structure to prevent a short between adjacent conductive regions.

SUMMARY

Embodiments provide an IC device which has a fin field effect transistor with improved performance by preventing a short between adjacent conductive regions.

Embodiments also provide a method of manufacturing an IC device with a fin field effect transistor with improved performance by preventing a short between adjacent conductive regions.

According to an aspect of embodiments, there is provided an IC device including a pair of fin-shaped active areas that are adjacent to each other with a fin separation area therebetween and extend in a line; and a fin separation insulating structure in the fin separation area. The pair of fin-shaped active areas may include a first fin-shaped active area having a first chamfered corner that defines part of the fin separation area. The fin separation insulating structure includes: a lower insulating pattern that covers sidewalls of the pair of fin-shaped active areas; and an upper insulating pattern on the lower insulating pattern to cover at least part of the first chamfered corner, the upper insulating pattern having a top surface at a level higher than a top surface of each of the pair of fin-shaped active areas.

According to another aspect of embodiments, there is provided an IC device including: a pair of fin-shaped active areas that are adjacent to each other with a fin separation area therebetween and extend in a line along a first direction, the fin separation area having a first width in the first direction; a fin separation insulating structure including a lower insulating pattern in the fin separation area between the pair of fin-shaped active areas, and an upper insulating pattern on the lower insulating pattern, the upper insulating pattern extending in a second direction that intersects the first direction, having a convex rounded top surface profile, and having a second width greater than the first width in the first direction; a normal gate that extends in the second direction in a first fin-shaped active area selected from the pair of fin-shaped active areas; and a semiconductor epitaxial pattern that is on a region of the first fin-shaped active area between the normal gate and the fin separation insulating structure, spaced apart from the fin separation insulating structure. Top surfaces of the first fin-shaped active area at both sides of the semiconductor epitaxial pattern have different heights.

According to another aspect of embodiments, there is provided an IC device including: a pair of first fin-shaped active areas that are adjacent to each other with a first fin separation area having a first width therebetween in a first area on a substrate, and extend in a first line; a first fin separation insulating structure that extends in the first fin separation area in a direction that intersects the first line and has a first top surface having a convex rounded top surface profile, the first top surface having a second width that is greater than the first width; a first normal gate that extends on a region of one selected from the pair of first fin-shaped active areas; and a first semiconductor epitaxial pattern that is on a region of the one selected from the pair of first fin-shaped active areas between the first normal gate and the first fin separation insulating structure, the first semiconductor epitaxial pattern being spaced apart from the first fin separation insulating structure. Top surfaces of the one selected from the pair of first fin-shaped active areas at both sides of the first semiconductor epitaxial pattern have different heights.

According to another aspect of embodiments, there is provided an IC device including: three fin-shaped active areas that sequentially extend in a line along a first direction; a first fin separation insulating structure that extends in a first fin separation area between a first fin-shaped active area and a second fin-shaped active area that are adjacent two of the three fin-shaped active areas, in a second direction that intersects the first direction, and has a convex rounded top surface profile; and a second fin separation insulating structure that extends in a second fin separation area between the second fin-shaped active area and a third fin-shaped active area that are adjacent two of the three fin-shaped active areas, in the second direction, and has a convex rounded top surface profile. A length of the second fin-shaped active area in the first direction is less than a length of each of the first and third fin-shaped active areas in the first direction, and a width of a channel area in the second fin-shaped active area is greater than a width of a channel area of each of the first and third fin-shaped active areas.

According to another aspect of embodiments, there is provided an IC device including: a plurality of first type fin-shaped active areas that extend parallel to each other over at least a first length in a first area of a substrate; a pair of fin separation insulating structures that extend in two separate fin separation areas, respectively, in the first area, in a direction that intersects the plurality of first type fin-shaped active areas; and a plurality of second type fin-shaped active areas that extend parallel to each other in a second area of the substrate, continuously over at least the first length. Each of the pair of fin separation insulating structures has a convex rounded top surface profile, and a width of each of the plurality of first type fin-shaped active areas between the pair of fin separation insulating structures is greater than a width of each of the plurality of second type fin-shaped active areas.

According to another aspect of embodiments, there is provided an IC device, including a pair of fin-shaped active areas that are adjacent to each other with a fin separation area therebetween, a normal gate that intersects at least one of the pair of fin-shaped active areas, a source/drain area adjacent the normal gate, and a fin separation insulating structure in the fin separation area, the fin separation insulating structure including a lower insulating pattern overlapping at least a portion of the source/drain area, and an upper insulating pattern on the lower insulating pattern and overlapping at least a portion of the source/drain area, the upper insulating pattern having a larger width than the lower insulating pattern, and having a top surface at a level higher than a top surface of each of the pair of fin-shaped active areas.

According to another aspect of embodiments, there is provided a method of manufacturing an IC device, the method including forming a pair of preliminary active areas that are adjacent to each other with a fin separation area therebetween and extend in a line. A device isolation film that covers sidewalls of each of the pair of preliminary active areas is then formed. A pair of chamfered corners are formed in the pair of preliminary active areas by removing part of the device isolation film in the fin separation area and part of the pair of preliminary active areas, and a lower insulating pattern that defines a recess area in the fin separation area together with the pair of chamfered corners is formed. An upper insulating layer that fills the recess area on the lower insulating pattern and protrudes higher than a top surface of each of the pair of preliminary active areas is formed. A sacrificial spacer that covers opposite sidewalls of the upper insulating layer on the pair of preliminary active areas is formed. Part of the device isolation film is removed to lower a height thereof and at the same time the sacrificial spacer and the upper insulating layer in the fin separation area are removed, thereby to simultaneously form a pair of fin-shaped active areas each having a channel area that protrudes above the device isolation film from the pair of preliminary active areas, and an upper insulating pattern on the lower insulating pattern, the upper insulating pattern having a larger width than the lower insulating pattern. Next, a transistor including a gate line on at least one of the pair of the fin-shaped active areas, and a pair of source/drain areas on opposite sides of the gate line on the at least one of the pair of the fin-shaped active areas is formed.

BRIEF DESCRIPTION OF THE DRAWINGS

Features will become apparent to those of ordinary skill in the art by describing in detail exemplary embodiments with reference to the attached drawings, in which:

FIGS. 24A to 26B illustrate cross-sectional views of stages in a method of manufacturing an IC device according to embodiments.

DETAILED DESCRIPTION

Figure 1:
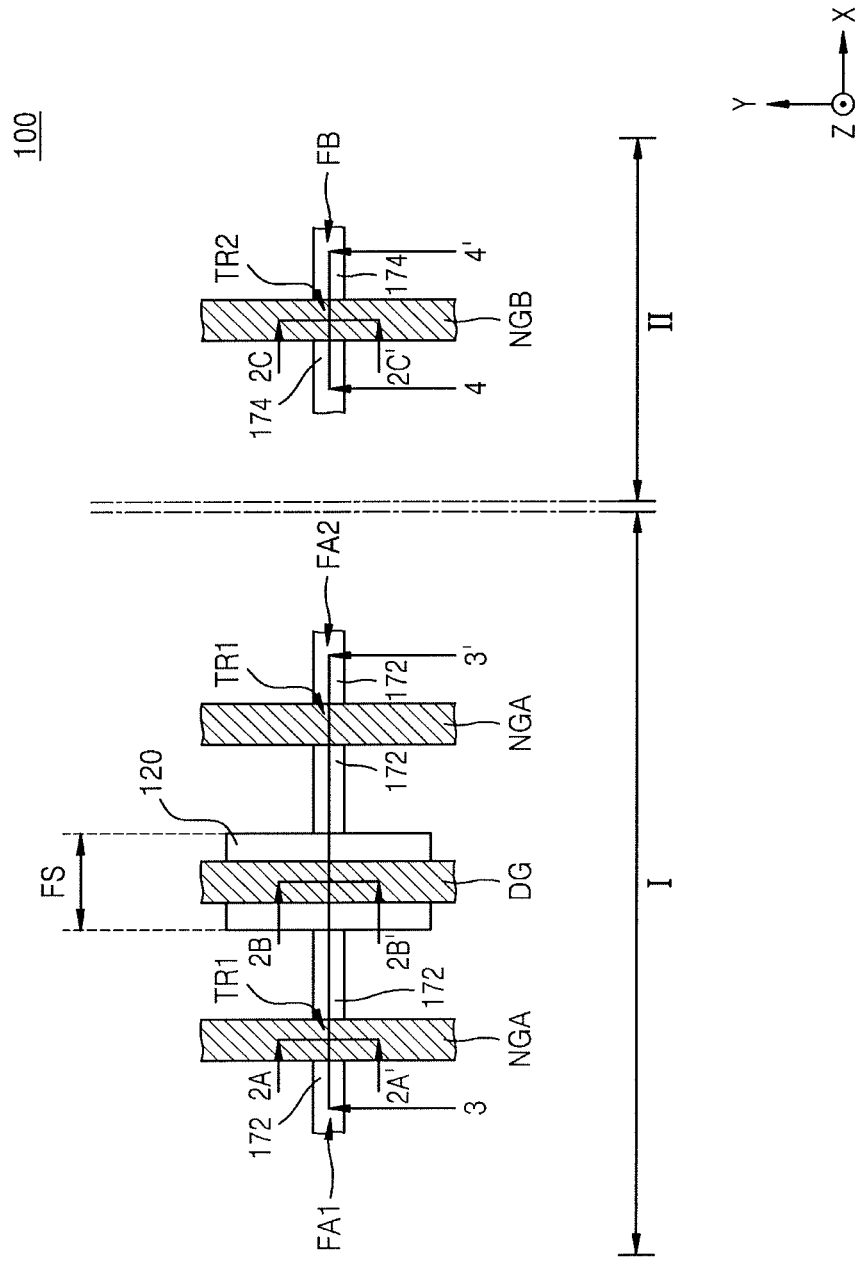
FIG. 1 illustrates a planar layout diagram of main elements of an integrated circuit (IC) device, according to embodiments.

Hereinafter, exemplary embodiments will be described in detail with reference to the accompanying drawings. Like reference numerals in the drawings denote like elements.

FIG. 1 is a planar layout diagram illustrating main elements of an integrated circuit (IC) device 100 according to embodiments.

Referring to FIG. 1, the IC device 100 may include a first area I and a second area II. The first area I and the second area II may be connected to each other or may be spaced apart from each other. In some embodiments, the first area I and the second area II may perform a same function. In some other embodiments, the first area I and the second area II may perform different functions. For example, the first area I may be a part of a logic area, and the second area II may be another part of the logic area. In some other embodiments, the first area I may be one area selected from a memory area and a non-memory area, and the second area II may be another area selected from the memory area and the non-memory area.

The logic area may include various types of logic cells including a plurality of circuit elements, e.g., a transistor, a register, etc., as a standard cell performing a desired logic function, e.g., a buffer. The logic cell may include, e.g., AND, NAND, OR, NOR, XOR (exclusive OR), XNOR (exclusive NOR), INV (inverter), ADD (adder), BUF (buffer), DLY (delay), FIL (filter), multiplexer (MXT/MXIT), OAI (OR/AND/INVERTER), AO (AND/OR), AOI (AND/OR/INVERTER), D flip-flop, reset flip-flop, master-slaver flip-flop, latch, and the like. However, the above cells are merely examples and the logic cell according to embodiments are not limited thereto.

The memory area may include a static random-access memory (SRAM) area, a dynamic random-access memory (DRAM) area, a magnetoresistive random-access memory (MRAM) area, a resistive random-access memory (RRAM) area, or a phase-change random-access memory (PRAM) area. The non-memory area may include the logic area.

The first area I of the IC device 100 may include a pair of first fin-shaped active areas FA1 and FA2 adjacent to each other and extending on a straight line, and a plurality of first normal gates NGA extending across the pair of first fin-shaped active areas FA1 and FA2 on the pair of first fin-shaped active areas FA1 and FA2. A first fin-shaped transistor TR1 may be formed in each region in which the pair of first fin-shaped active areas FA1 and FA2 and the plurality of first normal gates NGA cross each other.

The pair of first fin-shaped active areas FA1 and FA2 may be spaced apart from each other with a fin separation insulating structure 120 formed in a fin separation area FS therebetween. The fin separation insulating structure 120 may extend in a direction parallel to the plurality of first normal gates NGA. A dummy gate DG may be formed on the fin separation insulating structure 120 between a pair of first normal gates NGA. The dummy gate DG may vertically overlap the fin separation insulating structure 120 and may extend in parallel to the plurality of first normal gates NGA. In some exemplary embodiments, the dummy gate DG may be omitted.

The second area II of the IC device 100 may include a second fin-shaped active area FB and a second normal gate NGB extending across the second fin-shaped active area FB on the second fin-shaped active area FB. A second fin-shaped transistor TR2 may be formed in a region in which the second fin-shaped active area FB and the second normal gate NGB intersect each other.

The pair of first fin-shaped active areas FA1 and FA2 are illustrated in the first area I, and the single second fin-shaped active area FB is illustrated in the second area II in FIG. 1, but embodiments are not limited thereto. For example, two or more fin-shaped active areas may be formed in each of the first area I and the second area II, and the number of the fin-shaped active areas is not particularly limited thereto.

Figure 2:
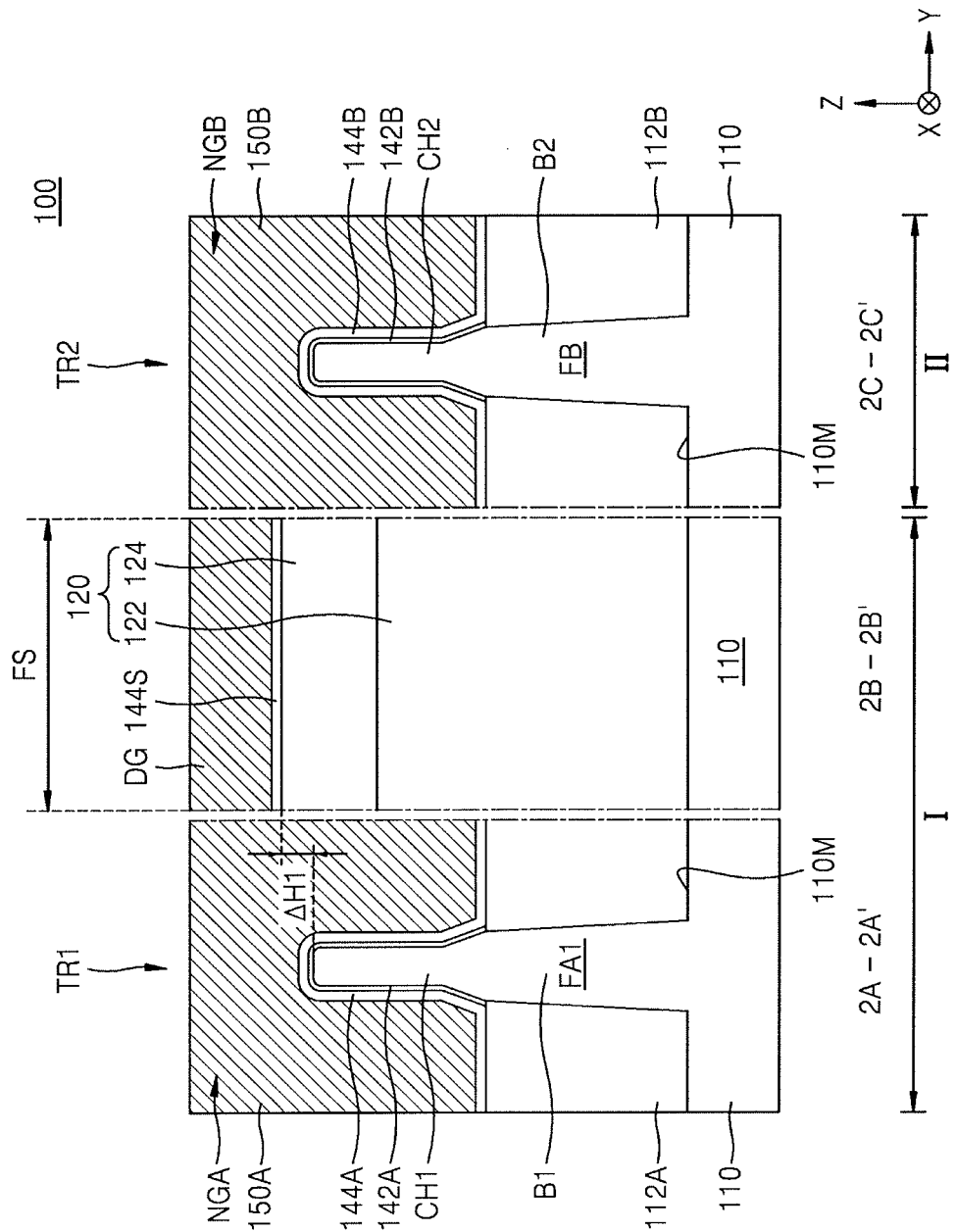
FIG. 2 illustrates a cross-sectional view of main elements of the IC device along line 2A-A', line 2B-2B', and line 2C-2C' of FIG. 1.
Figure 3:
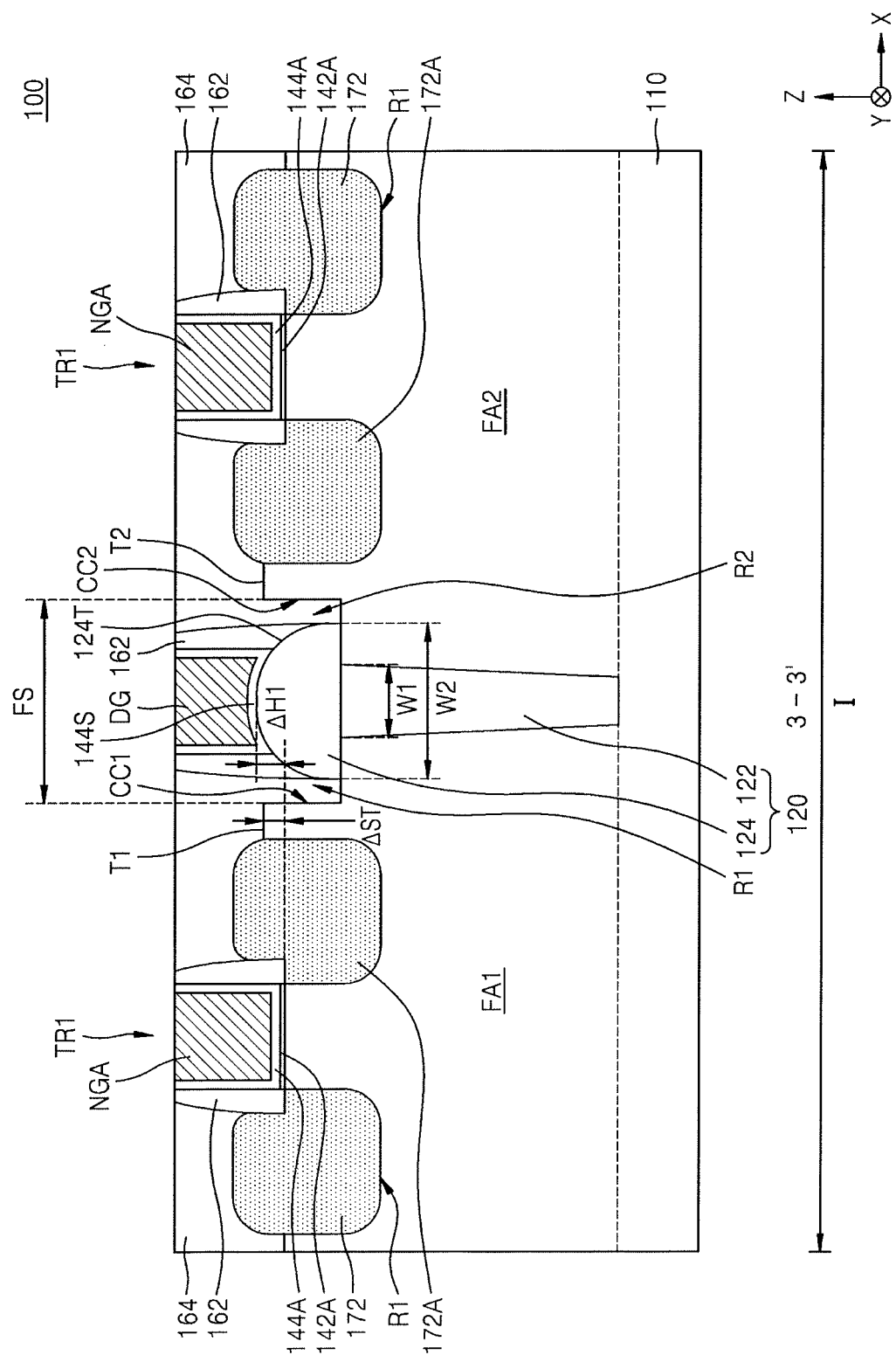
FIG. 3 illustrates a cross-sectional view of main elements of the IC device along line 3-3' of FIG. 1.
Figure 4:
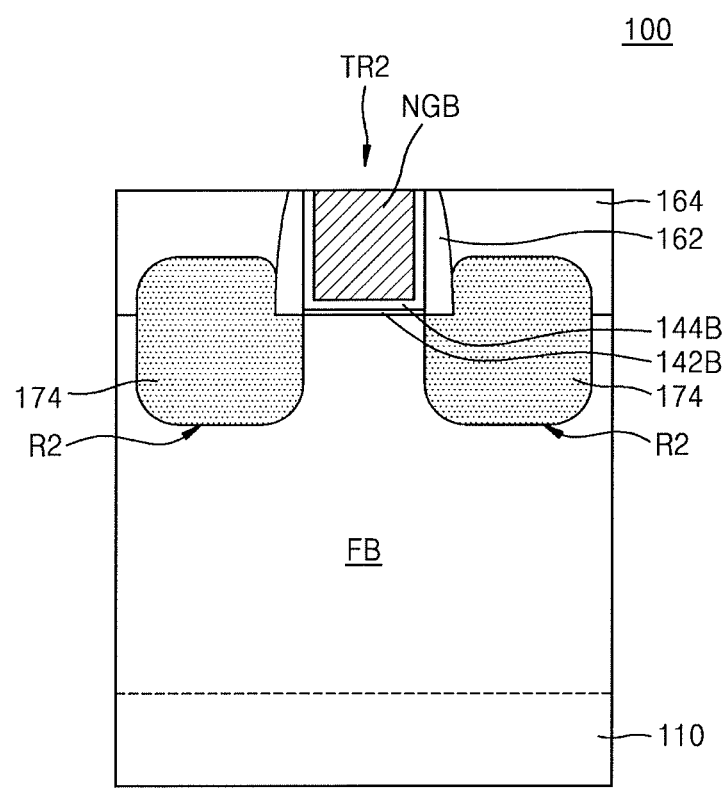
FIG. 4 illustrates a cross-sectional view of main elements of the IC device along line 4-4' of FIG. 1.
Figure 4:
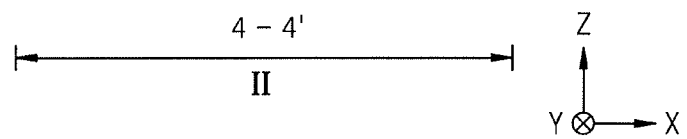

FIG. 2 is a cross-sectional view illustrating main elements of the IC device 100 taken along line 2A-2A', line 2B-2B', and line 2C-2C' of FIG. 1. FIG. 3 is a cross-sectional view of the IC device 100 taken along line 3-3' of FIG. 1. FIG. 4 is a cross-sectional view of the IC device taken along line 4-4' of FIG. 1.

Referring to FIGS. 1 to 4, a pair of first fin-shaped active areas FA1 and FA2 in the first area I of the IC device 100 and a second fin-shaped active area FB in the second area II may protrude from a substrate 110 in a direction (Z direction) perpendicular to a main surface 110M of the substrate 110. In the first area I, the pair of first fin-shaped active areas FA1 and FA2 may be adjacent to each other with the fin separation area FS therebetween, and may extend in a line along a first direction (X direction). In the second area II, the second fin-shaped active area FB may extend along the first direction (X direction). Although FIGS. 1 to 4 illustrate an exemplary structure in which the pair of first fin-shaped active areas FA1 and FA2 in the first area I and the second fin-shaped active area FB in the second area II may extend in the same direction, embodiments are not limited thereto. The pair of first fin-shaped active areas FA1 and FA2 and the second fin-shaped active area FB may extend in different directions.

In the first area I, the pair of first fin-shaped active areas FA1 and FA2 may include a first base portion B1 having a sidewall covered by a first device isolation film 112A, and a first channel area CH1 that may extend from the first base portion B1 upwards (in the Z direction) and protrude higher than the first device isolation film 112A.

In the first area I, a top surface of a fin separation insulating structure 120 may have a height higher than a height of an uppermost portion of the first channel area CH1 of the pair of first fin-shaped active areas FA1 and FA2. In some exemplary embodiments, a difference (ΔH1) between the height of the uppermost portion of the first channel area CH1 of the pair of first fin-shaped active areas FA1 and FA2 and the height of the top surface of the fin separation insulating structure 120 may be greater than zero.

In the second area II, the second fin-shaped active area FB may include a second base portion B2 having a sidewall covered by a second device isolation film 112B, and a second channel area CH2 that may extend from the second base portion B2 upwards (in the Z direction) and protrude higher than the second device isolation film 112B.

As illustrated in FIG. 2, the pair of first fin-shaped active areas FA1 and FA2 in the first area I and the second fin-shaped active area FB in the second area II may have a substantially same cross-sectional shape. The top surface of the first device isolation film 112A in the first area I and the top surface of the second device isolation film 112B in the second area II may be at a substantially same level on the substrate 110.

As illustrated in FIG. 3, the pair of first fin-shaped active areas FA1 and FA2 in the first area I may each have first and second cut, e.g., chamfered, corners CC1 and CC2 that may define part of the fin separation area FS.

In the first area I, the fin separation insulating structure 120 may include a lower insulating pattern 122 that may be between the pair of first fin-shaped active areas FA1 and FA2 and cover, e.g., overlap, a sidewall of an end of each of the pair of first fin-shaped active areas FA1 and FA2, and an upper insulating pattern 124 that may be formed on the lower insulating pattern 122 and cover, e.g., extend along and overlap, at least part of the first and second cut, e.g., chamfered, corners CC1 and CC2. The upper insulating pattern 124 may have a top surface at a higher level than the top surface of each of the pair of first fin-shaped active areas FA1 and FA2. Accordingly, there may be a difference (ΔH1) in height between a level of the top surface of each of the pair of first fin-shaped active areas FA1 and FA2 and the uppermost level of a top surface 124T of the upper insulating pattern 124.

In some exemplary embodiments, in the first area I, the first device isolation film 112A and the lower insulating pattern 122 may be integrally formed as one body.

A width (W1) of the lower insulating pattern 122 in an extending direction (X direction) of the pair of first fin-shaped active areas FA1 and FA2 may be smaller than a width (W2) of the upper insulating pattern 124.

The top surface 124T of the upper insulating pattern 124 may have a convex rounded top surface profile. The top surface 124T of the upper insulating pattern 124 may be separated from outer top surfaces T1 and T2 of an end portion of the pair of first fin-shaped active areas FA1 and FA2, and may define recess areas R1 and R2 in the fin separation area FS together with part of the first and second corners CC1 and CC2.

The dummy gate DG formed in the fin separation area FS may be on the top surface 124T of the upper insulating pattern 124. Since the height of an uppermost portion of the top surface 124T of the upper insulating pattern 124 of the fin separation insulating structure 120 may be higher than a height of the uppermost portion of the pair of first fin-shaped active areas FA1 and FA2, e.g., by ΔH1, a bottom surface of the dummy gate DG may be at a level higher than a bottom surface of the first normal gate NGA, e.g., by ΔH1.

The substrate 110 may include a semiconductor, e.g., Si or Ge, or a compound semiconductor, e.g., SiGe, SiC, GaAs, InAs, or InP. As another example, the substrate 110 may have a silicon on insulator (SOI) structure. The substrate 110 may include a conductive area, e.g., an impurity-doped well or an impurity-doped structure. The pair of first fin-shaped active areas FA1 and FA2 and the second fin-shaped active area FB may be obtained by etching a part of the substrate 110 and may be formed of the same material as that of the substrate 110.

Each of the first and second device isolation films 112A and 112B and the lower insulating pattern 122 may include, e.g., an oxide film, a nitride film, or a combination thereof. In some exemplary embodiments, the first device isolation film 112A, the second device isolation film 112B, and the lower insulating pattern 122 may each include an insulating liner for applying stress to the pair of first fin-shaped active areas FA1 and FA2, and the first channel area CH1 and the second channel area CH2 of the second fin-shaped active area FB, and a gap-fill insulation film covering the insulating liner. By applying stress to the first channel area CH1 and the second channel area CH2, mobility of carriers in the first channel area CH1 and the second channel area CH2 may be improved. For example, the first channel area CH1 and the second channel area CH2 may each constitute an N-type channel area or a P-type channel area. An insulating liner for applying tensile stress may be formed on a sidewall of a fin-shaped active area where at least one of the first channel area CH1 and second channel area CH2 may constitute an N-type channel area. An insulating liner for applying compression stress may be formed on a side wall of a fin-shaped active area where at least one of the first channel area CH1 and second channel area CH2 may constitute a P-type channel area.

The insulating liner for applying tensile stress to a channel region may be formed of, e.g., silicon nitride (SiN), silicon oxynitride (SiON), silicon boronitride (SiBN), silicon carbide (SiC), SiC:H, SiCN, SiCN:H, SiOCN, SiOCN:H, silicon oxycarbide (SiOC), silicon dioxide ($SiO_2$), polysilicon, or a combination thereof. The insulating liner for applying compression stress to a channel region may be formed of, e.g., SiN, SiON, SiBN, SiC, SiC:H, SiCN, SiCN:H, SiOCN, SiOCN:H, SiOC, $SiO_2$, polysilicon, or a combination thereof. The insulating liner may be formed using a plasma enhanced chemical vapor deposition (PECVD) process, a high density plasma CVD (HDP CVD) process, an inductively coupled plasma CVD (ICP CVD) process, or a capacitor coupled plasma CVD (CCP CVD) process. In some exemplary embodiments, the insulating liner may have a thickness of about 10 Å to about 100 Å.

In some exemplary embodiments, the gap-fill insulation film that may be included in the first device isolation film 112A, the second device isolation film 112B, and the lower insulating pattern 122 may include an oxide film formed by a deposition process or a coating process. In some exemplary embodiments, the gap-fill insulation film may include an oxide film formed by flowable chemical vapor deposition (FCVD) or spin coating. For example, the gap-fill insulation film may be formed of fluoride silicate glass (FSG), undoped silicate glass (USG), boro-phospho-silicate glass (BGSG), phospho-silicate glass (PSG), flowable oxide (FOX), plasma enhanced tetraethyl-orthosilicate (PE-TEOS), or tonen silazene (TOSZ). However, embodiments are not limited thereto.

The first fin-shaped transistor TR1 in the first area I of the IC device 100 may include a first interfacial layer 142A, which covers the first channel area CH1 of the first fin-shaped active area FA1, and a first gate dielectric film 144A and a first gate line 150A on the first interfacial layer 142A. The first gate dielectric film 144A and the first gate line 150A sequentially cover both (i.e., opposite) sidewalls and upper surface of the first fin-shaped active area FA1. The first gate line 150A may constitute a first normal gate NGA.

The first gate dielectric film 144A and the first gate line 150A may extend in a direction (Y direction) that intersects an extending direction of the pair of first fin-shaped active areas FA1 and FA2.

The second fin-shaped transistor TR2 in the second area II of the IC device 100 may include a second interfacial layer 142B, which covers the second channel area CH2 of the second fin-shaped active area FB, and a second gate dielectric film 144B and a second gate line 150B on the second interfacial layer 142B. The second gate dielectric film 144B and the second gate line 150B sequentially cover both sidewalls and an upper surface of the second fin-shaped active area FB. The second gate line 150B may constitute a second normal gate NGB. The second gate dielectric film 144B and the second gate line 150B may extend in a direction (Y direction) that intersects an extending direction of the second fin-shaped active area FB.

The first and second interfacial layers 142A and 142B may be obtained by oxidizing a surface of the pair of first fin-shaped active areas FA1 and FA2 and a surface of the second fin-shaped active area FB, respectively. The first and second interfacial layers 142A and 142B may cure interfacial defects between the pair of first fin-shaped active areas FA1 and FA2 and the first gate dielectric film 144A, and between the second fin-shaped active area FB and the second gate dielectric film 144B, respectively.

In some exemplary embodiments, the first and second interfacial layers 142A and 142B may each include a low-k dielectric layer having a dielectric constant of about 9 or less, e.g., a silicon oxide layer, a silicon oxynitride layer, a gallium (Ga) oxide layer, a germanium (Ge) oxide layer, or a combination thereof. In some other exemplary embodiments, the first and second interfacial layers 142A and 142B may each include a silicate layer, a combination of silicate and silicon oxide layers, or a combination of silicate and silicon oxynitride layers. In some exemplary embodiments, the first and second interfacial layers 142A and 142B may each have a thickness of about 5 Å to about 20 Å. However, embodiments are not limited thereto. In some exemplary embodiments, at least one of the first and second interfacial layers 142A and 142B may be omitted.

In some exemplary embodiments, each of the first and second gate dielectric films 144A and 144B may include a silicon oxide layer, a high-k dielectric layer, or a combination thereof. The high-k dielectric layer may be formed of a material having a higher dielectric constant than that of a silicon oxide layer. For example, the first and second gate dielectric films 144A and 144E may have a dielectric constant of about 10 to about 25. The high-k dielectric layer may be formed of, e.g., at least one of hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination of thereof, but is not limited thereto. The first and second gate dielectric films 144A and 144B may be formed using an ALD process, a CVD process, or a PVD process. In some embodiments, the first and second gate dielectric films 144A and 144B may have a same stack structure. In some other embodiments, the first and second gate dielectric films 144A and 144B may have different stack structures.

The first and second gate lines 150A and 150B, which constitute the first and second normal gates NGA and NGB, respectively, may include a metal containing layer for adjusting a work function and a gap-fill metal containing layer filling a space in an upper portion of the metal containing layer. In some embodiments, the first and second gate lines 150A and 150B may have a structure in which a metal nitride layer, a metal layer, a conductive capping layer, and a gap-fill metal layer are sequentially stacked. The metal nitride layer and the metal layer may include at least one of, e.g., Ti, W, Ru, Nb, Mo, Hf, Ni, Co, Pt, Yb, Tb, Dy, Er, and Pd. Each of the metal nitride layer and the metal layer may be formed using an ALD process, a metal organic ALD (MOALD) process, or a metal organic CVD (MOCVD) process. The conductive capping layer may serve as a protection layer for preventing a surface of the metal layer from being oxidized. The conductive capping layer may serve as a wetting layer for facilitating deposition when another conductive layer is deposited on the metal layer. The conductive capping layer may be formed of a metal nitride such as TiN, TaN, or a combination thereof, but is not limited thereto. The gap-fill metal layer may extend on the conductive capping layer. The gap-fill metal layer may include a tungsten (W) layer. The gap-fill metal layer may be formed using an ALD process, a CVD process, or a PVD process. The gap-fill metal layer may bury a recess space formed due to a stepped portion in an upper surface of the conductive capping layer, without a void. In some exemplary embodiments, the first and second gate lines 150A and 150B may each include a stack structure of TiAlC/TiN/W, a stack structure of TiN/TaN/TiAlC/TiN/W, or a stack structure of TiN/TaN/TiN/TiAlC/TiN/W. In these stack structures, the TiAlC layer or TiN layer may serve as a metal containing layer for adjusting a work function.

In the fin separation area FS of the first area I, a dummy gate dielectric film 144S and a dummy gate DG may be sequentially formed on the upper surface 124T of the upper insulating pattern 124 in this stated order. The dummy gate dielectric film 144S may be formed of the same material as that of at least one of the first and second gate dielectric films 144A and 144B. The dummy gate DG may be formed of the same material as the first gate line 150A.

Both side walls of each of the first and second normal gates NGA and NGB and both sidewalls of the dummy gate DG may be covered by an insulating spacer 162. As illustrated in FIGS. 3 and 4, the first and second gate dielectric films 144A and 144B may extend between the first and second normal gates NGA and NGB and the insulating spacer 162 covering the same. The dummy gate dielectric film 144S may extend between the dummy gate DG and the insulating spacer 162 covering the same.

The insulating spacer 162 may include, e.g., a silicon nitride layer, a SiOCN layer, a SiCN layer, or a combination thereof. The SiOCN layer refers to a layer including silicon (Si), oxygen (O), carbon (C), and nitrogen (N). The SiCN layer refers to a layer including silicon (Si), carbon (C), and nitrogen (N).

In the first area I, first source/drain areas 172 may be formed on both sides of the first normal gate NGA in the first fin-shaped active areas FA1 and FA2. In the second area II, second source/drain areas 174 may be formed on both sides of the second normal gate NGB in the second fin-shaped active area FB.

In some exemplary embodiments, at least one of the first and second source/drain areas 172 and 174 may include an impurity ion implantation region in the first and second fin-shaped active areas FA1, FA2, and FB. In some other exemplary embodiments, at least one of the first and second source/drain areas 172 and 174 may include a semiconductor epitaxial pattern that may be epitaxially grown from the recess areas R1 and R2 in the first and second fin-shaped active areas FA1, FA2, and FB. At least one of the first and second source/drain areas 172 and 174 may include an epitaxially grown Si layer, an epitaxially grown SiC layer, or an embedded SiGe structure including a plurality of epitaxially grown SiGe layers. In some exemplary embodiments, when the first and second fin-shaped transistors TR1 and TR2 constitute an NMOS transistor, the first and second source/drain areas 172 and 174 may include an epitaxially grown Si layer or an epitaxially grown SiC layer. In some other exemplary embodiments, when the first and second fin-shaped transistors TR1 and TR2 constitute a PMOS transistor, the first and second source/drain areas 172 and 174 may include an epitaxially grown SiGe layer.

As illustrated in FIG. 3, the pair of first fin-shaped active areas FA1 and FA2 in the first area I may have partially different heights. In some exemplary embodiments, the top surfaces of the pair of first fin-shaped active areas FA1 and FA2 at regions adjacent to the first and second corners CC1 and CC2 may have a height higher than at regions away from the first and second corners CC1 and CC2. For example, each of outer top surfaces T1 and T2 of the top surfaces of the pair of first fin-shaped active areas FA1 and FA2 that is disposed adjacent an edge of each of the pair of first fin-shaped active areas FA1 and FA2 may have a different height from that at the other region of the pair of first fin-shaped active areas FA1 and FA2. The outer top surfaces T1 and T2 are between the first source/drain area 172A which is closest to the first and second corners CC1 and CC2 and the fin separation insulating structure 120. As illustrated in FIG. 3, each of outer top surfaces T1 and T2 of the top surfaces of the pair of first fin-shaped active areas FA1 and FA2 that is disposed adjacent an edge of each of the pair of first fin-shaped active areas FA1 and FA2 may have a higher height than inner top surfaces of the top surfaces of the pair of first fin-shaped active areas FA1 and FA2. The inner top surfaces of the pair of first fin-shaped active areas FA1 and FA2 are farther from the edge of the pair of first fin-shaped active areas FA1 and FA2 than the outer top surfaces T1 and T2, respectively. That is, a height difference (ΔST) in the pair of first fin-shaped active areas FA1 and FA2 between the outer top surfaces T1 and T2 and the inner top surfaces may be greater than zero (0).

As illustrated in FIG. 4, in the second area II, the top surface of the second fin-shaped active area FB may have a substantially constant level along a lengthwise direction thereof.

In the first area I and the second area II, the insulating spacer 162 and an inter-gate insulating film 164, which covers the first and second source/drain areas 172 and 174, may be formed on both sides of each of the first and second normal gates NGA and NGB and the dummy gate DG. The inter-gate insulating film 164 may include a silicon oxide film.

Figure 5:
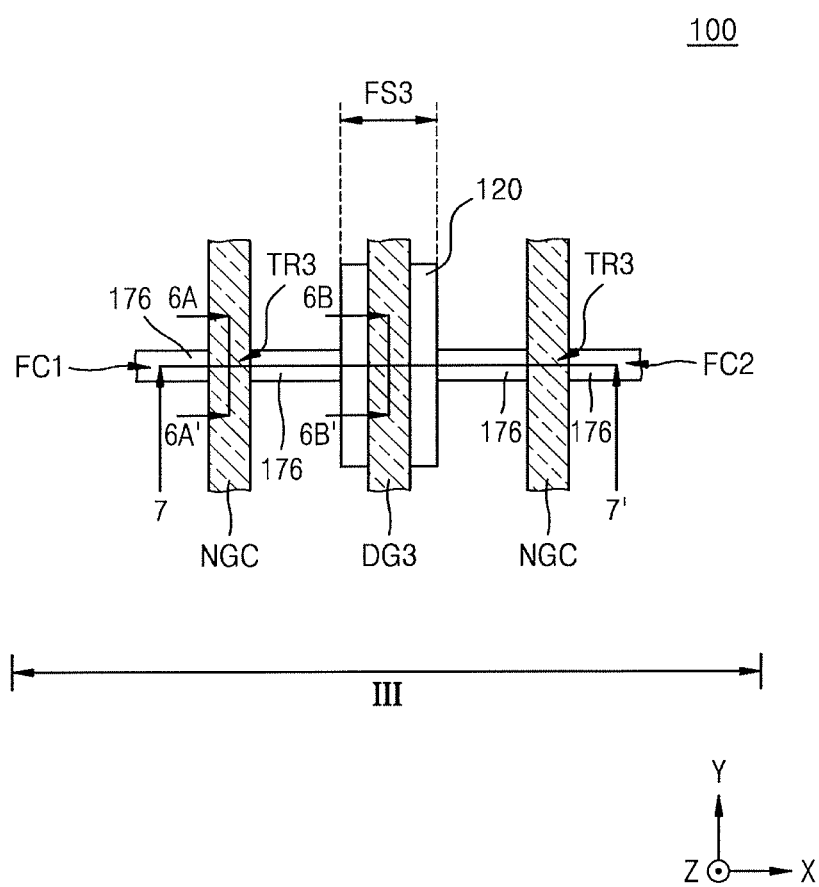
FIG. 5 illustrates a planar layout diagram of main elements in a third area of the IC device of FIG. 1, according to an embodiment.
Figure 6:
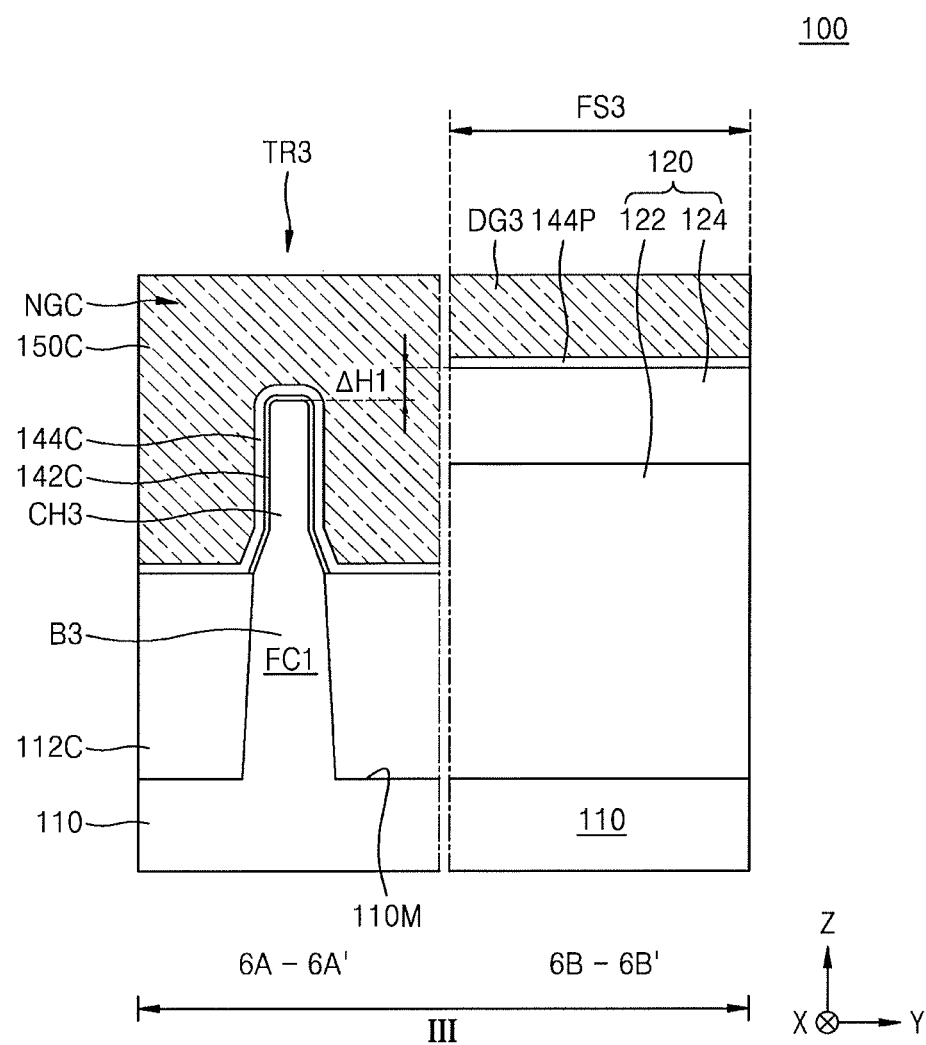
FIG. 6 illustrates a cross-sectional view of main elements of the IC device along line 6A-6A' and line 6B-6B' of FIG. 5.
Figure 7:
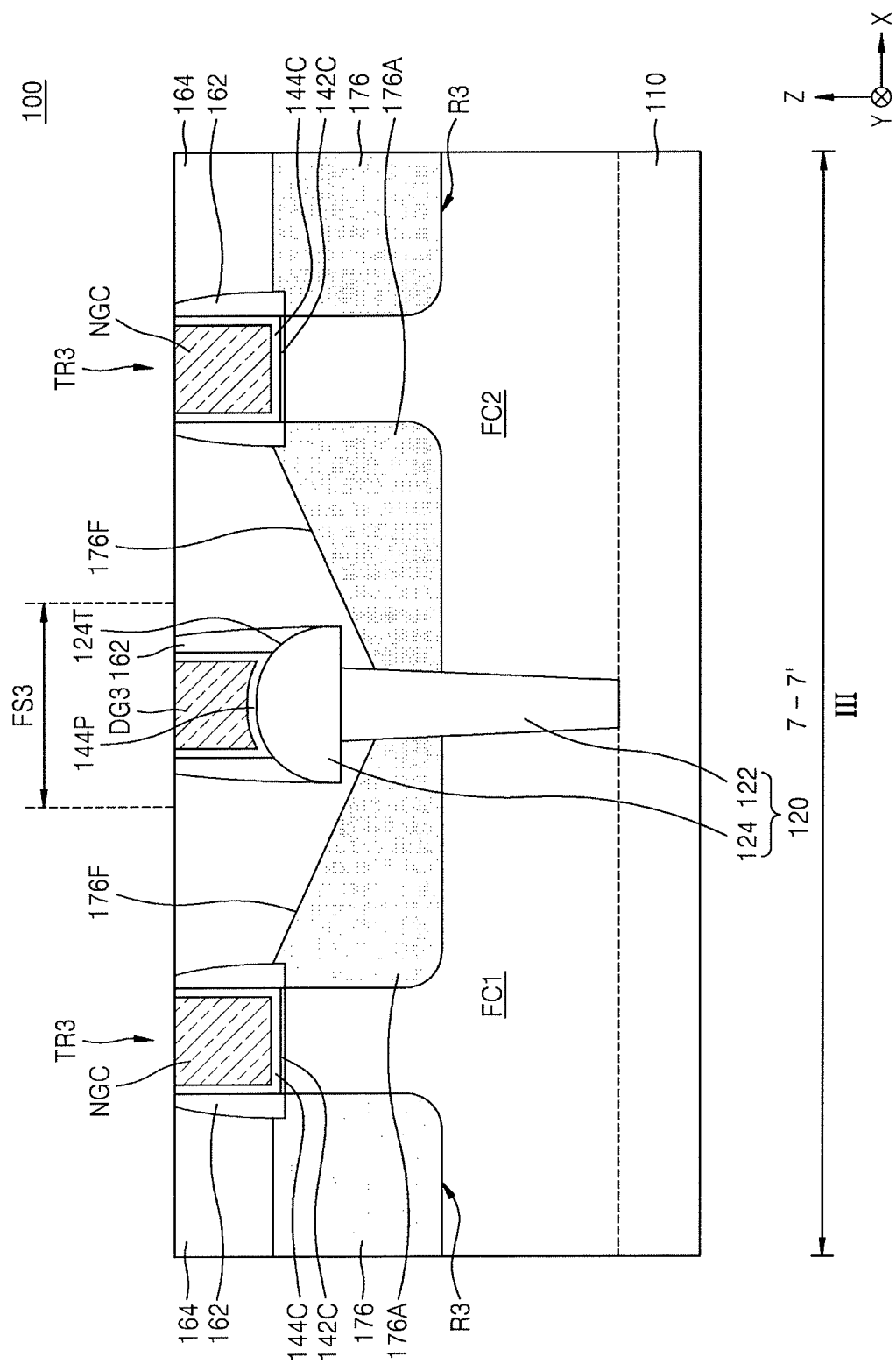
FIG. 7 illustrates a cross-sectional view of main elements of the IC device along line 7-7' of FIG. 5.

FIG. 5 is a planar layout diagram illustrating main elements in a third area III of the IC device 100 of FIG. 1, according to an exemplary embodiment. FIG. 6 is a cross-sectional view illustrating main elements of the IC device 100 taken along line 6A-6A' and line 6B-6B' of FIG. 5. FIG. 7 is a cross-sectional view illustrating main elements of the IC device 100 taken along line 7-7' of FIG. 5. In FIGS. 5 to 7, like reference numerals as those in FIGS. 1 to 4 denote like elements, and thus detailed description thereof will be omitted here.

Referring to FIGS. 5 to 7, the IC device 100 may further include a third area III. The third area III may be connected to the first area I and/or the second area II illustrated in FIG. 1, or may be separated therefrom. In some exemplary embodiments, at least two of the first area I, the second area II, and the third area III may perform a same function. In some other exemplary embodiments, at least one of the first area I, the second area II, and the third area III may perform different functions. For example, the first area I, the second area II, and the third area III may be each independently an area selected from a memory area and a non-memory area. Details of the memory area and the non-memory area are described above with reference to FIG. 1, and thus will not be described here.

In the third area III of the IC device 100, a pair of third fin-shaped active areas FC1 and FC2 may protrude from the substrate 110 in a direction (Z direction) perpendicular to the main surface 110M of the substrate 110. The pair of third fin-shaped active areas FC1 and FC2 may be adjacent to each other with a fin separation area FS3 therebetween and may extend in a line along a first direction (X direction). Although FIGS. 5 to 7 illustrate an exemplary embodiment in which the pair of first fin-shaped active areas FA1 and FA2 in the first area I and the pair of third fin-shaped active areas FC1 and FC2 in the third area III extend in the same direction, embodiments are not limited thereto. The pair of first fin-shaped active areas FA1 and FA2 may extend in a direction different from an extending direction of the pair of third fin-shaped active areas FC1 and FC2 in the third area III.

In the third area III, the pair of third fin-shaped active areas FC1 and FC2 may include a third base portion B3 having a sidewall covered by a third device isolation film 112C, and a third channel area CH3 that may extend from the third base portion B3 upwards (in the Z direction) and protrude higher than the third device isolation film 112C. In the third area III, a top surface of the fin separation insulating structure 120 formed in the fin separation area FS3 may have a height higher than a height of an uppermost portion of the third channel area CH3 of the pair of third fin-shaped active areas FC1 and FC2.

The pair of third fin-shaped active areas FC1 and FC2 in the third area III may have substantially the same cross-sectional shape as that of the pair of first fin-shaped active areas FA1 and FA2 in the first area I. The top surface of the first device isolation film 112A in the first area I may be at substantially the same level on the substrate 110 as the top surface of the third device isolation film 112C in the third area III.

In the third area III, the third device isolation film 112C and the lower insulating pattern 122 may be integrally formed as one body. In the third area III, a dummy gate DG3 formed on the fin separation insulating structure 120 may be on the top surface 124T of the upper insulating pattern 124. A dummy gate dielectric film 144P may be disposed between the top surface 124T of the upper insulating pattern 124 and the dummy gate DG3. Details of the dummy gate DG3 may be substantially the same as those of the dummy gate DG described above with reference to FIGS. 1-4.

The pair of third fin-shaped active areas FC1 and FC2, which may be obtained by partially etching the substrate 110, may be formed of the same material as the substrate 110. The third device isolation film 112C may have substantially the same structure as the first and second device isolation films 112A and 112B described above with reference to FIGS. 1 to 4.

A third fin-shaped transistor TR3 in the third area III of the IC device 100 may include a third interfacial layer 142C, which covers the third channel area CH3 of the third fin-shaped active area FC1, and a third gate dielectric film 144C and a third gate line 150C on the third interfacial layer 142C, the third gate dielectric film 144C and the third gate line 150C sequentially covering both sidewalls and top surface of the third fin-shaped active areas FC1 and FC2. The third gate line 150C may constitute a third normal gate NGC. The third gate dielectric film 144C and the third gate line 150C may extend in a direction (Y direction) that intersects an extending direction of the pair of third fin-shaped active areas FC1 and FC2.

Detailed structures of the third interfacial layer 142C, the third gate dielectric film 144C, and the third gate line 150C may be substantially the same as those of the first interfacial layer 142A, the first gate dielectric film 144A, and the first gate line 150A described above with reference to FIGS. 1 to 4.

Both sidewalls of the third normal gate NGC and both sidewalls of the dummy gate DG3 may be covered by the insulating spacer 162.

In the third area III, third source/drain areas 176 may be formed on both sides of the third normal gate NGC in the pair of third fin-shaped active areas FC1 and FC2. In some exemplary embodiments, the third source/drain areas 176 may include an impurity ion implantation region in the third fin-shaped active areas FC1 and FC2. In some other exemplary embodiments, the third source/drain areas 176 may be formed of a semiconductor epitaxial pattern that may be epitaxially grown from a recess area R3 in the third fin-shaped active areas FC1 and FC2. The third source/drain areas 176 may include an epitaxially grown Si layer, an epitaxially grown SiC layer, or an embedded SiGe structure including a plurality of epitaxially grown SiGe layers. In some exemplary embodiments, the third fin-shaped transistor TR3 in the third area III may constitute a PMOS transistor. In this case, the third source/drain areas 176 may include an epitaxially grown SiGe layer.

A third source/drain area 176A that is closest to the fin separation area FS3, among the third source/drain areas 176 in the pair of third fin-shaped active areas FC1 and FC2, may include a portion that contacts the fin separation insulating structure 120 in the fin separation area FS3. The third source/drain area 176A that is closest to the fin separation area FS3 may have a facet 176F that extends slantly, e.g., at an oblique angle, away from a point of the lower insulating pattern 122 lower than the top surface 124T of the upper insulating pattern 124 of the fin separation insulating structure 120, e.g., from a sidewall of the lower insulating pattern 122.

Although FIG. 7 illustrates an embodiment in which the third source/drain areas 176A, adjacent to opposite sides of the fin separation insulating structure 120, have symmetrical shapes with respect to the fin separation insulating structure 120, embodiments are not limited to the embodiment of FIG. 7. This will be described in more detail below with reference to FIG. 8.

Figure 8:
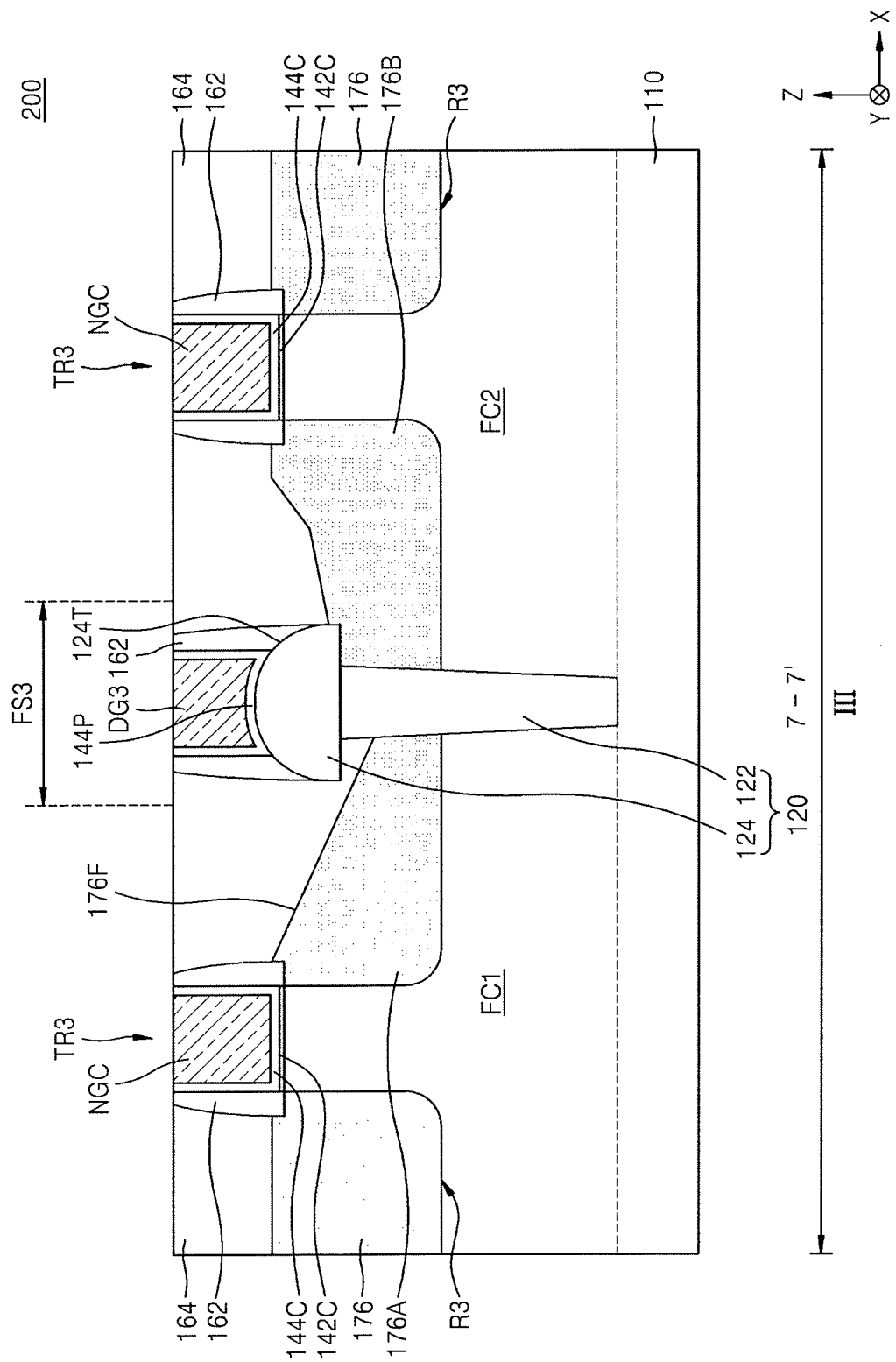
FIG. 8 illustrates a cross-sectional view of an IC device according to a modified embodiment of FIGS. 5 to 7.

FIG. 8 is a cross-sectional view of an IC device 200 according to another embodiment illustrating a modified example of the third source/drain area 176 formed in the third area III of the IC device 100 illustrated in FIGS. 5 to 7, taken alone line 7-7' of FIG. 5. In FIG. 8, like reference numerals as those in FIGS. 5 to 7 denote like elements.

Referring to FIG. 8, the IC device 200 may have substantially the same structure as the IC device 100 illustrated in FIGS. 1 to 7, except that a third source/drain area 176A among the plurality of third source/drain areas 176 formed in one third fin-shaped active area FC1 selected from the pair of third fin-shaped active area FC1 and FC2, which is adjacent to the fin separation insulating structure 120, and another third source/drain area 176B among the plurality of third source/drain areas 176 formed in the third fin-shaped active area FC2 may have asymmetrical structures with respect to the fin separation insulating structure 120. The third source/drain area 176B formed in the third fin-shaped active area FC2 may not have a same or similar facet as the facet 176F of the third source/drain area 176A formed in the third fin-shaped active area FC1.

In some exemplary embodiments, the first fin-shaped transistor TR1 in the first area I illustrated in FIGS. 1 to 4 may be an NMOS transistor, and the first source/drain area 172 of the first fin-shaped transistor TR1 may include a semiconductor epitaxial pattern including Si or SiC. The third fin-shaped transistor TR3 in the third area III illustrated in FIGS. 5 to 8 may be a PMOS transistor, and the third source/drain area 176 in the third fin-shaped transistor TR3 may include a semiconductor epitaxial pattern including SiGe.

Figure 9A:
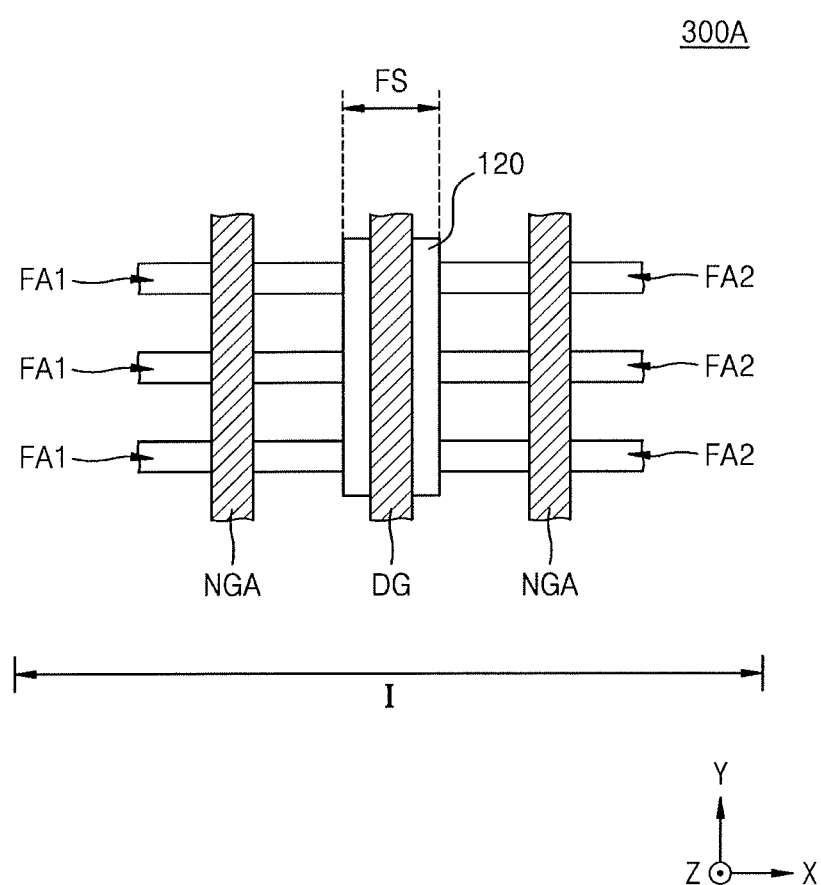
FIGS. 9A and 9B illustrate planar layout diagrams of IC devices according to embodiments.
Figure 9B:
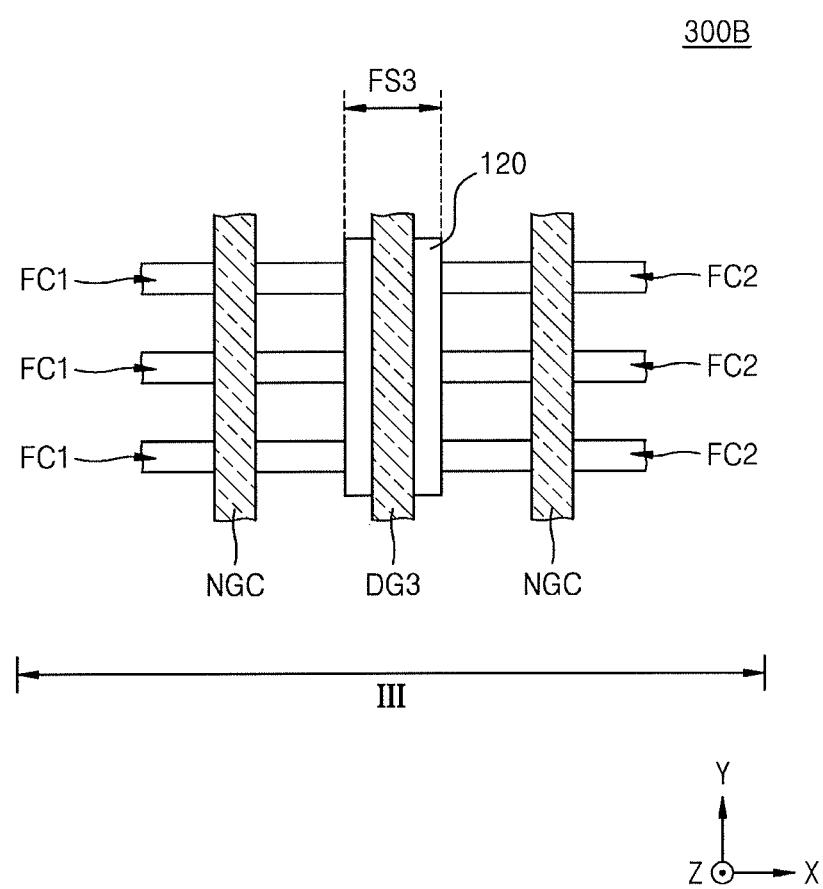

FIGS. 9A and 9B are planar layout diagrams illustrating IC devices 300A and 300B according to exemplary embodiments. In FIGS. 9A and 9B, like reference numerals as those in FIGS. 1 to 8 denote like elements, and thus detailed description thereof will be omitted here.

Referring to FIG. 9A, the IC device 300A may have substantially the same structure as the IC device 100 described above with reference to FIGS. 1 to 4, except that the IC device 300A includes multiple pairs of first fin-shaped active areas FA1 and FA2 formed adjacent to one another in lines in the first area I. The multiple pairs of first fin-shaped active areas FA1 and FA2 may be arranged separated from one another and may extend parallel to each other. In each pair of first fin-shaped active areas FA1 and FA2, the first fin-shaped active area FA1 and the first fin-shaped active area FA2 may be arranged in a line with the fin separation insulating structure 120 and the dummy gate DG therebetween, which are formed in the fin separation area FS. In some exemplary embodiments the dummy gate DG may not be formed in the fin separation area FS of the IC device 300A.

In the first area I, a plurality of first normal gates NGA may extend in a direction that intersects the plurality of first fin-shaped active areas FA1 or the plurality of first fin-shaped active areas FA2. The multiple pairs of first fin-shaped active areas FA1 and FA2 may have substantially the same structure as the pair of first fin-shaped active areas FA1 and FA2 described above with reference to FIGS. 1 to 4.

Referring to FIG. 9B, the IC device 300B may have substantially the same structure as that of the IC device 100 described above with reference to FIGS. 5 to 7 or the IC device 200 described above with reference to FIG. 8, except that the IC device 300B includes multiple pairs of third fin-shaped active areas FC1 and FC2 formed adjacent to one another in lines in the third area III. The multiple pairs of third fin-shaped active areas FC1 and FC2 may be arranged separated from one another and may extend parallel to each other. In each pair of third fin-shaped active areas FC1 and FC2, the third fin-shaped active area FC1 and the third fin-shaped active area FC2 may be arranged in a line with the fin separation insulating structure 120 and a dummy gate DG3 therebetween, which are formed in a fin separation area FS3. In some exemplary embodiments, the dummy gate DG3 may not be formed in the fin separation area FS3 of the IC device 300B.

In the third area III, a plurality of third normal gates NGC may extend in a direction that intersects the plurality of third fin-shaped active areas FC1 or the plurality of third fin-shaped active areas FC2. The multiple pairs of third fin-shaped active areas FC1 and FC2 may have substantially the same structure as the pair of third fin-shaped active areas FC1 and FC2 described above with reference to FIGS. 5 to 7.

Although FIGS. 9A and 9B illustrate the embodiments in which one first normal gate NGA extends to intersect each of a group of first fin-shaped active areas FA1 and a group of first fin-shaped active areas FA2, which form the multiple pairs of first fin-shaped active areas FA1 and FA2 of FIG. 9A, and one third normal gate NGC extends to intersect each of a group of third fin-shaped active areas FC1 and a group of third fin-shaped active areas FC2, which form the multiple pairs of third fin-shaped active areas FC1 and FC2 of FIG. 9B, embodiments are not limited to the embodiments illustrated in FIGS. 9A and 9B. For example, a plurality of first normal gates NGA may extend parallel to one another, intersecting at least one of a group of first fin-shaped active areas FA1 and a group of first fin-shaped active areas FA2, which form the multiple pairs of first fin-shaped active areas FA1 and FA2 of FIG. 9A. Similarly, a plurality of third normal gates NGC may extend parallel to one another, intersecting at least one of a group of third fin-shaped active areas FC1 and a group of third fin-shaped active areas FC2, which form the multiple pairs of third fin-shaped active areas FC1 and FC2 of FIG. 9B.

Figure 10:
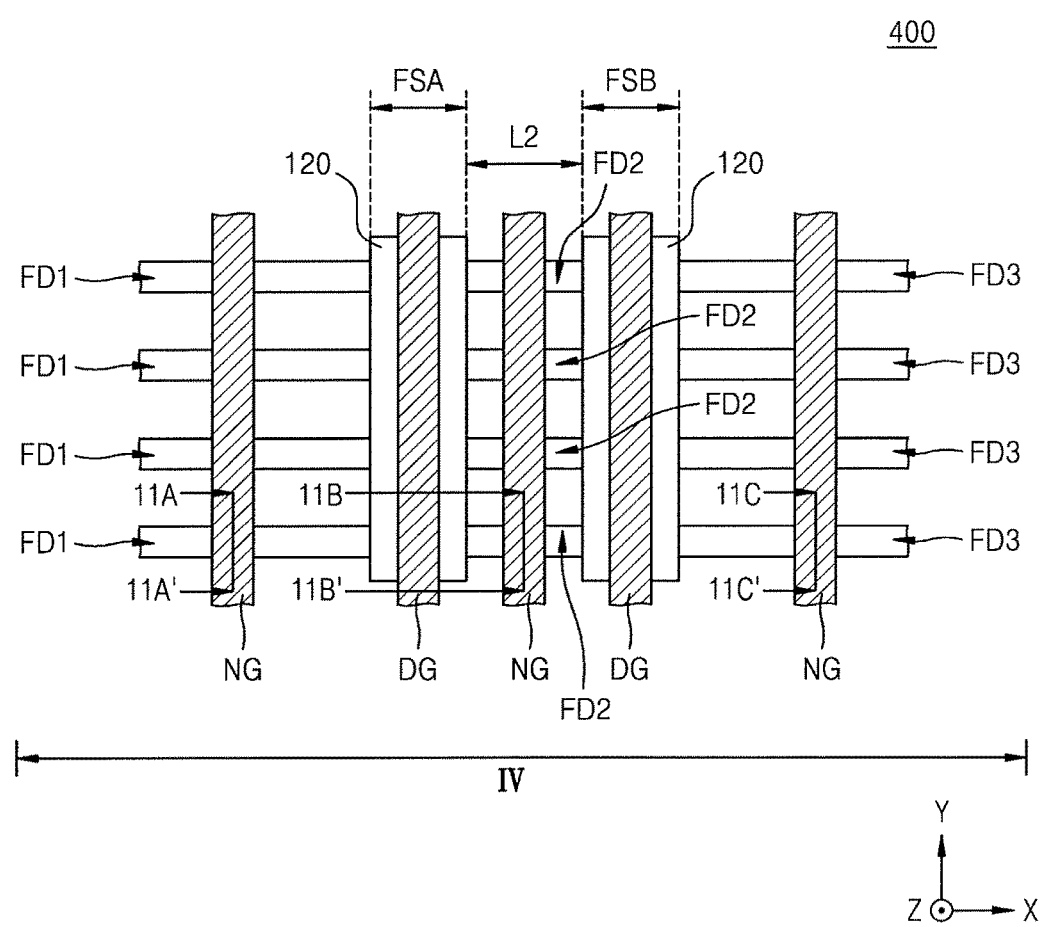
FIG. 10 illustrates a planar layout diagram of an IC device according to an embodiment.

FIG. 10 is a planar layout diagram illustrating an IC device 400 according to an exemplary embodiment. In FIG. 10, like reference numerals as those of FIGS. 1 to 9B denote like elements, and thus detailed description thereof will be omitted.

Referring to FIG. 10, the IC device 400 may include a fourth area IV including first and second fin separation areas FSA and FSB that may extend parallel to each other.

Similar to the first area I described above with reference to FIGS. 1 to 4, the fourth area IV may be at least one area selected from a memory area and a non-memory area. Detailed description of the memory area and the non-memory area are provided above with reference to FIG. 1, and thus is not provided here.

The IC device 400 may include a plurality of first type fin-shaped active areas FD1, FD2, and FD3 that extend parallel to one another in a first direction (X direction) in the fourth area IV. The plurality of first type fin-shaped active areas FD1, FD2, and FD3 may include three fin-shaped active areas FD1, FD2, and FD3 extending in a line in the first direction (X direction).

A first fin separation area FSA may be arranged between the first fin-shaped active area FD1 and the second fin-shaped active area FD2, which are adjacent two of the three fin-shaped active areas FD1, FD2, and FD3, and a second fin separation area FSB may be arranged between the second fin-shaped active area FD2 and the third fin-shaped active area FD3, which are adjacent to each other.

In the first and second fin separation areas FSA and FSB, similar to the fin separation area FS described above with reference to FIGS. 1 to 4, the fin separation insulating structure 120 may extend in a second direction (Y direction) that intersects the first direction. The fin separation insulating structure 120 formed in each of the first and second fin separation areas FSA and FSB may include, as illustrated in FIG. 3, the lower insulating pattern 122 and the upper insulating pattern 124, wherein the upper insulating pattern 124 formed on the lower insulating pattern 122 may have a larger width than the lower insulating pattern 122, and the top surface 124T having a convex rounded top surface profile.

At least one of the three fin-shaped active areas FD1, FD2, and FD3 may have the first corner CC1 or the second corner CC2, as illustrated in FIG. 3, in an end portion that faces the fin separation insulating structure 120 formed in the first and second fin separation areas FSA and FSB. At least one of the upper insulating patterns 124 of the fin separation insulating structures 120 formed in the first and second fin separation areas FSA and FSB may be formed to at least partially cover the first corner CC1 or the corner CC2.

The plurality of normal gates NG in the plurality of first type fin-shaped active areas FD1, FD2, and FD3 may extend in a second direction (Y direction) that intersects the plurality of first fin-shaped active areas FD1, the plurality of second fin-shaped active areas FD2, and the plurality of third fin-shaped active areas FD3. The other structures of the plurality of first to third fin-shaped active areas FD1, FD2, and FD3, except for the above-described features, may be substantially the same as those of the pair of first fin-shaped active areas FA1 and FA2 described above with reference to FIGS. 1 to 4. Detailed structures of the plurality of normal gates NG may also substantially the same as those of the plurality of first and second normal gates NGA and NGB described above with reference to FIGS. 1 to 4.

In the plurality of first type fin-shaped active areas FD1, FD2, and FD3, source/drain areas including a semiconductor epitaxial pattern, having the same or similar structure as that of the first source/drain areas 172 illustrated in FIG. 3, the third source/drain areas 176 and 176A illustrated in FIG. 7, or the third source/drain areas 176, 176A, and 176B illustrated in FIG. 8, may be formed on opposite sides of the plurality of normal gates NG.

Similar to the first fin-shaped active areas FA1 and FA2 illustrated in FIG. 3, top surfaces of at least one fin-shaped active area of the three fin-shaped active areas FD1, FD2, and FD3 at both sides of the semiconductor epitaxial pattern of the plurality of source/drain areas may be at different levels. For example, an outer top surface of at least one fin-shaped active area of the three fin-shaped active areas FD1, FD2, and FD3 that is disposed adjacent an edge of the first fin separation area FSA or the second fin separation area FSB may have different heights from that of inner top surface of the first fin separation area FSA or the second fin separation area FSB. For example, an outer top surface of the top surface of at least one fin-shaped active area of the three fin-shaped active areas FD1, FD2, and FD3 disposed between the first fin separation area FSA or the second fin separation area FSB and one of the plurality of source/drain areas that is closest to the first fin separation area FSA or the second fin separation area FSB may have a height higher than an inner top surface of the top surface of the at least one fin-shaped active area at a center region between the closest source/drain area and an opposite side to the first fin separation area FSA or the second fin separation area FSB.

A length L2 of the second fin-shaped active area FD2 among the three fin-shaped active areas FD1, FD2, and FD3 in the first direction (X direction) may correspond to a separation distance between the first and second fin separation areas FSA and FSB in the first direction. The length L2 of the second fin-shaped active area FD2 in the first direction (X direction) may be shorter than the lengths of the first and third fin-shaped active areas FD1 and FD3 in the first direction.

Figure 11:
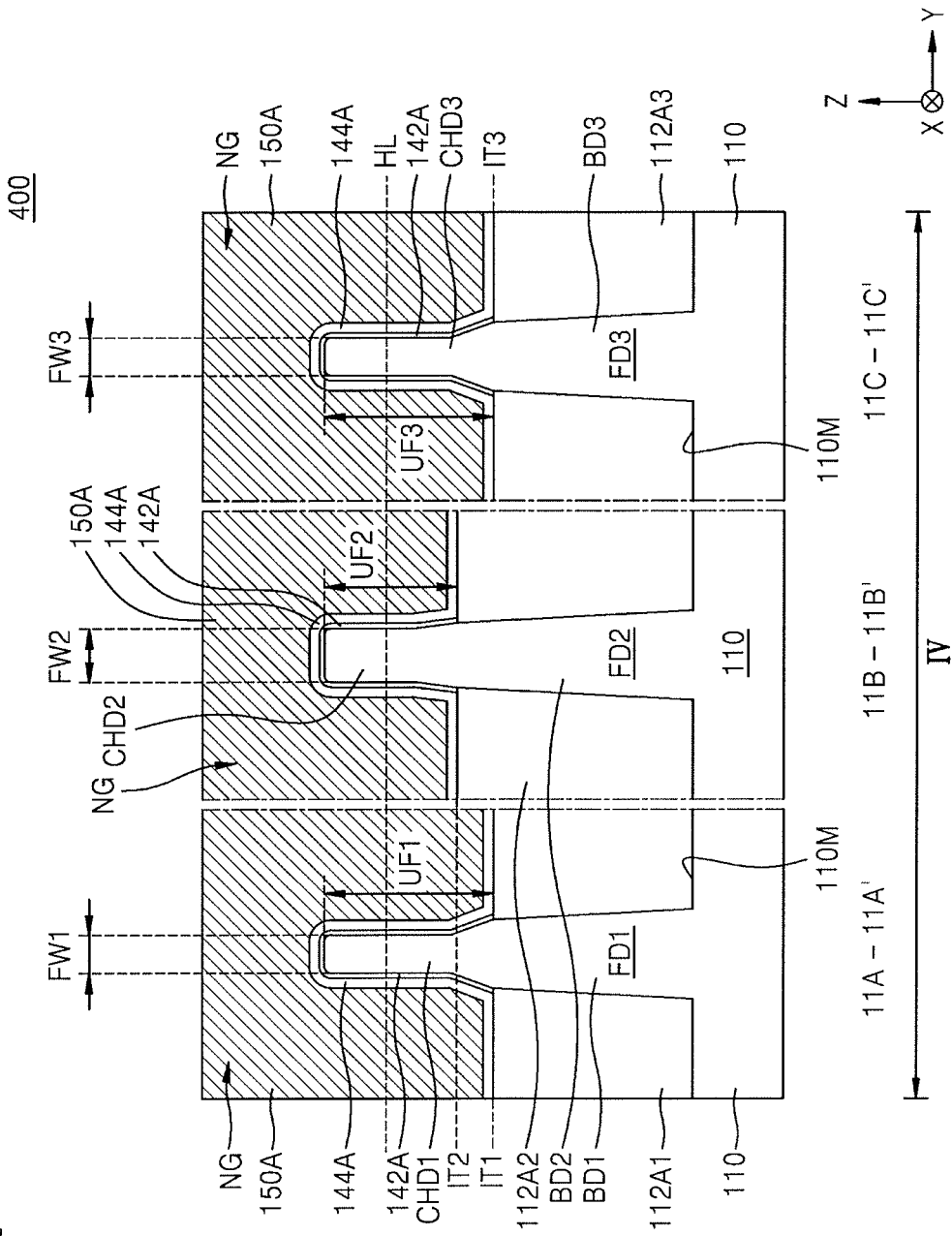
FIG. 11 illustrates a cross-sectional view of main elements of the IC device along line 11A-11A', line 11B-11B', and line 11C-11C' of FIG. 10.

FIG. 11 is a cross-sectional view illustrating main elements of the IC device 400 taken along line 11A-1A', line 11B-11B', and line 11C-11C' of FIG. 10.

Referring to FIG. 11, the IC device 400 may include a first device isolation film 112A1 that covers opposite sidewalls of the first fin-shaped active area FD1, a second device isolation film 112A2 that covers opposite sidewalls of the second fin-shaped active area FD2, and a third device isolation film 112A3 that covers opposite sidewalls of the third fin-shaped active area FD3.

The first fin-shaped active area FD1 may include a first base portion BD1 having a sidewall covered by a first device isolation film 112A1, and a first channel area CHD1 that may extend from the first base portion BD1 upwards (in the Z direction) and protrude higher than the first device isolation film 112A1.

The second fin-shaped active area FD2 may include a second base portion BD2 having a sidewall covered by a second device isolation film 112A2, and a second channel area CHD2 that may extend from the second base portion BD2 upwards (in the Z direction) and protrude higher than the second device isolation film 112A2.

The third fin-shaped active area FD3 may include a third base portion BD3 having a sidewall covered by a third device isolation film 112A3, and a third channel area CHD3 that may extend from the third base portion BD3 upwards (in the Z direction) and protrude higher than the third device isolation film 112A3.

A height IT2 of the top surface of the second device isolation film 112A2 may be higher than the respective heights IT2 and IT3 of the top surfaces of the first and third device isolation films 112A1 and 112A3. A height UF2 of the second channel area CHD2 in a vertical direction (Z direction) in the second fin-shaped active area FD2 may be lower than the respective heights UF1 and UF3 of the first and third channel areas CHD1 and CHD3 in the vertical direction (Z direction) in the first and third fin-shaped active areas FD1 and FD3. Details of materials of the first to third device isolation films 112A1, 112A2, and 112A3 and formation methods thereof may be similar as those of the first and second device isolation films 112A and 112B described above with reference to FIGS. 1 to 4.

Along a horizontal line HL extending in the second direction (Y direction) at a constant level above the substrate 110, a width FW2 of the second channel area CHD2 of the second fin-shaped active area FD2 may be greater than a width FW1 of the first channel area CHD1 of the first fin-shaped active area FD1 and of a width FW3 of the third channel area CHD3 of the third fin-shaped active area FD3.

Figure 12:
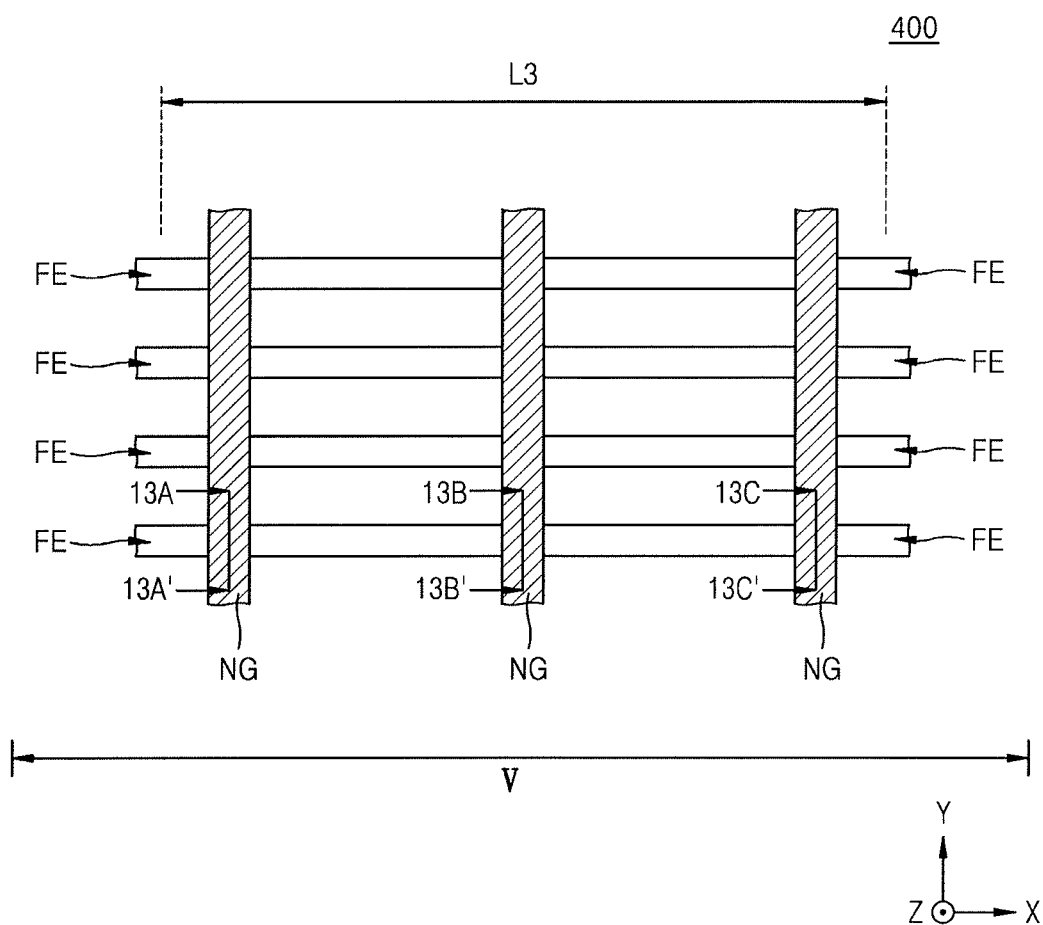
FIG. 12 illustrates a planar layout diagram of main elements in a fifth area of the IC device of FIG. 10, according to an embodiment.
Figure 13:
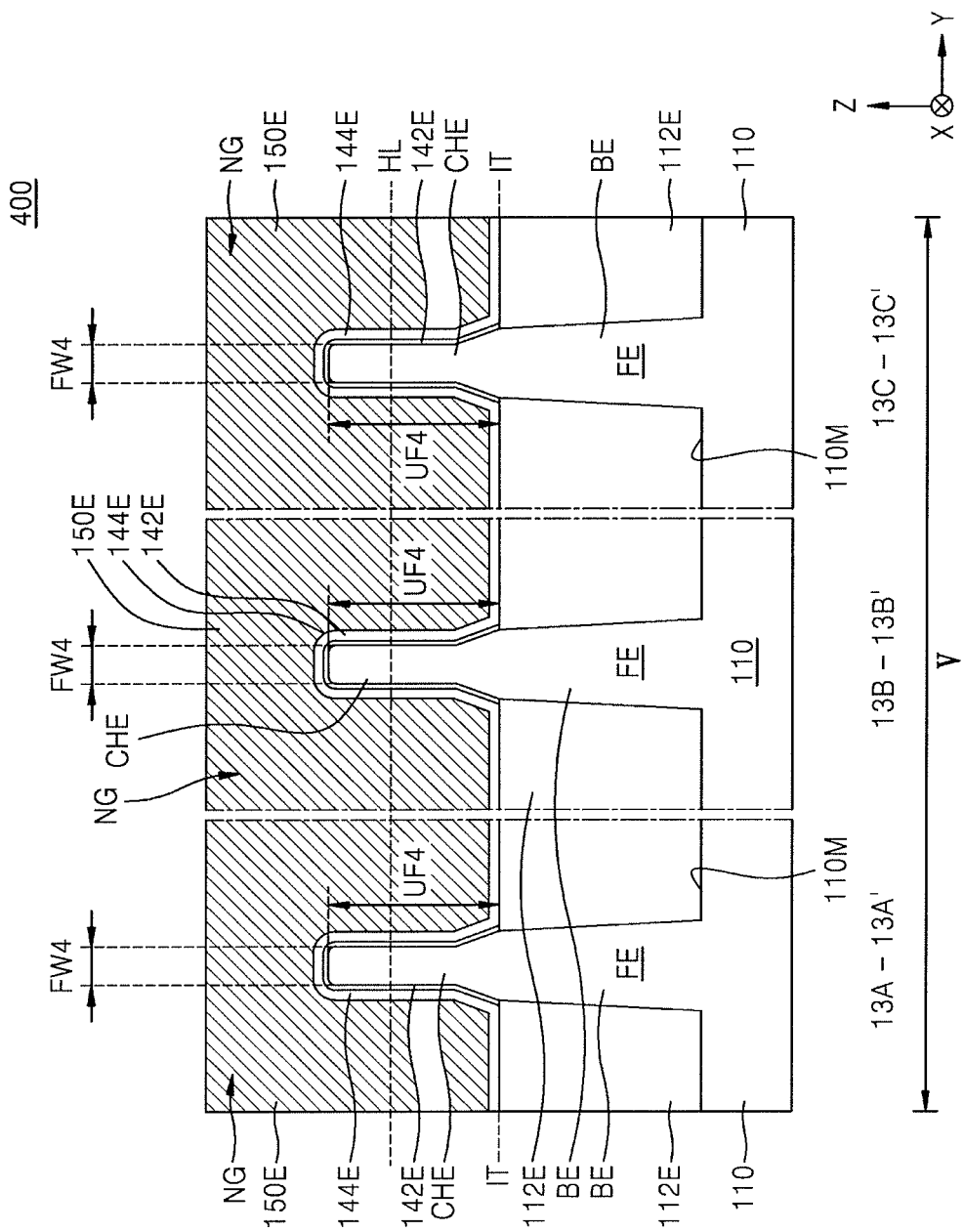
FIG. 13 illustrates a cross-sectional view of main elements of the IC device along line 13A-13A', line 13B-13B', and line 13C-13C' of FIG. 12.

FIG. 12 is a planar layout diagram illustrating main elements in a fifth area V of the IC device 400 of FIG. 10, according to an exemplary embodiment. FIG. 13 is a cross-sectional view illustrating main elements of the IC device 400 taken along line 13A-13A', line 13B-13B', and line 13C-13C' of FIG. 12. In FIGS. 12 and 13, like reference numerals as those in FIGS. 1 to 14 denote like elements, and thus detailed description thereof will be omitted here.

Referring to FIGS. 12 and 13, the IC device 400 may further include a fifth area V. The fifth area V may be connected to the fourth area IV illustrated in FIG. 10 or may be separated therefrom. In some exemplary embodiments, the fourth area IV and the fifth area V may perform a same function. In some other exemplary embodiments, the fourth area IV and the fifth area V may perform different functions. For example, the fourth area IV and the fifth area V may be each independently an area selected from a memory area and a non-memory area. Details of the memory area and the non-memory area are described above with reference to FIG. 1, and thus will not be described here.

The IC device 400 may include a plurality of second type fin-shaped active areas FE in the fifth area V, the plurality of second type fin-shaped active areas FE protruding from the substrate 110 in a direction (Z direction) perpendicular to the main surface 110M of the substrate 110 and extending parallel to each other in the first direction (X direction). The plurality of second type fin-shaped active areas FE may extend parallel to each other in the first direction (X direction) continuously over at least a length L3 that is longer than the length L2 of the second fin-shaped active area FD2 illustrated in FIG. 10. Each of the plurality of second type fin-shaped active areas FE may have a same or similar cross-sectional shape throughout the entire length thereof.

Although FIGS. 12 and 13 illustrate an embodiment in which the plurality of second type fin-shaped active areas FE in the fifth area V extend in the same direction as the plurality of first type fin-shaped active areas FD1, FD2, and FD3 in the fourth area IV, embodiments are not limited thereto. The plurality of second type fin-shaped active areas FE in the fifth area V may extend in a direction that is different from an extending direction of the plurality of first type fin-shaped active areas FD1, FD2, and FD3 in the fourth area IV.

In some exemplary embodiments, at least some of the plurality of second type fin-shaped active areas FE in the fifth area V may be an integrated body with at least some of the plurality of first fin-shaped active areas FD1 or at least some of the plurality of third fin-shaped active areas FD3 among the plurality of first type fin-shaped active areas FD1, FD2, and FD3 in the fourth area IV.

On the plurality of second type fin-shaped active areas FE, a plurality of normal gates NG may extend in a second direction (Y direction) that intersects the plurality of second type fin-shaped active areas FE. Detailed structures of the plurality of second type fin-shaped active areas FE may be substantially the same as those of the second fin-shaped active areas FB illustrated in FIGS. 1 and 4. Detailed structures of the plurality of normal gates NG may be substantially the same as those of the plurality of first and second normal gates NGA described above with reference to FIGS. 1 to 4.

On the plurality of second type fin-shaped active areas FE, source/drain areas including a semiconductor epitaxial pattern, having the same or similar structure as that of the first source/drain areas 172 illustrated in FIG. 3, the second source/drain areas 174 illustrated in FIG. 4, the third source/drain areas 176 and 176A illustrated in FIG. 7, or the third source/drain areas 176, 176A, and 176B illustrated in FIG. 8, may be formed on both opposite sides of the plurality of normal gates NG.

As illustrated in FIG. 13, in the fifth area V of the IC device 400, lower sidewalls of the plurality of second type fin-shaped active areas FE may be covered by device isolation films 112E. The plurality of second type fin-shaped active areas FE may each include a base portion BE having a sidewall covered by a device isolation film 112E, and a channel area CHE that may extend from the base portion BE upwards (in the Z direction) and protrude higher than the device isolation film 112E.

In the fifth area V, a height IT of the top surface of the device isolation film 112E may be substantially the same or similar along a lengthwise direction of the second type fin-shaped active area FE. In some exemplary embodiments, the height IT of the top surface of the device isolation film 112E in the fifth area V may be lower than the height IT2 of the top surface of the second device isolation film 112A2 in the fourth area IV, and be substantially the same as respective heights IT1 and IT3 of the first and third device isolation films 112A1 and 112A3 in the fourth area IV. Details of materials of the device isolation films 112E and formation methods thereof may be substantially the same as those of the first and second device isolation films 112A and 112B described above with reference to FIGS. 1 to 4.

In each of the plurality of second type fin-shaped active areas FE, a height UF4 of the channel area CHE in a vertical direction (Z direction) may be the same or similar. The height UF4 of the channel area CHE in each of the plurality of second type fin-shaped active areas FE in a vertical direction (Z direction) may be higher than the height UF2 (see FIG. 11) of the second channel area CHD2 in a vertical direction (Z direction) in the second fin-shaped active area FD2 in the fourth area IV.

Along a horizontal line HL extending in the second direction (Y direction) at a constant level above the substrate 110, a width FW4 of the channel area CHE in each of the plurality of second type fin-shaped active areas FE may be less than the width FW2 of the second channel area CHD2 in the second fin-shaped active area FD2 in the fourth area IV.

In the IC devices 100, 200, 300, and 400 according to exemplary embodiments described above with reference to FIGS. 1 to 13, the fin separation insulating structure 120 formed in the fin separation areas FS, FS3, FSA, and FSB may have a structure advantageous for preventing a short circuit between the dummy gate DG and adjacent source/drain areas, and the channel areas in the plurality of fin-shaped active areas may each have a comparatively large width. Thus, in a fin-shaped active area of a highly downscaled transistor, e.g., a transistor having a gate length of 10 nm or less, carrier mobility deterioration or defects, such as current density reduction or leakage current increase, may be reduced, thereby improving the performance of a highly downscaled fin field effect transistor.

FIGS. 14A to 23C are cross-sectional views illustrating stages in a method of manufacturing the IC device 100, according to exemplary embodiments. In particular, FIGS. 14A, 15A, . . . , and 23A illustrate stages of forming the regions of the IC device 100 taken along line 2A-2A', line 2B-2B', and line 2C-2C' of FIG. 1. FIGS. 14B, 15B, . . . , 23B illustrate stages of forming the regions of the IC device 100 taken along line 3-3' of FIG. 1. FIGS. 14C, 15C, . . . , 23C illustrate stages of forming the regions of the IC device 100 taken along line 4-4' of FIG. 1. An exemplary method of manufacturing the IC device 100 illustrated in FIGS. 1 to 4 will now be described with reference to FIGS. 14A to 23C. In FIGS. 14A to 23C, like reference numerals as those in FIGS. 1 to 4 denote like elements, and thus detailed description thereof will be omitted.

Figure 14A:
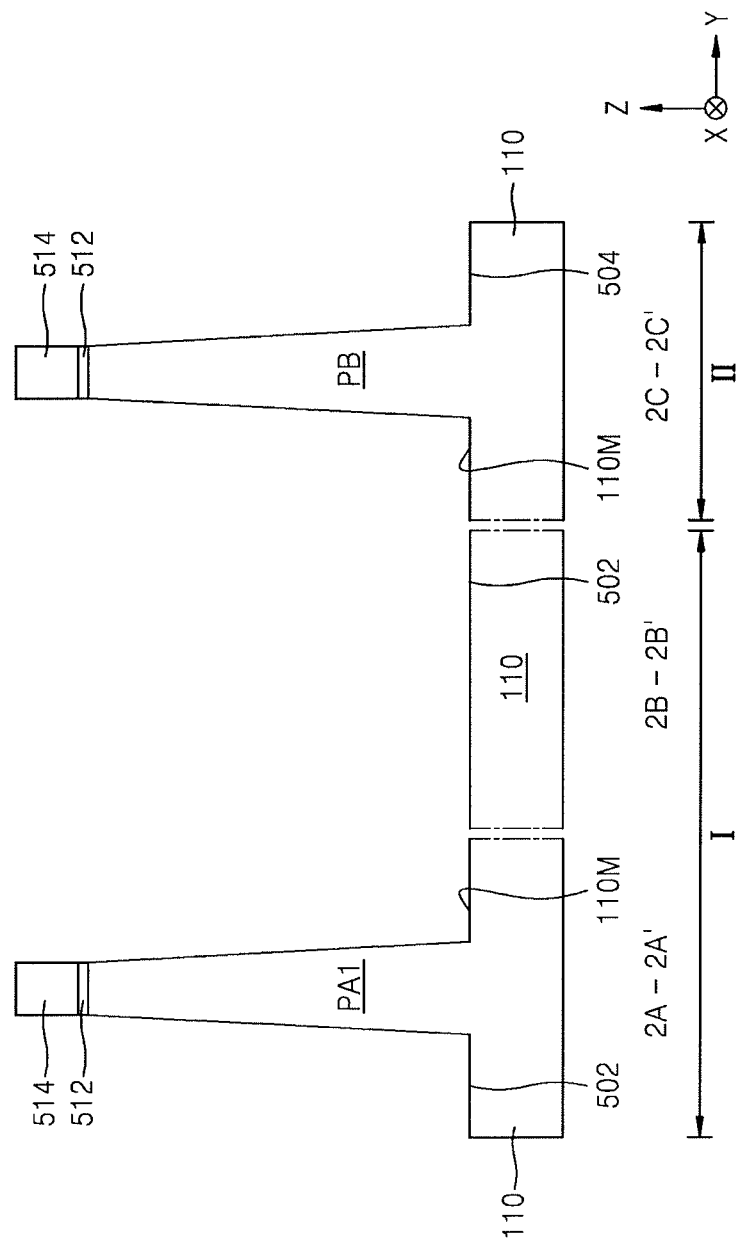
FIGS. 14A to 23C illustrate cross-sectional views of stages in a method of manufacturing an IC device according to embodiments.
Figure 14B:
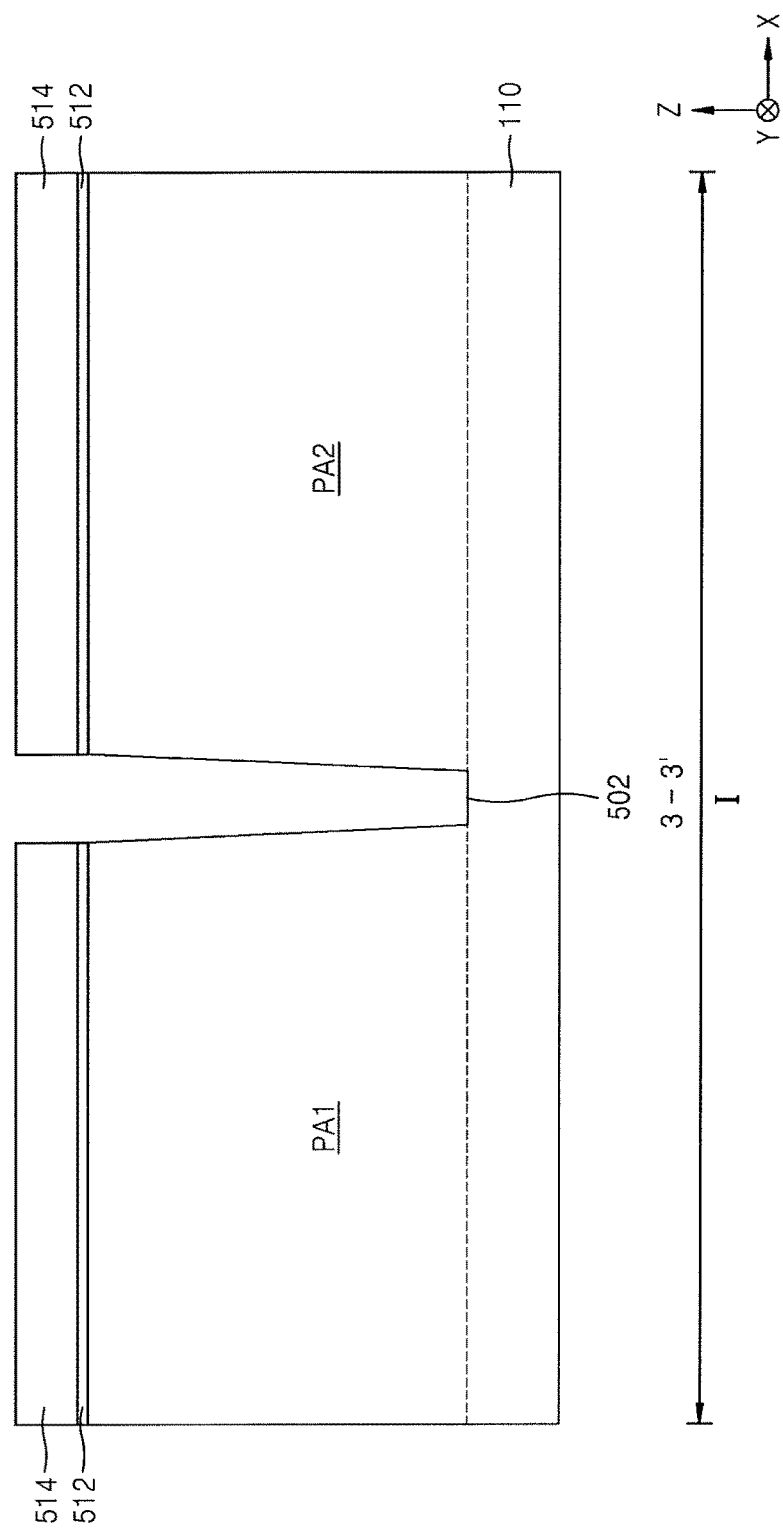
Figure 14C:
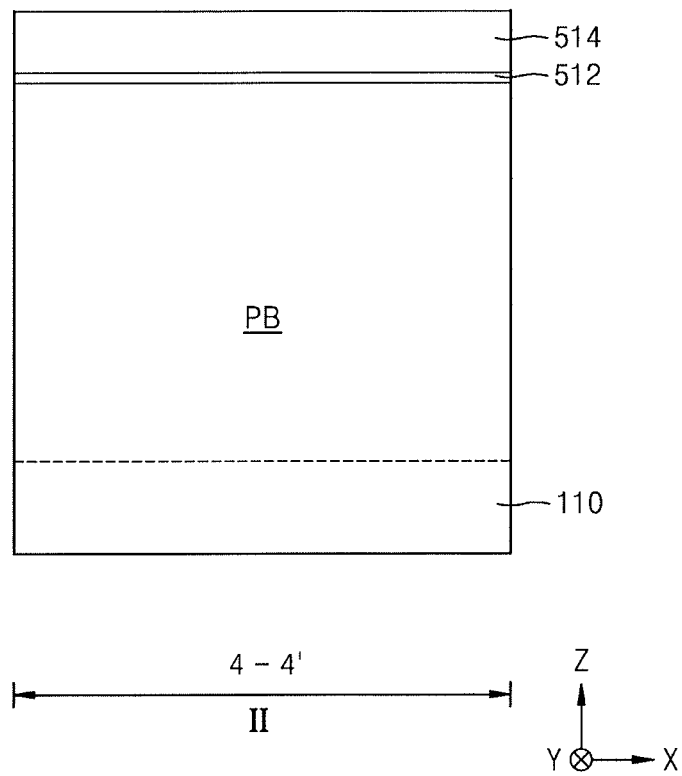

Referring to FIGS. 14A, 14B, and 14C, the substrate 110 including the first area I and the second area II may be prepared. Next, the substrate 110 may be partially removed to form a plurality of first trenches 502 in the first area I of the substrate and a plurality of second trenches 504 in the second area II. A plurality of preliminary active areas PA1, PA2, and PB may be defined by the plurality of first and second trenches 502 and 504. The plurality of preliminary active areas PA1, PA2, and PB may include a pair of first preliminary active areas PA1 and PA2 formed in the first area I and a second preliminary active area PB formed in the second area II. The plurality of preliminary active areas PA1, PA2, and PB may have a fin shape protruding upward in a direction (Z direction) perpendicular to the main surface 110M of the substrate 110 and extending in a direction (X direction).

In some exemplary embodiments, to form the plurality of first and second trenches 502 and 504, a plurality of pad oxide film patterns 512 and a plurality of mask pattern 514 that sequentially cover regions of the substrate 110, which are to be the first area I and the second area II, may be formed. The plurality of pad oxide film patterns 512 and the plurality of mask patterns 514 may extend parallel to each other in a direction (X direction) on the substrate 110. In some exemplary embodiments, the plurality of pad oxide film patterns 512 may be formed of an oxide layer obtained by thermally oxidizing the surface of the substrate 110. The plurality of mask patterns 514 may include, e.g., a silicon nitride layer, a silicon oxynitride layer, a spin on glass (SOG) layer, a spin on hardmask (SOH) layer, a photoresist layer, or a combination thereof. However, embodiments are not limited thereto.

Figure 15A:
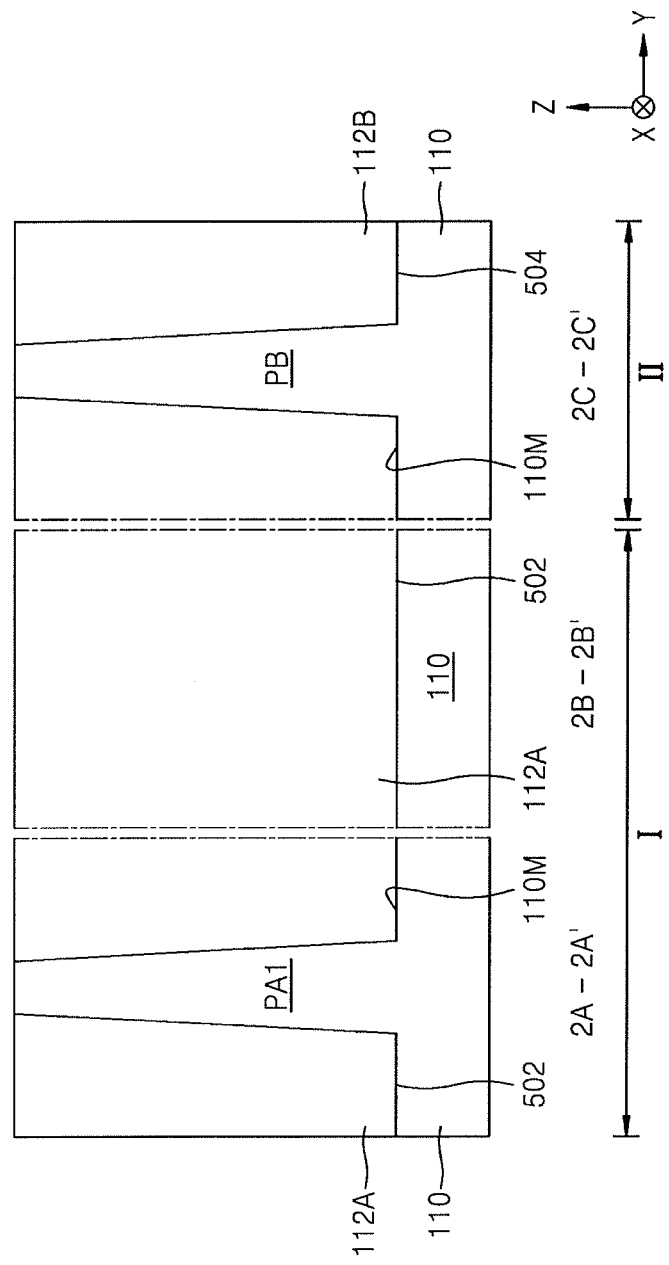
Figure 15C:
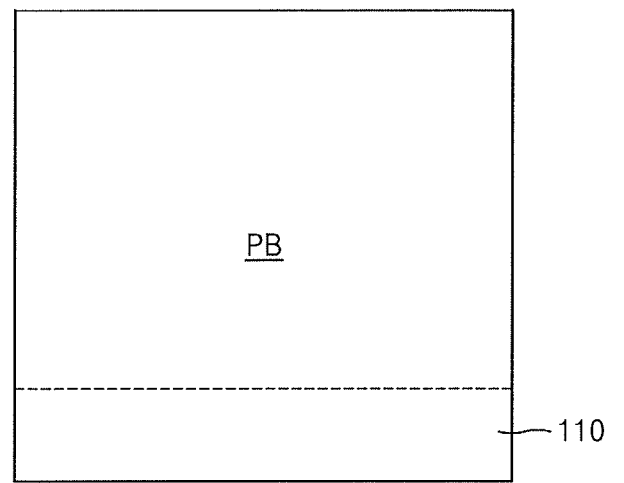
Figure 15C:
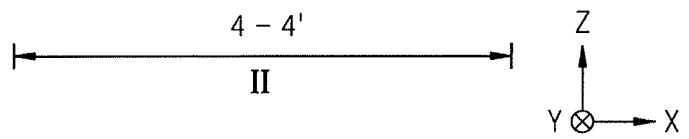

Referring to FIGS. 15A, 15B, and 15C, first and second device isolation films 112A and 112B, which fill the plurality of first trenches 502 in the first area I of the substrate 110, and the plurality of second trenches 504 in the second area II, respectively, may be formed.

The first and second device isolation films 112A and 112B may each have a planarized top surface. The top surface of the first device isolation film 112A in the first area I may be at the same level as the top surface of the pair of first preliminary active areas PA1. The top surface of the second device isolation film 112B in the second area II may be at the same level as the top surface of the second preliminary active area PB.

Forming the first and second device isolation films 112A and 112B may include processes of removing the plurality of pad oxide film patterns 512 and the plurality of mask pattern 514. In some exemplary embodiments, the first and second device isolation films 112A and 112B may be formed using a plasma enhanced chemical vapor deposition (PECVD) process, a high density plasma CVD (HDP CVD) process, an inductively coupled plasma CVD (ICP CVD) process, a capacitor coupled plasma CVD (CCP CVD) process, a flowable chemical vapor deposition (FCVD) process, and/or a spin coating process. However, embodiments are not limited to these methods.

Figure 16A:
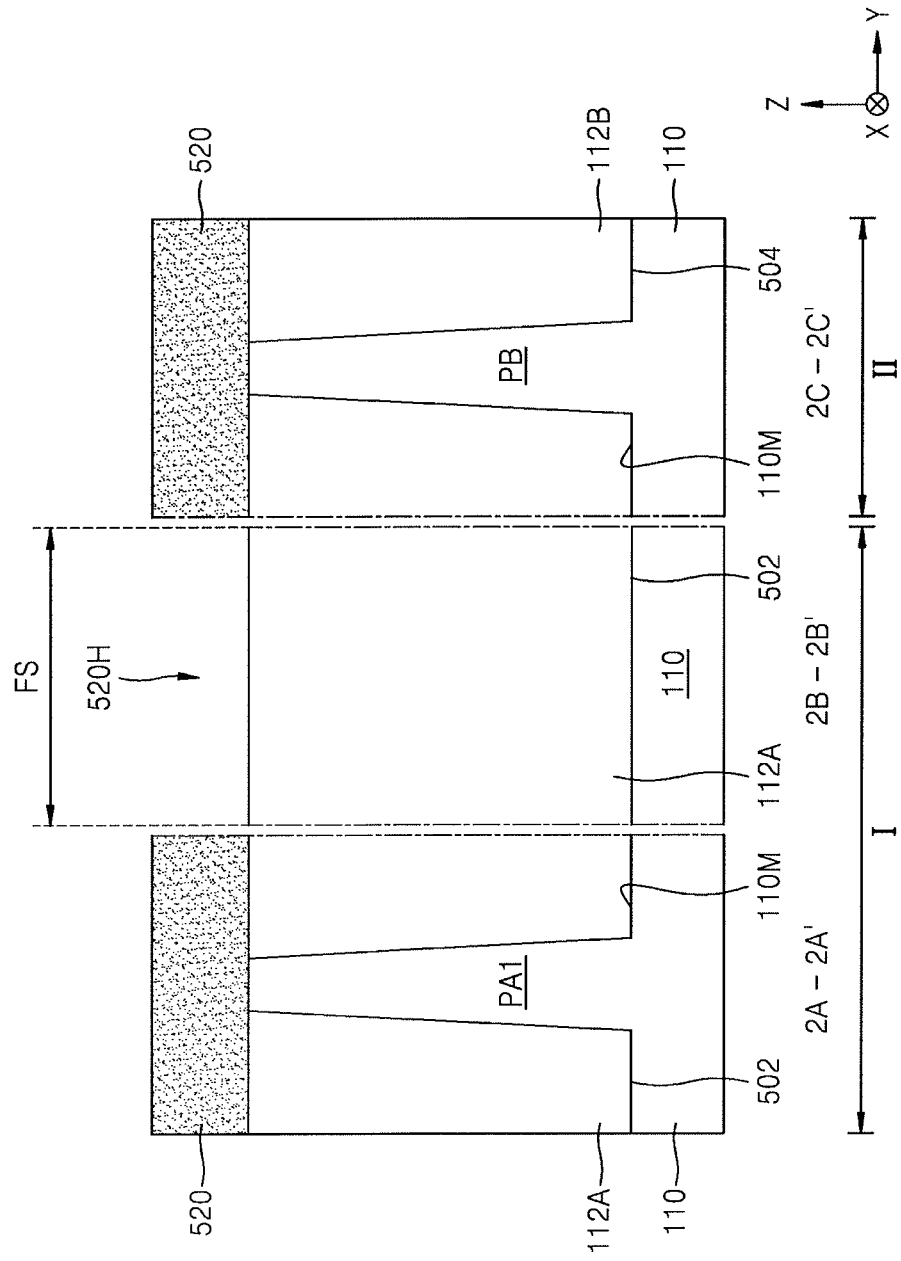
Figure 16B:
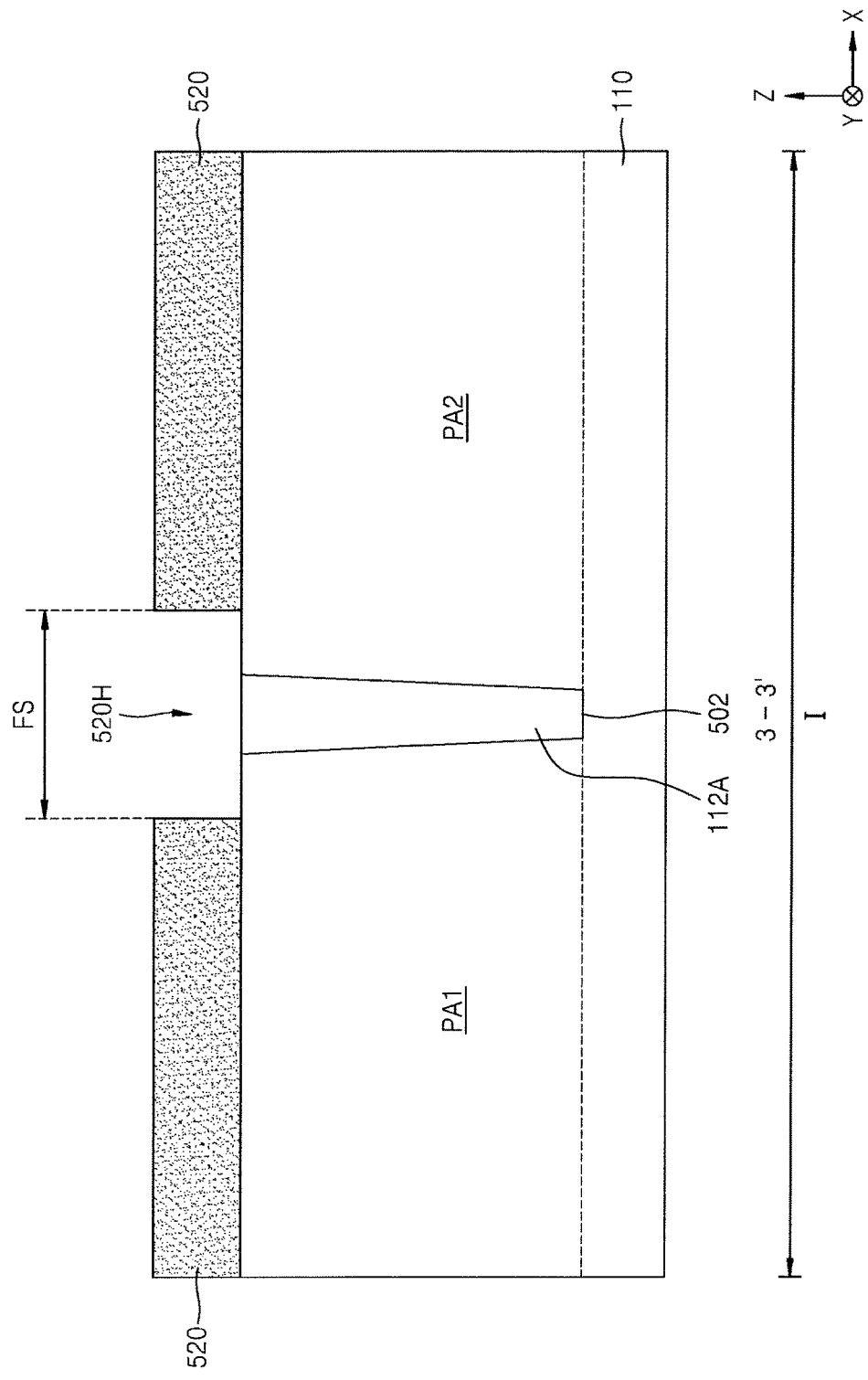
Figure 16C:
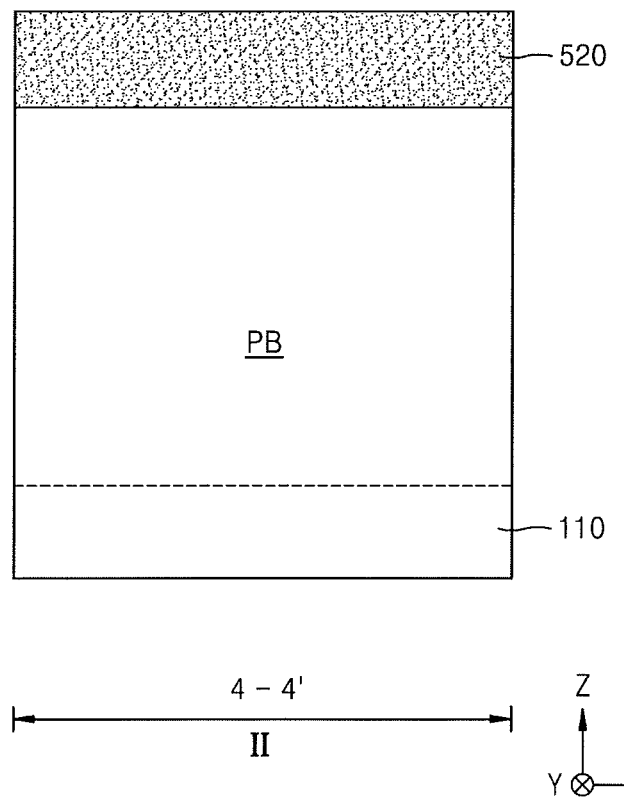

Referring to FIGS. 16A, 16B, and 16C, a hard mask pattern 520 may be formed to cover the top surfaces of the plurality of preliminary active areas PA1, PA2, and PB, and the top surfaces of the second device isolation films 112A and 112B in the first and second areas I and II, but not to cover the fin separation area FS in the first area I.

The hard mask pattern 520 may include an opening 520H that exposes the fin separation area FS of the first area I. The hard mask pattern 520 may be formed of a material having an etch selectivity with respect to the plurality of preliminary active areas PA1, PA2, and PB, and the first and second device isolation films 112A and 112B. For example, the hard mask pattern 520 may be formed of a nitride layer, a spin on hardmask (SOH) layer, or a combination thereof. However, embodiments are not limited thereto. The hard mask pattern 520 may be formed using a photolithography process.

Figure 17A:
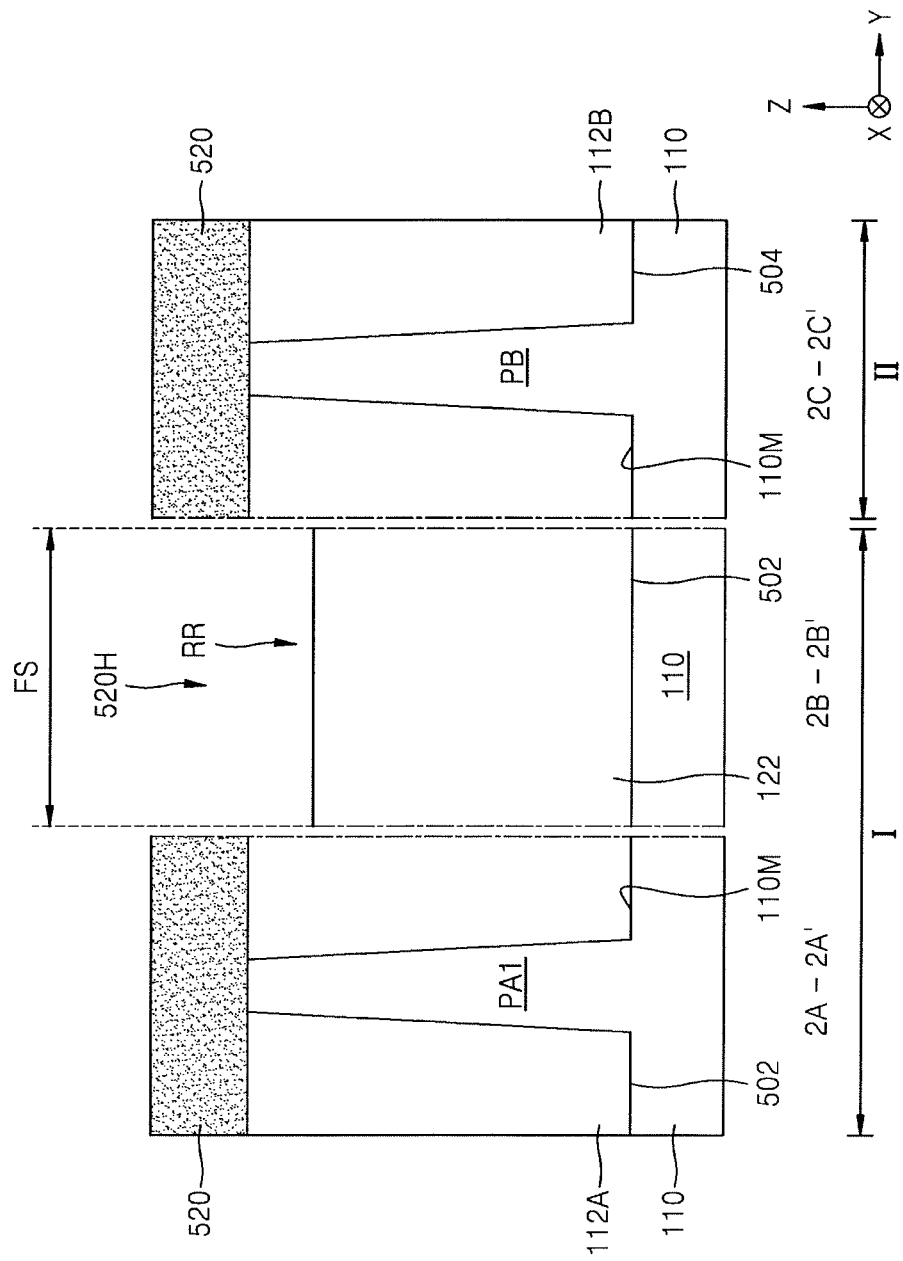
Figure 17B:
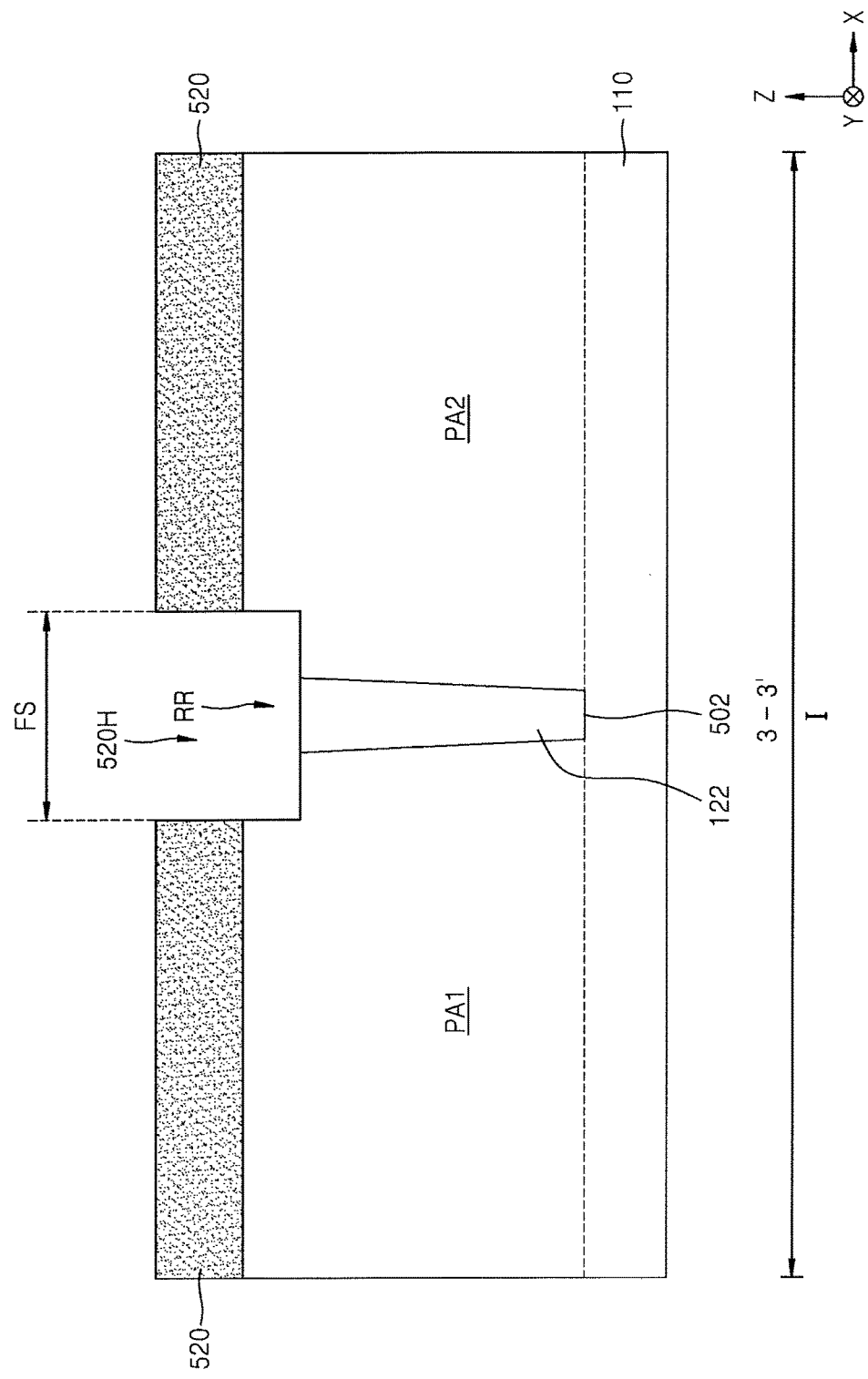
Figure 17C:
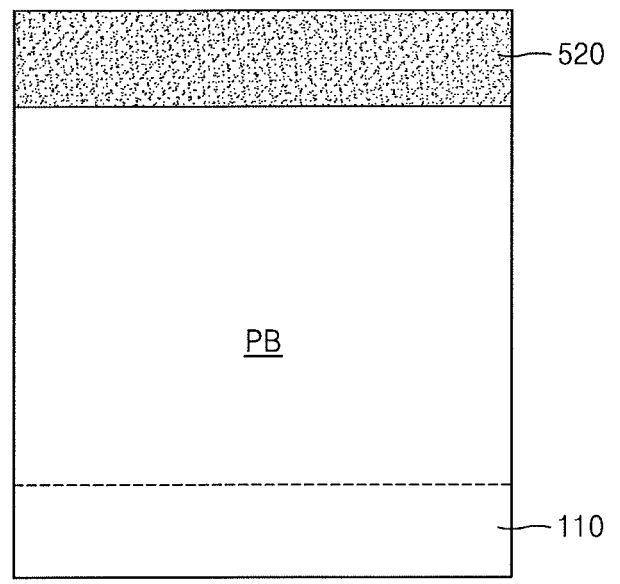

Referring to FIGS. 17A, 17B, and 17C, a recess area RR may be formed in the fin separation area FS by removing, by a predetermined thickness, portions of the pair of first preliminary active areas PA1 and PA2 and the first device isolation film 112A in the first area I that are exposed through the opening 520H of the hard mask pattern 520, with the hard mask pattern 520 in the resultant structure of FIGS. 16A, 16B, and 16C as an etch mask.

Due to the formation of the recess area RR, a pair of corners may be formed in the pair of first preliminary active areas PA1 and PA2. The pair of corners in the pair of first preliminary active areas PA1 and PA2 may correspond to the pair of corners CC1 and CC2 illustrated in FIG. 3. As the recess area RR is formed in the fin separation area FS, an upper portion of the first device isolation film 112A in the first separation area FS may be partially removed, and the remaining portion of the first device isolation film 112A in the fin separation area FS may form the lower insulating pattern 122.

Figure 18A:
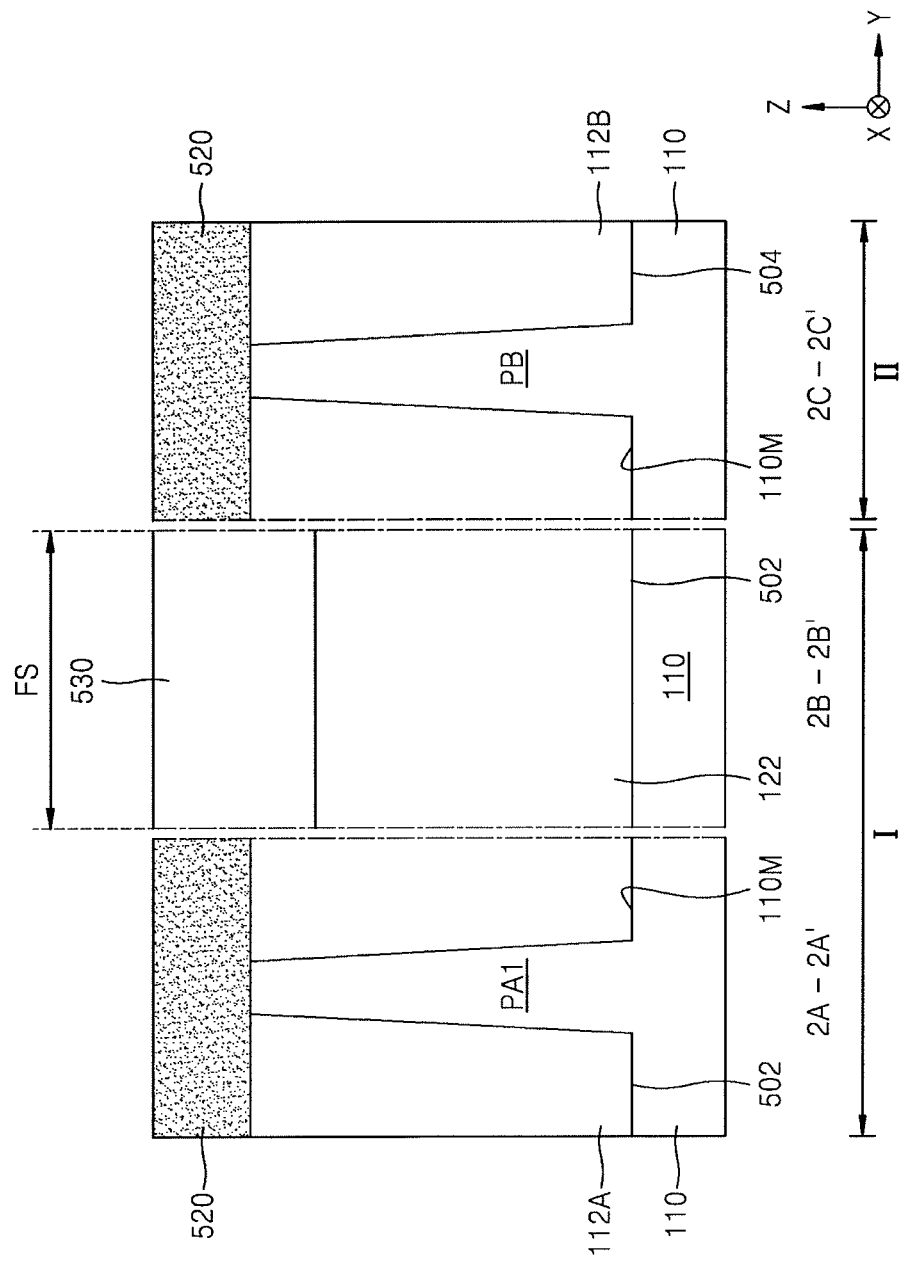
Figure 18B:
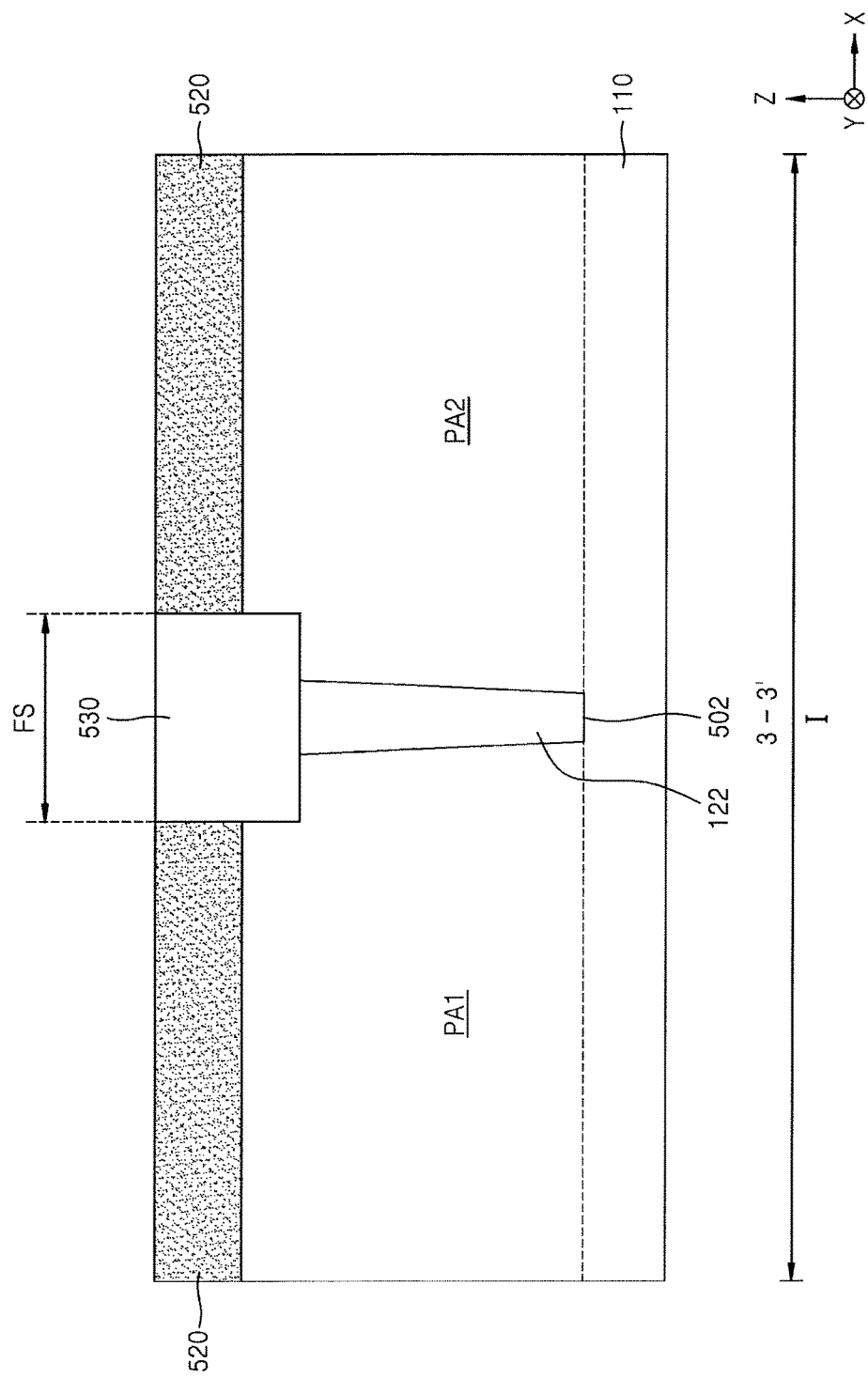
Figure 18C:
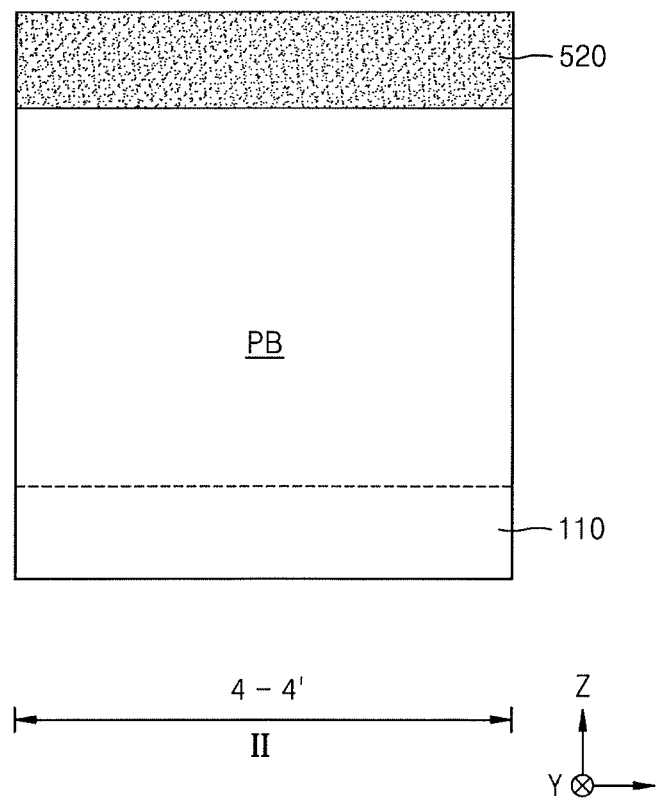

Referring to FIGS. 18A, 18B, and 18C, an upper insulating layer 530 may be formed to fill the recess area RR and the opening 520H (see FIGS. 17A, 17B, and 17C) of the hard mask pattern 520 in the first area I.

The upper insulating layer 530 may be formed of a material having an etch selectivity with respect to the hard mask pattern 520. In some exemplary embodiments, the upper insulating layer 530 may be formed of an oxide layer, a nitride layer, or a combination thereof. Materials of the upper insulating layer 530 are not limited thereto. In some exemplary embodiments, the upper insulating layer 530 may be formed of the same material as that of the lower insulating pattern 122.

According to an exemplary process of forming the upper insulating layer 530, an insulating material may be deposited to fill the recess area RR and the opening 520H of the hard mask pattern 520 and simultaneously cover the top surface of the hard mask pattern 520. Next, the deposited insulating material may be partially removed to expose the top surface of the hard mask pattern 520, thereby to form the upper insulating layer 530 with a planar top surface. The upper insulating layer 530 may be formed to protrude higher than the top surfaces of the pair of first preliminary active areas PA1 and PA2.

Figure 19A:
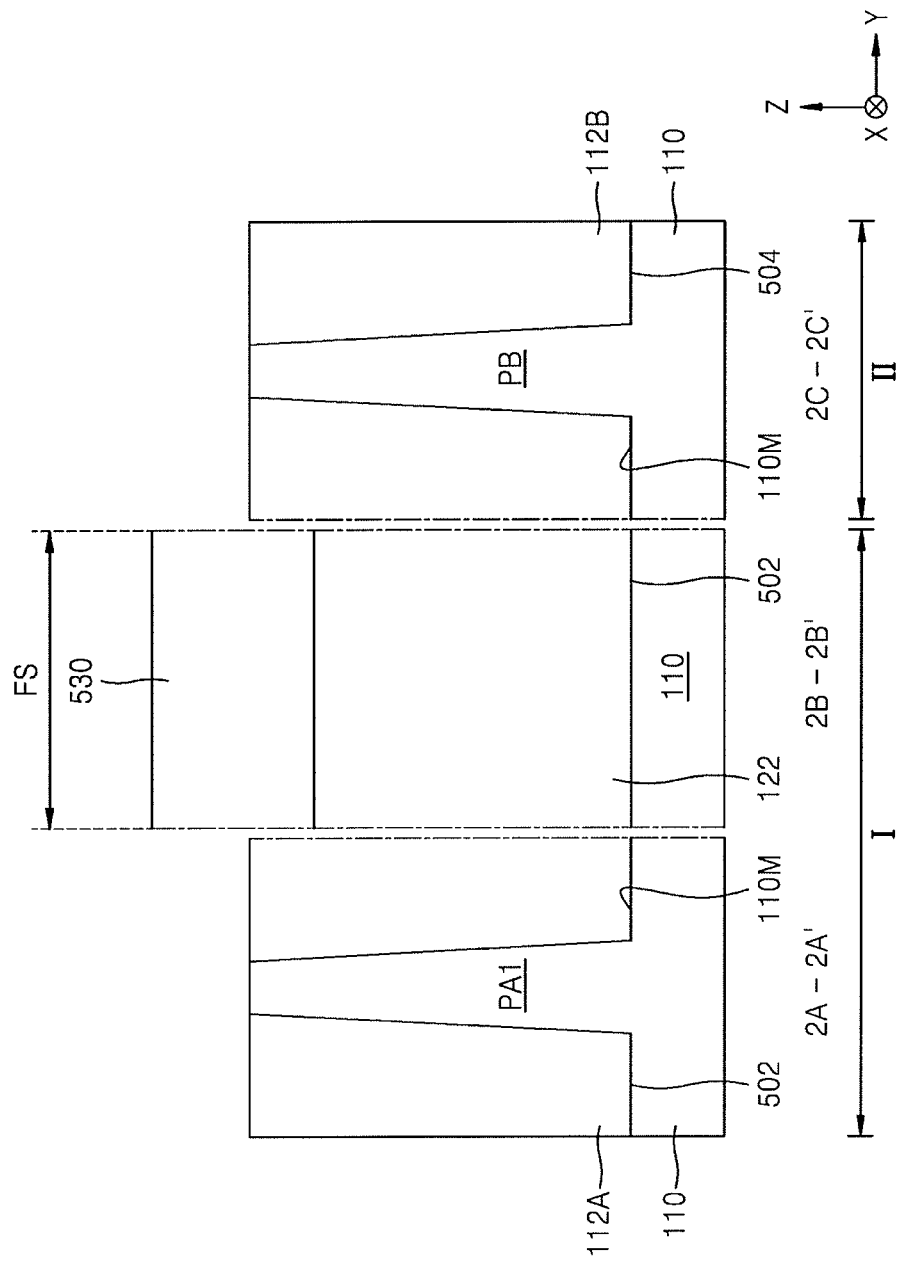
Figure 19B:
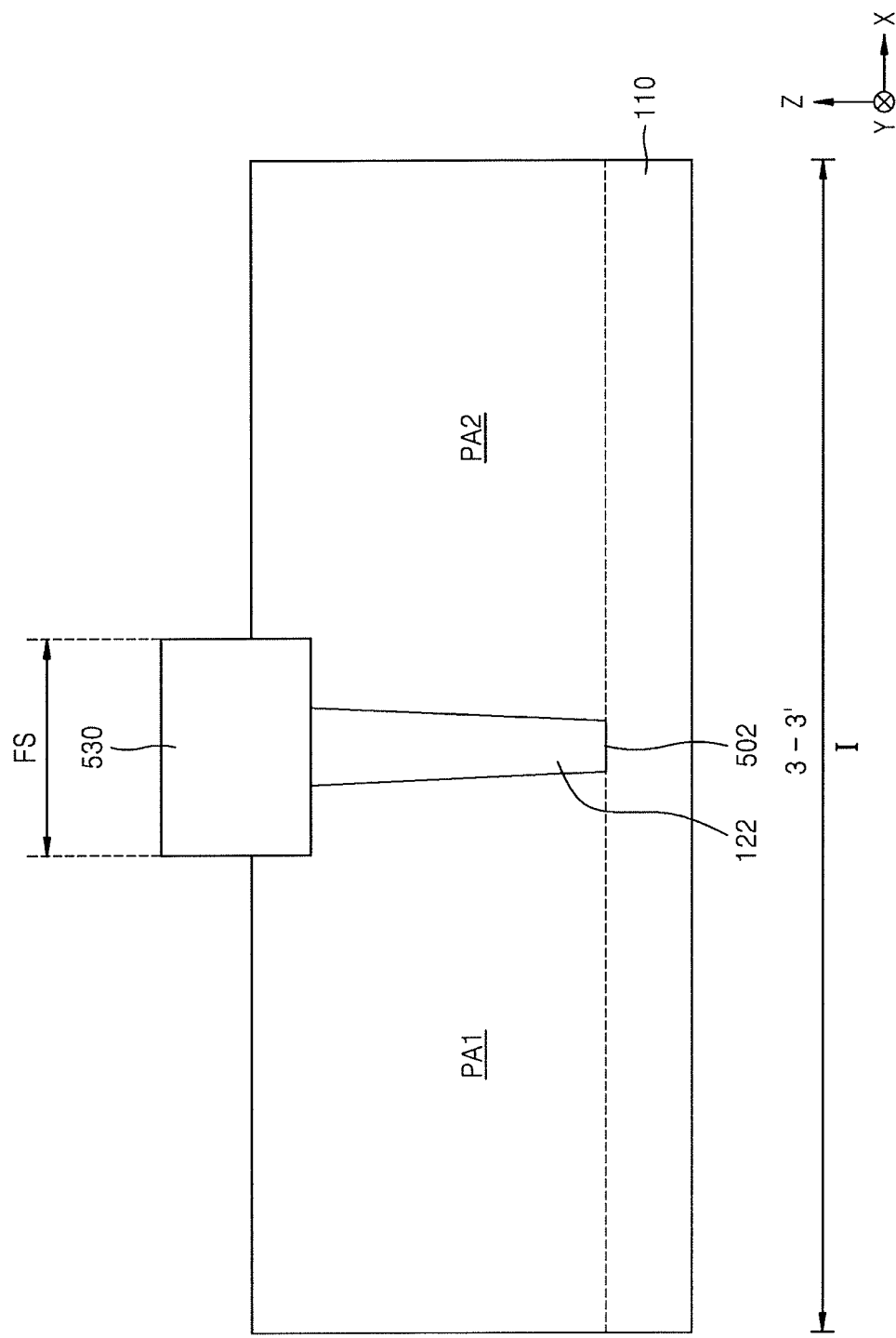
Figure 19C:
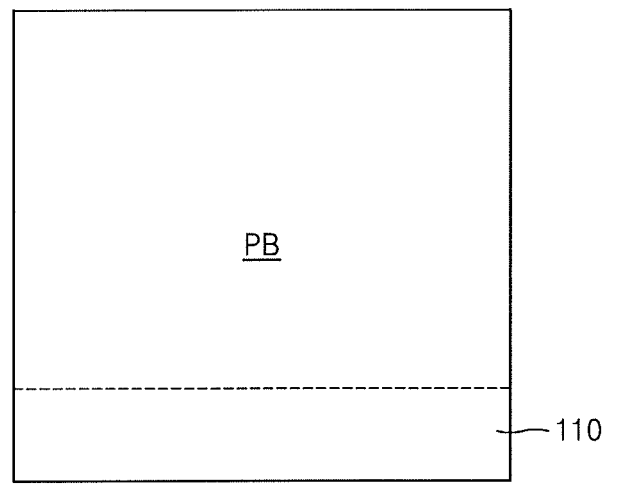
Figure 19C:
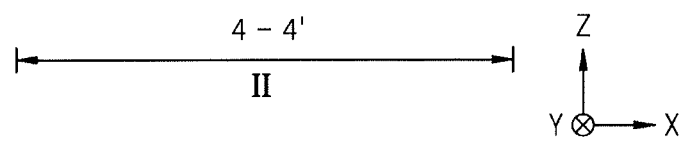

Referring to FIGS. 19A, 19B, and 19C, the hard mask pattern 520 may be removed from the resultant structure of FIGS. 18A, 18B, and 18C to expose the top surfaces of the plurality of preliminary active areas PA1, PA2, and PB, and the top surfaces of the first and second device films 112A and 112E in the first area I and the second area II. When the hard mask pattern 520 is formed of a silicon nitride layer, the hard mask pattern 520 may be removed by, e.g., a wet etching process using $H_3PO_4$.

Figure 20A:
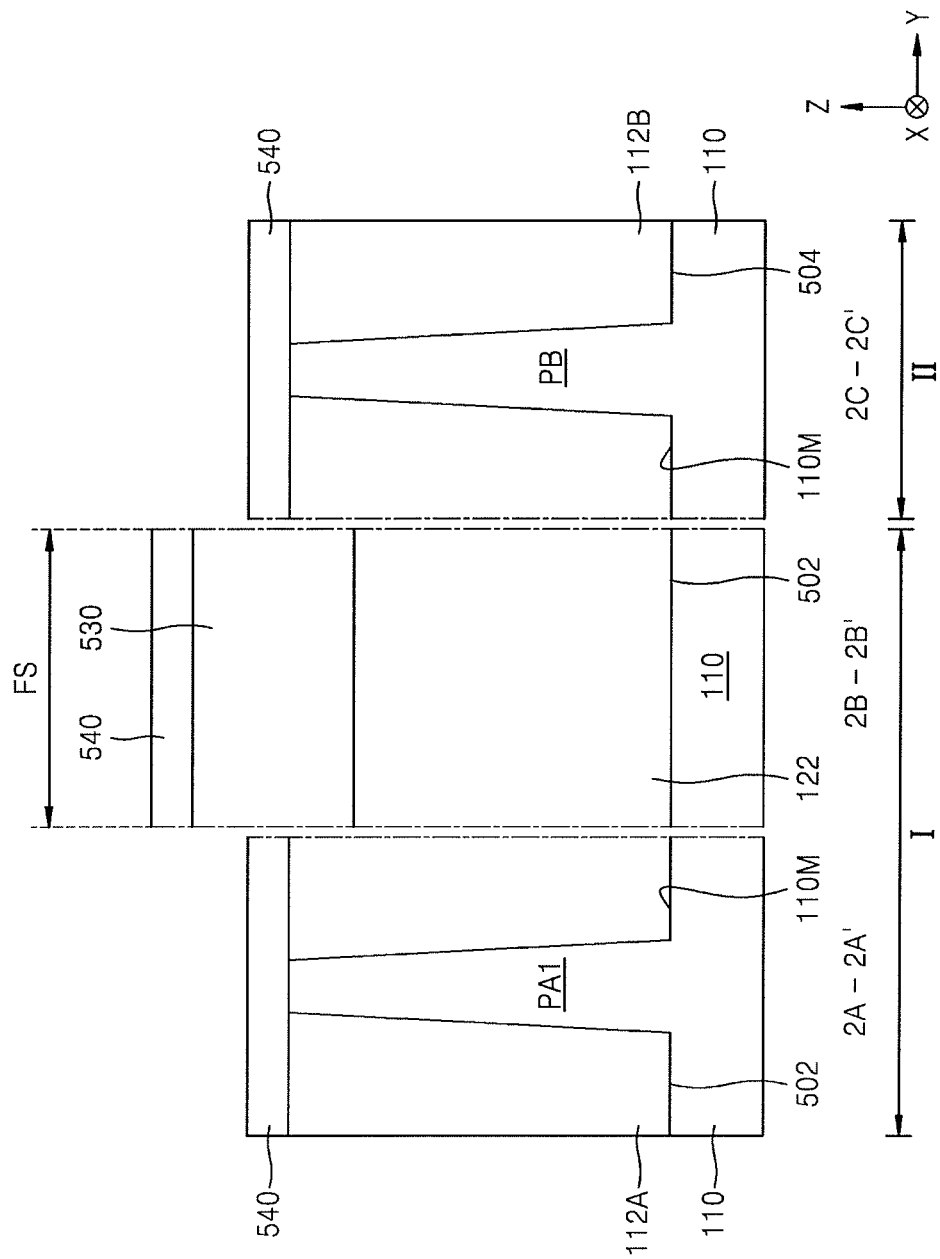
Figure 20B:
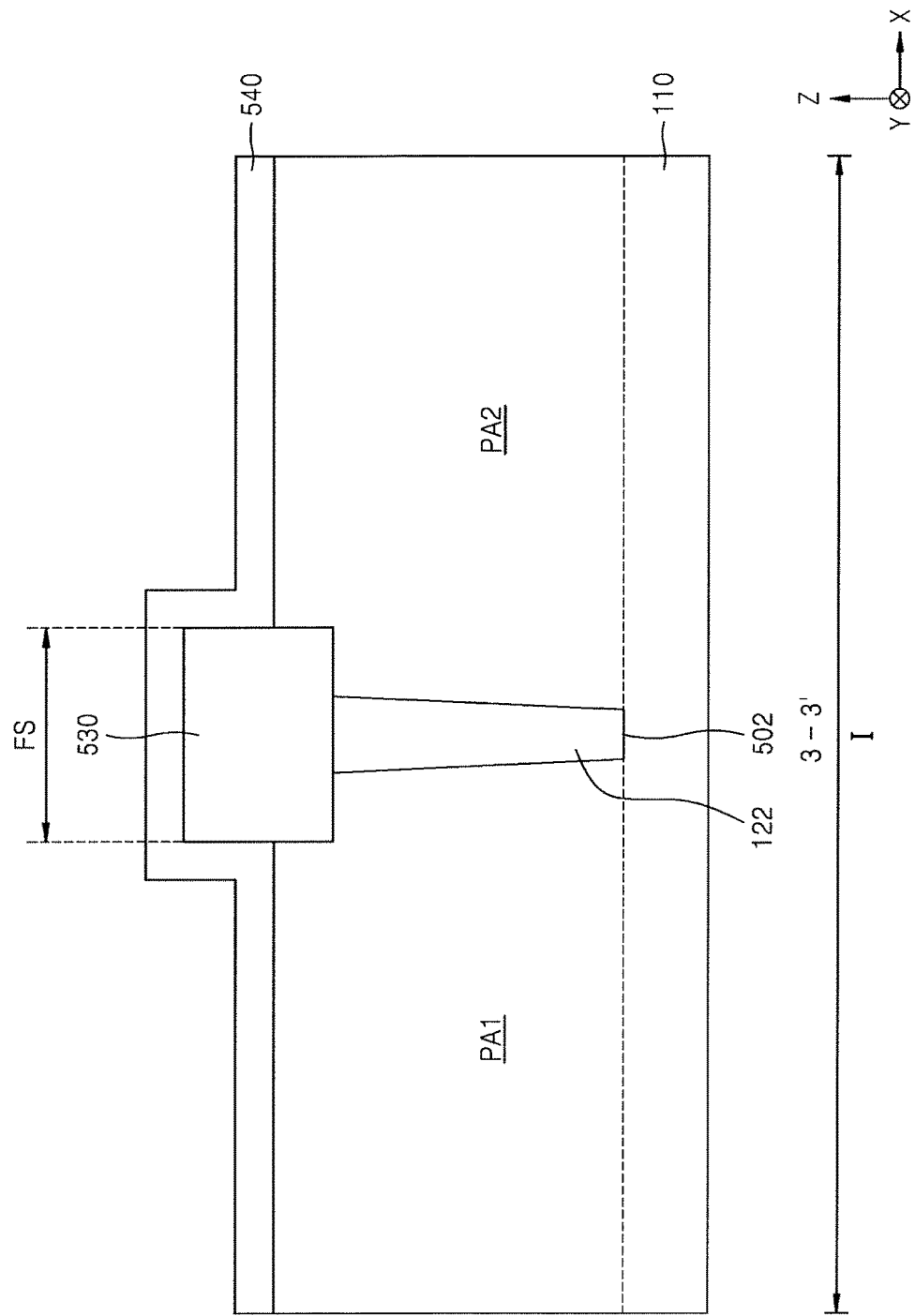
Figure 20C:
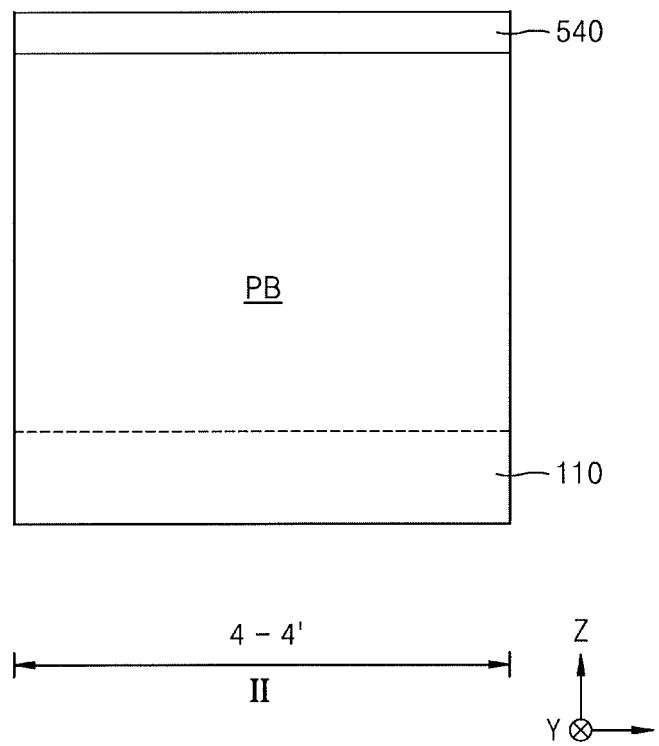

Referring to FIGS. 20A, 20B, and 20C, a sacrificial liner 540 may be formed to conformally cover the exposed top surface and sidewalls of the upper insulating layer 530 on the resultant structure of FIGS. 19A, 19B, and 19C.

The sacrificial liner 540 may be formed to cover the exposed surfaces of the upper insulating layer 530 and at the same time the exposed surfaces of the plurality of preliminary active areas PA1, PA2, and PB and the first and second device isolation films 112A and 112B in the first area I and the second area II. In some exemplary embodiments, the sacrificial liner 540 may be formed of an oxide layer, a nitride layer, or a combination thereof. However, materials of the sacrificial liner 540 are not limited thereto. For example, the sacrificial liner 540 may be formed of the same material as that of the upper insulating layer 530. For example, the sacrificial liner 540 and the upper insulating layer 530 may each be formed of an oxide layer. In some exemplary embodiments, the sacrificial liner 540 may be formed using an ALD process. However, embodiments are not limited thereto.

Figure 21A:
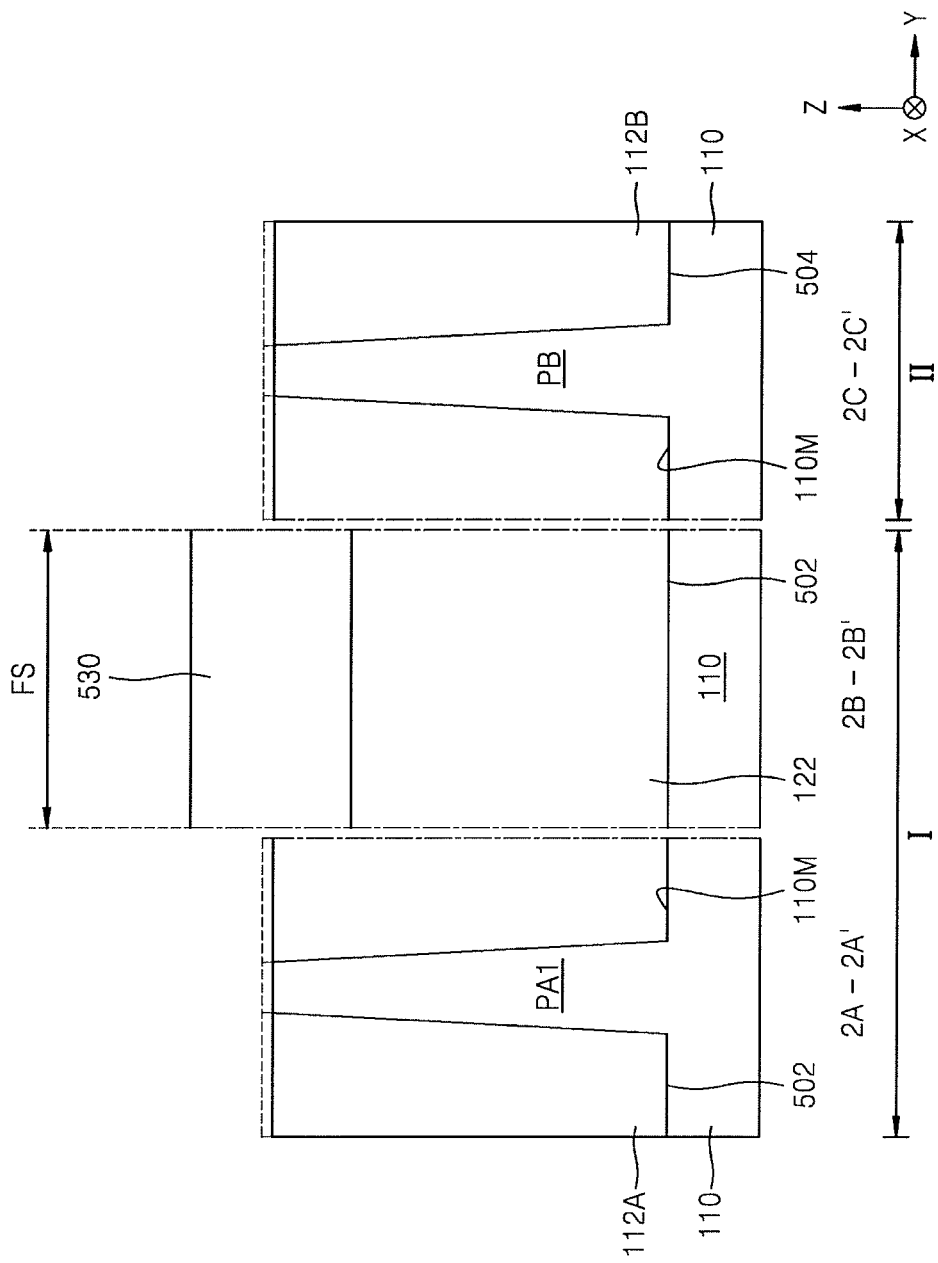
Figure 21B:
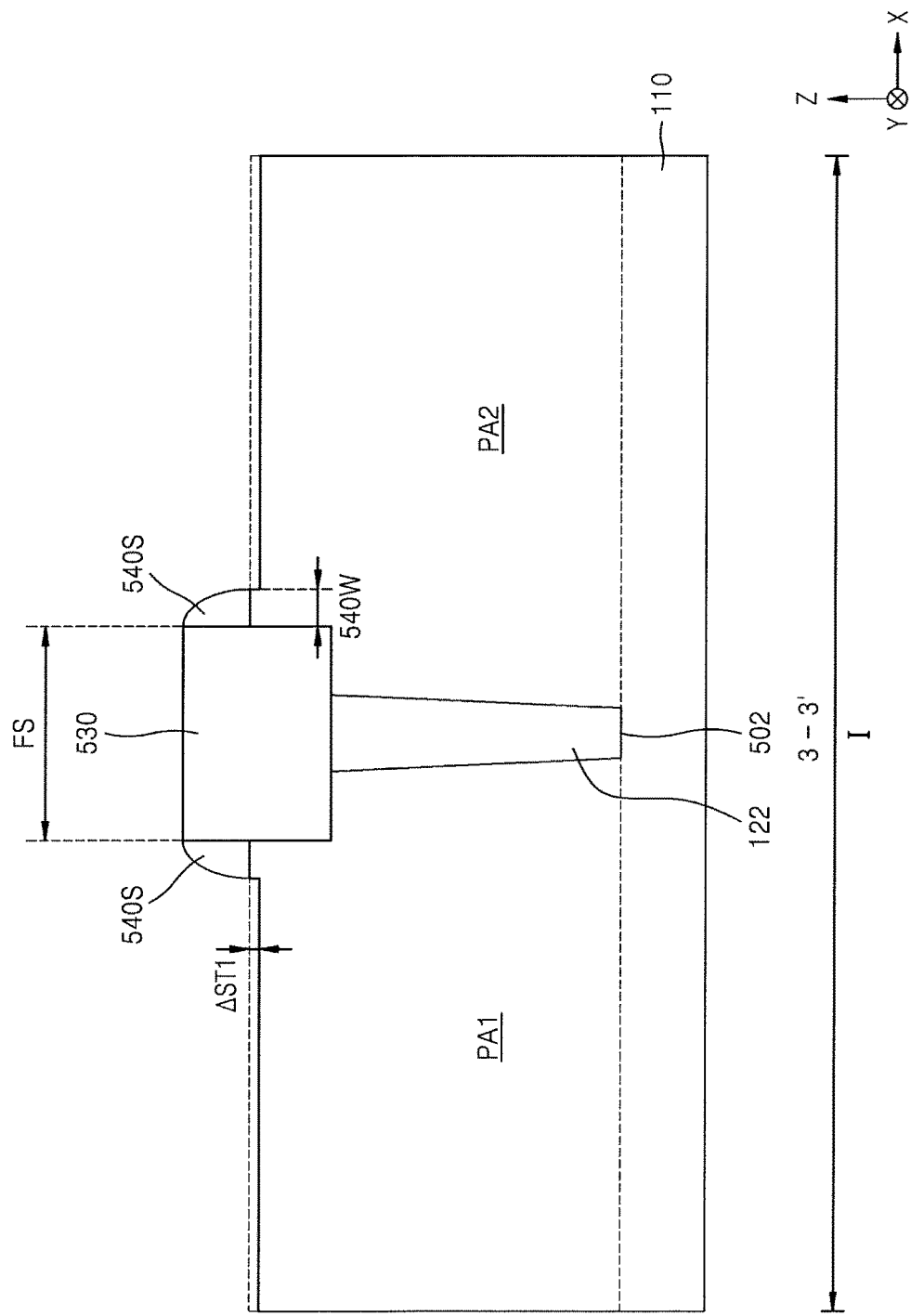
Figure 21C:
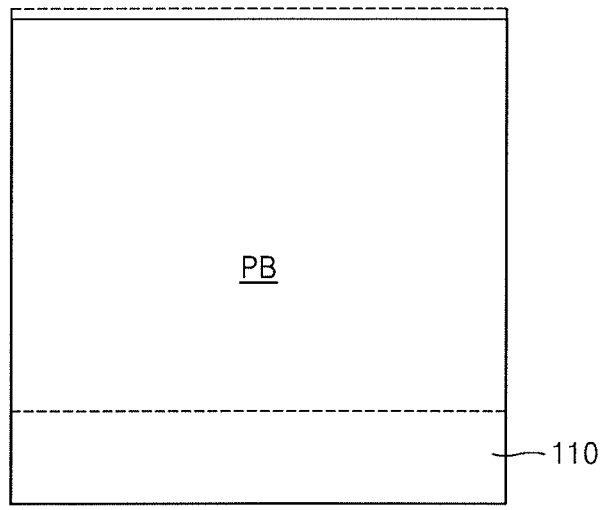
Figure 21C:
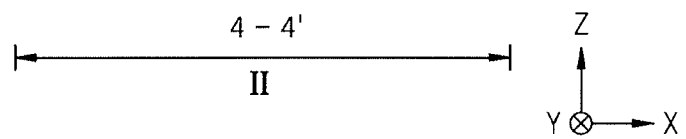

Referring to FIGS. 21A, 21B, and 21C, a sacrificial spacer 540S that covers opposite sidewalls of the upper insulating layer 530 may be formed by partially removing the sacrificial liner 540 (see FIGS. 20A, 20B, and 20C) using an anisotropic dry etching process.

In some exemplary embodiments, the sacrificial spacer 540S may be formed by anisotropically dry etching the sacrificial liner 540, e.g., using a dry etching process, such as an inductively coupled plasma (ICP) process, a transformer coupled plasma (TCP) process, an electron cyclotron resonance (ECR) process, or a reactive ion etch (RIE) process. When the sacrificial liner 540 is formed of an oxide layer, the anisotropic dry etching of the sacrificial liner 540 may be performed using a fluorine-containing gas such as $CF_4$, a chlorine-containing gas such as $Cl_2$, or HBr. However, embodiments are not limited thereto.

In some exemplary embodiments, in the anisotropic dry etching process on the sacrificial liner 540 to form the sacrificial spacer 540S, the exposed top surfaces of the plurality of preliminary active areas PA1, PA2, and PB, the exposed surfaces of the first and second device isolation films 112A and 112B, and the exposed surface of the upper insulating layer 530, after the formation of the sacrificial spacer 540S, may be partially removed by being overetched (indicated by a dashed line above the preliminary active areas PA1, PA2, and PB). This may result in a step difference ΔST1 between a region covered by the sacrificial spacer 540S and a region not covered by the same on the top surfaces of the preliminary active areas PA1 and PA2 in the first area I. In the first area I, the opposite sidewalls of the upper insulating layer 530 may be protected by the sacrificial spacer 540S, by as much as a width 540W of the sacrificial spacer 540S in the first direction (X direction).

Figure 22A:
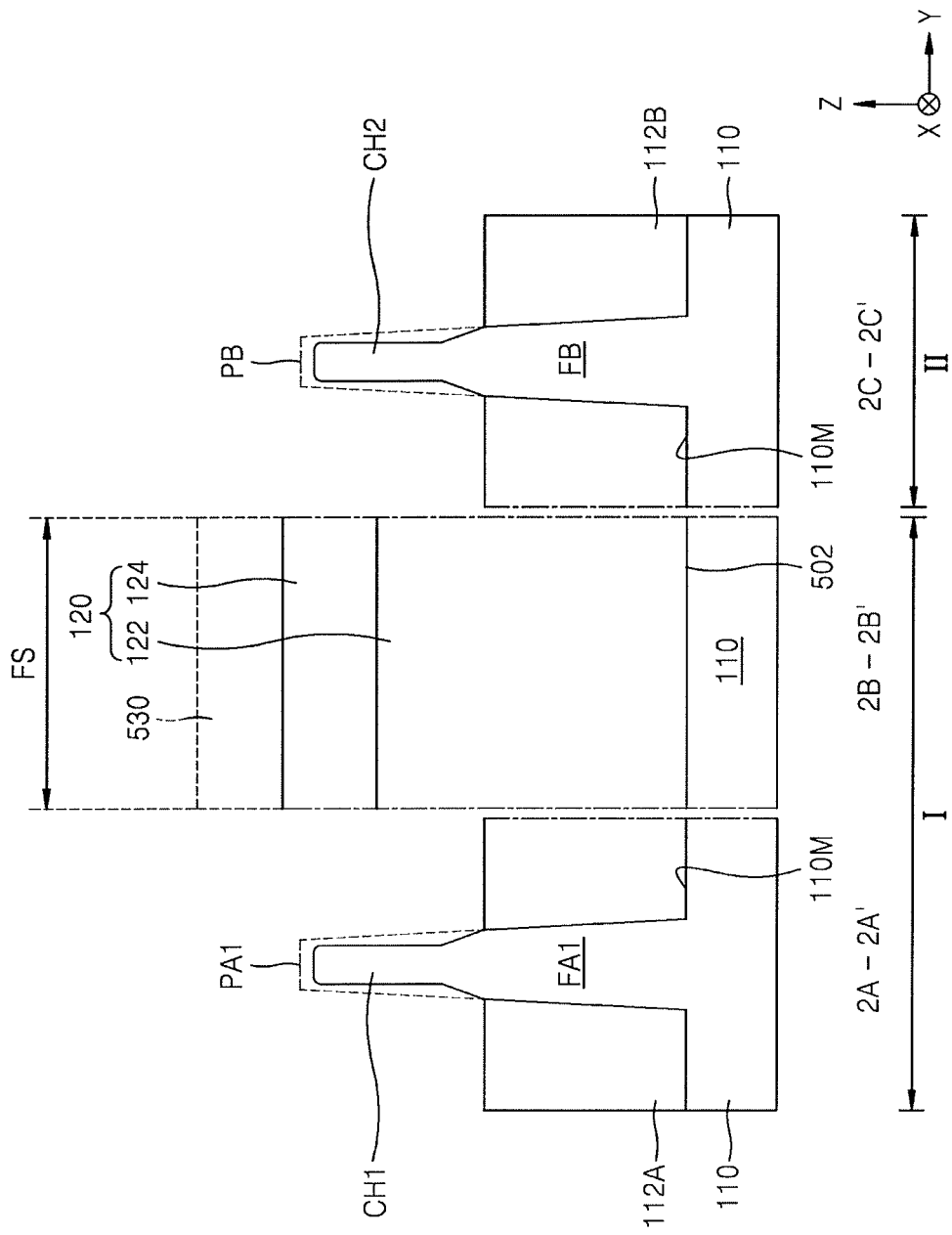
Figure 22B:
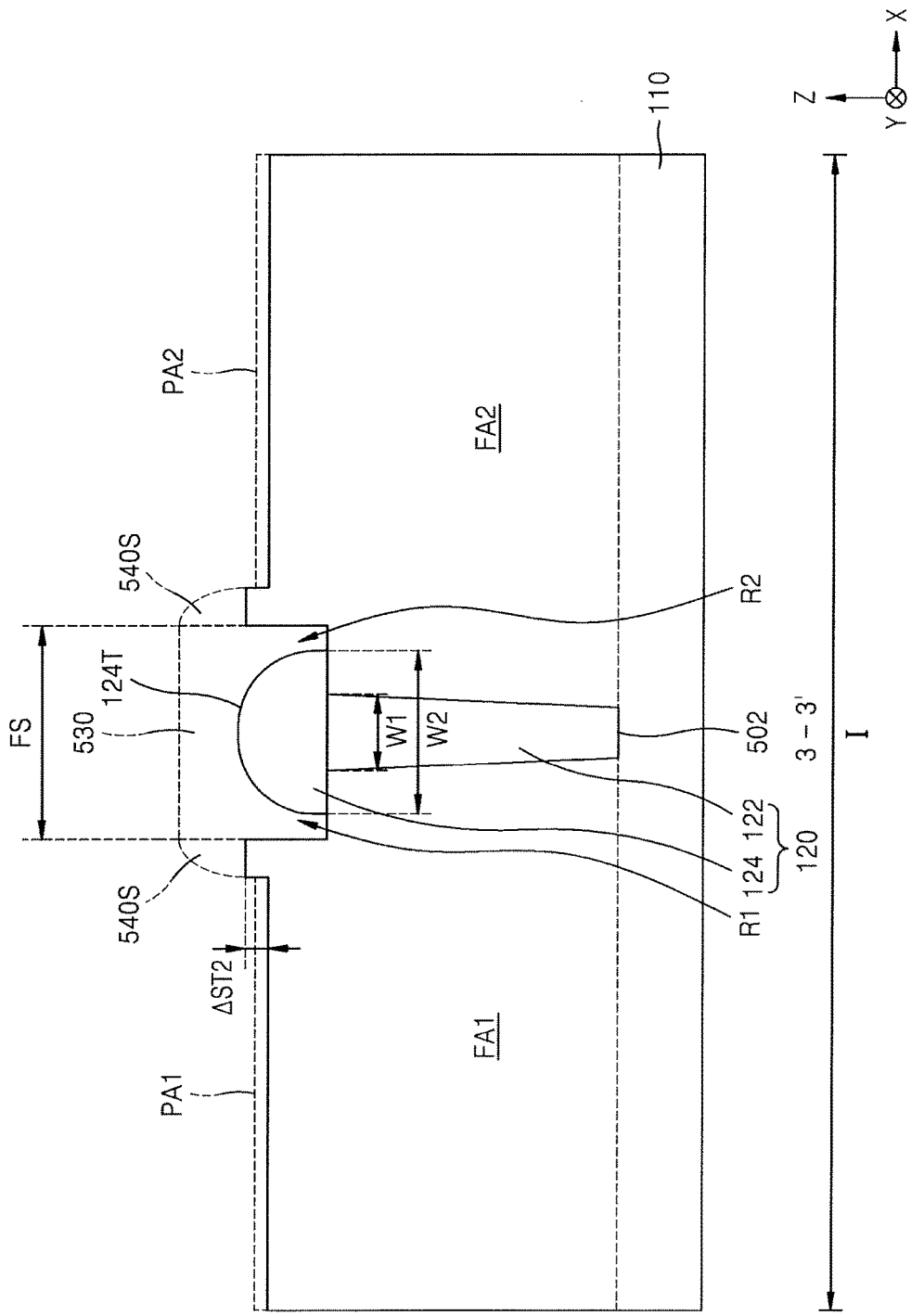
Figure 22C:
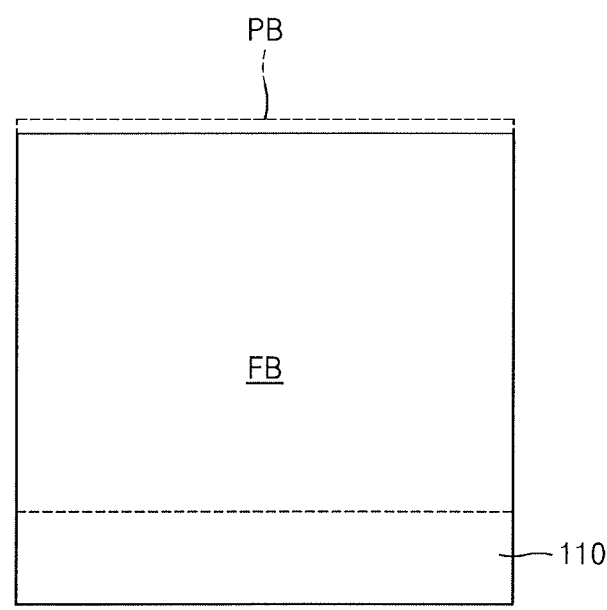
Figure 22C:
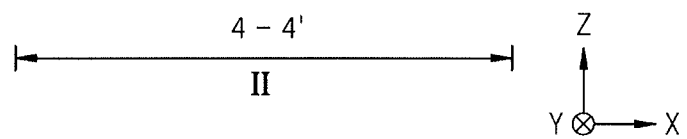

Referring to FIGS. 22A, 22B, and 22C, a recess process of partially removing the first and second device isolation films 112A and 112B to expose the top surfaces and upper sidewalls of the plurality of preliminary active areas PA1, PA2, and PB may be performed using an isotropic etching process, to thereby form the pair of first fin-shaped active areas FA1 and FA2 and the second fin-shaped active area FB from the plurality of preliminary active areas PA1, PA2, and PB (removed portions indicated by a dashed line). At the same time, the sacrificial spacer 540S and the upper insulating layer 530 may be removed in the fin separation area FS (FIG. 22B), so that an upper insulating pattern 124, which is the remaining portion of the upper insulating layer 530 after the isotropic etching, may remain on the lower insulating pattern 122 in the fin separation area FS.

While removing the sacrificial spacer 540S and the upper insulating layer 530 in the fin separation area FS by the isotropic etching process, the amount of the upper insulating layer 530 removed in a lateral direction by the isotropic etching may be reduced as much as the amount of the sacrificial spacer 540S removed. As a result, as illustrated in FIG. 22B, the upper insulating pattern 124 having a width W2 larger than the width W1 of the lower insulating pattern 122 may remain on the lower insulating pattern 122. The upper insulating pattern 124 may be formed to have a top surface at a higher level than the top surfaces of the pair of first fin-shaped active areas FA1 and FA2. That is, formation of the sacrificial spacer 540S on lateral surfaces of the upper insulating layer 530 minimizes a portion of the upper insulating layer 530 that is removed during the isotropic etching, thereby resulting in a wider width of the upper insulating pattern 124 relative to the lower insulating pattern 122.

To secure a sufficient vertical direction etch margin of the upper insulating layer 530 when forming the upper insulating pattern 124 by the isotropic etching process on the upper insulating layer 530, the upper insulating layer 530 may be formed to have a sufficiently high height by adjusting the height of the hard mask pattern 520 in the process of forming the upper insulating layer 530 described above with reference to FIGS. 17A to 18C. To secure a sufficient horizontal direction etch margin of the upper insulating layer 530 when forming the upper insulating pattern 124 by the isotropic etching process on the upper insulating layer 530, the width 540W of the sacrificial spacer 540S in the first direction (X direction) as described above with reference to FIGS. 20A to 21C may be adjusted.

As described above, by forming the upper insulating pattern 124 having a desired width W2 and height by adjusting the height of the upper insulating layer 530 and the width 540W of the sacrificial spacer 540S covering opposite sidewalls of the upper insulating layer 530, sufficient etch margins in vertical and horizontal directions of the upper insulating layer 530 may be secured. As a result, when the dummy gate DG is formed on the upper insulating pattern 124 and the first source/drain areas 172 are formed on opposite sides of each of the first and second normal gates NGA and NGB, as illustrated in FIG. 3, in subsequent processes, a short circuit between the dummy gate DG and the first source/drain areas 172 adjacent to the dummy gate DG may be prevented by the upper insulating pattern 124.

In some exemplary embodiments, to perform the recess process of partially removing the first and second device isolation films 112A and 112B, and the process of forming the upper insulating pattern 124 on the lower insulating pattern 122 by using isotropic etching, a wet etching process using $NH_4OH$, tetramethyl ammonium hydroxide (TMAH), potassium hydroxide (KOH), or the like as an etchant may be performed. Due to the use of the wet etching process in the recess process of partially removing the first and second device isolation films 112A and 112B, and the isotropic etching process of forming the upper insulating pattern 124 on the lower insulating pattern 122, exposed upper portions of the plurality of preliminary active areas PA1, PA2, and PB in the first area I and the second area II may not be exposed to dry etching atmospheres, such as plasma. Thus, even when the upper portions of the plurality of preliminary active areas PA1, PA2, and PB are exposed during the recess process, damage or degradation of surface roughness to the exposed upper portions of the plurality of preliminary active areas PA1, PA2, and PB by dry etching atmospheres, e.g., plasma, may be prevented or substantially minimized. Thus, in a fin-shaped active area of a highly downscaled transistor, e.g., a transistor having a gate length of 10 nm or less, carrier mobility deterioration or defects, such as current density reduction or leakage current increase, may be reduced.

After the recess process of partially removing the first and second device isolation films 112A and 112B is performed, the first and second device isolation films 112A and 112B in the first area I and the second area II may have a reduced height of a top surface. Further, the upper portions of the plurality of preliminary active areas PA1, PA2, and PB may be exposed by protruding above the first and second device isolation films 112A and 112B.

In some exemplary embodiments, after the recess process, the exposed surfaces of the plurality of preliminary active areas PA1, PA2, and PB protruding above the first and second device isolation films 112A and 112B in the first area I and the second area II may be oxidized to form surface oxide films, and then the surface oxide films may be removed. During formation of the surface oxide films, the plurality of preliminary active areas PA1, PA2, and PB may be removed by a thickness from the exposed surfaces thereof. Accordingly, after removing the surface oxide films, the widths and heights of the plurality of preliminary active areas PA1, PA2, and PB at upper portions thereof may be reduced, so that a pair of first fin-shaped active area FA1 and FA2 and a second fin-shaped active area FB that may have a narrower width at the first and second channel areas CH1 and CH2 than at the first and second base portions B1 and B2, as illustrated in FIGS. 22A to 22C, may be obtained.

After the pair of first fin-shaped active areas FA1 and FA2 and the second fin-shaped active area FB are formed, the top surfaces of the pair of first fin-shaped active area FA1 and FA2 in the first area I may have a step difference ΔST2 at regions thereof adjacent to the fin separation area FS.

In some exemplary embodiments, to form the surface oxide films on the upper portions of the plurality of preliminary active areas PA1, PA2, and PB, respectively, an oxidation treatment process using plasma may be performed. In some exemplary embodiments, to form the surface oxide films, the oxidation treatment process may be performed under plasma atmosphere obtained using $O_2$ gas and an inert gas. In some other exemplary embodiments, to form the surface oxide films, the oxidation treatment process may be performed under plasma atmosphere obtained using $O_2$ gas, an inert gas, and $H_2$ gas. In some other exemplary embodiments, to form the surface oxide films, an in-situ steam generation (ISSG) process using a combination of $H_2$ gas and $O_2$ gas may be performed.

In some exemplary embodiments, the surface oxide films obtained by oxidizing the top surfaces of the plurality of preliminary active areas PA1, PA2, and PB may be partially left, not fully removed. In some exemplary embodiments, the surface oxide films remaining on the top surfaces of the plurality of preliminary active areas PA1, PA2, and PB may form, e.g., at least part of the first and second interfacial layers 142A and 142B as illustrated in FIG. 2.

In some exemplary embodiments, an impurity ion implantation process for threshold voltage adjustment may be performed on the upper portions of the pair of first fin-shaped active areas FA1 and FA2 and the second fin-shaped active area FB in the first area I and the second area II. In the impurity ion implantation process for threshold voltage adjustment, boron (B) ions may be implanted into regions of the first area I and the second area II in which NMOS transistors are to be formed, and phosphorous (P) or arsenic (As) ions may be implanted into regions in which PMOS transistors are to be formed.

Figure 23A:
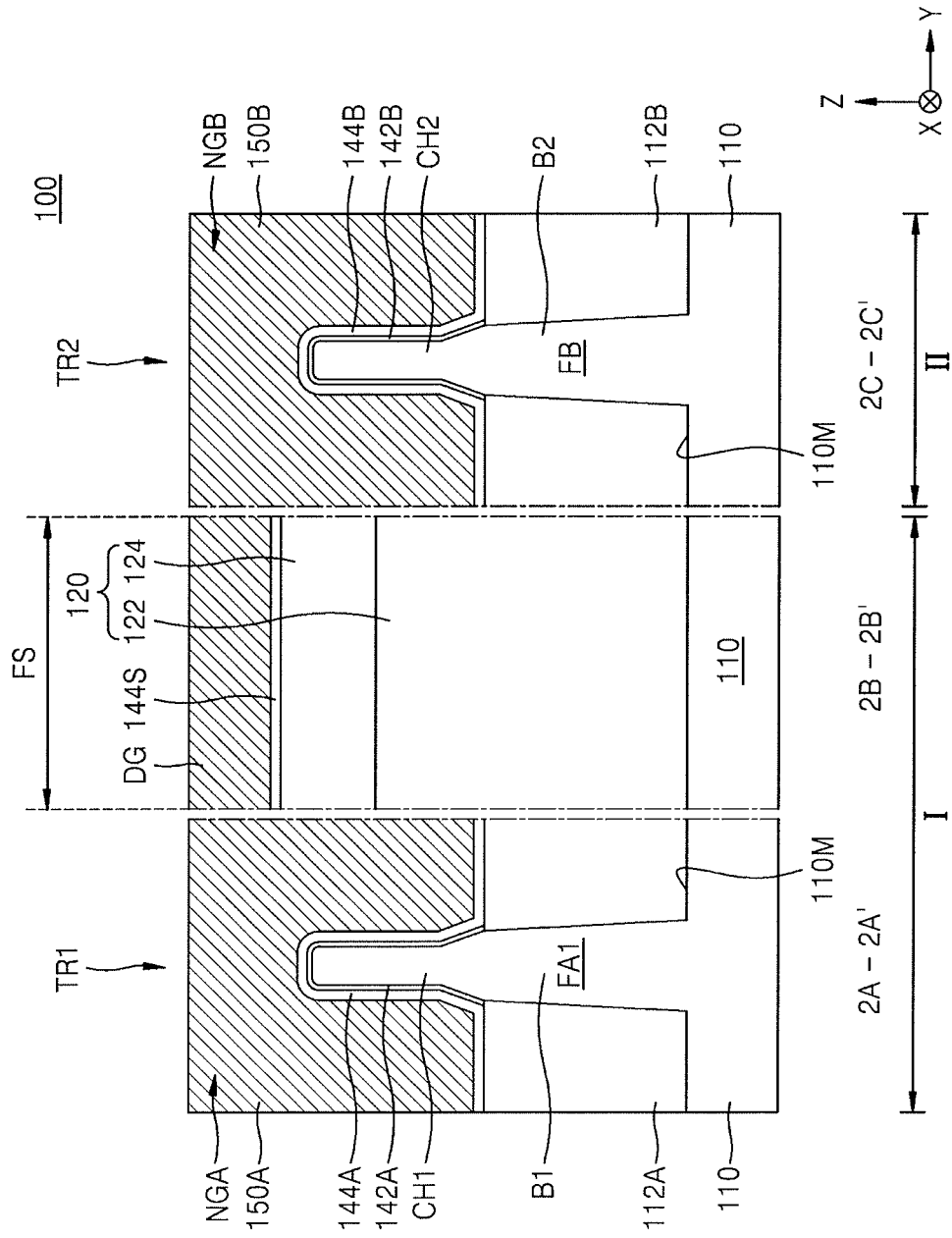
Figure 23B:
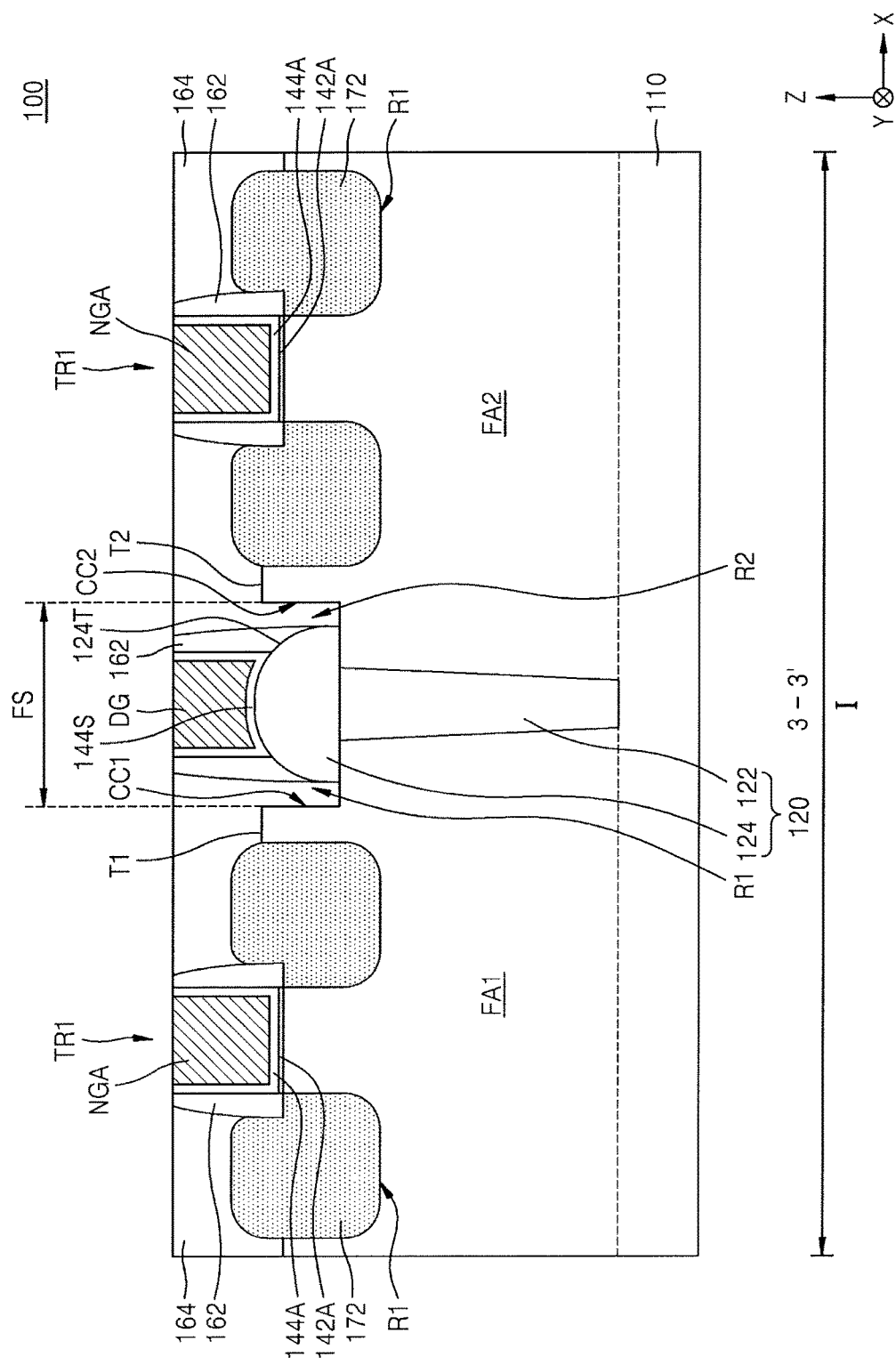
Figure 23C:
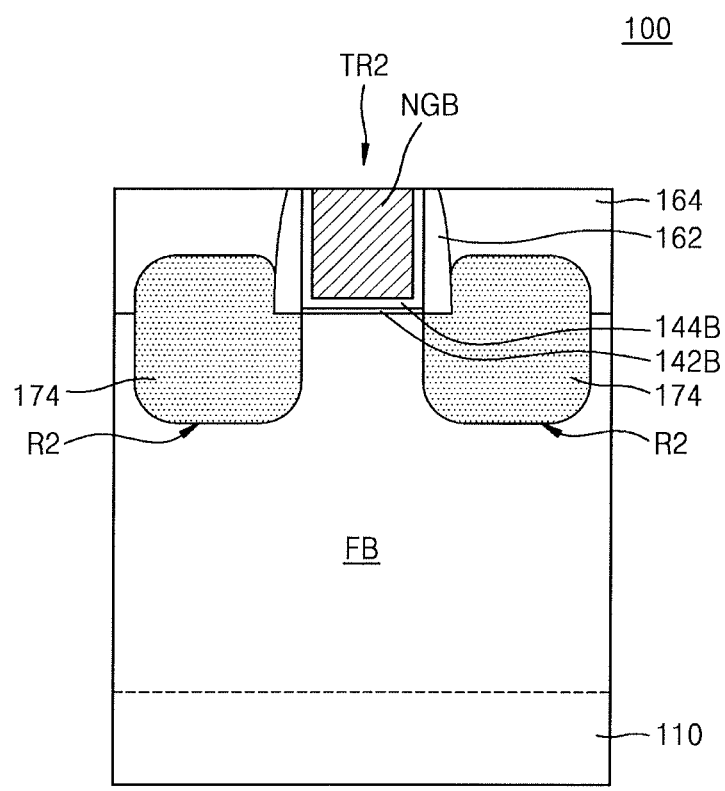

Referring to FIGS. 23A, 23B, and 23C, the first and second interfacial layers 142A and 142B, the first and second gate dielectric films 144A and 144B, and the first and second normal gates NGA and NGB, which are disposed on the pair of first fin-shaped active area FA1 and FA2 and the second fin-shaped active area FB exposed in the first area I and the second area II, may be formed. The third gate dielectric film 144S and the dummy gate DG, which are disposed on the upper insulating pattern 124 in the fin separation area FS, may be formed. The insulating spacer 162, which covers the sidewalls of the first and second normal gates NGA and NGB, and the inter-gate insulating film 164, which covers the sidewall of the dummy gate DG, may be formed.

In some exemplary embodiments, the first and second normal gates NGA and NGB and the dummy gate DG may be formed by a replacement poly-gate (RPG) process. In an exemplary process of forming the first and second normal gates NGA and NGB and the dummy gate DG by an RPG process, first, a plurality of sacrificial patterns (not shown) including a stack structure of a sacrificial gate dielectric film and a sacrificial gate pattern may be formed on the pair of first fin-shaped active area FA1 and FA2 and the second fin-shaped active area FB. Then, the insulating spacer 162 and the inter-gate insulating film 164, which cover the opposite sidewalls of each of the plurality of sacrificial patterns, may be formed. Then, after the plurality of sacrificial patterns are removed to provide a plurality of gate spaces that expose the top surfaces of the pair of first fin-shaped active area FA1 and FA2, the second fin-shaped active area FB, and the upper insulating pattern 124, respectively, the first and second interfacial layers 142A and 142B, the first and second gate dielectric films 144A and 144B, the dummy gate dielectric film 144S, the first and second normal gates NGA and NGB, and the dummy gate DG, which each has a structure as illustrated in FIGS. 23A to 23C, may be formed in the plurality of gate spaces.

In some exemplary embodiments, the first and second interfacial layers 142A and 142B may each have a thickness of about 5 Å to about 20 Å. However, embodiments are not limited thereto. In some exemplary embodiments, the process of forming the first and second interfacial layers 142A and 142B may be omitted.

The first and second gate dielectric films 144A and 144B, and the dummy gate dielectric film 144S may be formed using an ALD, CVD, or PVD process. The first and second gate dielectric films 144A and 144B, and the dummy gate dielectric film 144S may each have a thickness of about 10 Å to about 40 Å. However, embodiments are not limited thereto.

Before or after the forming of the first and second normal gates NGA and NGB and the dummy gate DG in the first area I and the second area II, a plurality of first and second source/drain areas 172 and 174 may be formed on the pair of first fin-shaped active areas FA1 and FA2 and the second fin-shaped active area FB. In forming the plurality of first source/drain areas 172 on the pair of first fin-shaped active area FA1 and FA2, by forming a recess area R1 where the first source/drain area 172A (refer to FIG. 3) closest to the fin separation area FS among the plurality of first source/drain areas 172 is to be formed, in regions of the pair of first fin-shaped active area FA1 and FA2, which have a step difference ΔST2 (refer to FIG. 22B), and forming in the recess area R1 a semiconductor epitaxial pattern that forms the first source/drain area 172A, as illustrated in FIG. 23B, the outer top surfaces T1 and T2 of the pair of first fin-shaped active areas FA1 and FA2 at side regions between the first and second corners CC1 and CC2, and the first source/drain areas 172A that are closest to the first and second corners CC1 and CC2 may have a height higher than the top surfaces at the other regions, e.g., at center regions of the pair of first fin-shaped active areas FA1 and FA2, i.e., between the first source/drain areas 172A closest to the first and second corners CC1 and CC2 and an opposite side to the first and second corners CC1 and CC2.

According to the method of manufacturing the IC device 100 described above with reference to FIGS. 14A to 23C, by forming the upper insulating pattern 124 having a desired width W2 and height by adjusting the height of the upper insulating layer 530 in the fin separation area FS, and the width of the sacrificial spacer 540S covering opposite sidewalls of the upper insulating layer 530, vertical direction and horizontal direction etch margins of the upper insulating layer 530 may be secured. As a result, when the dummy gate DG is formed on the upper insulating pattern 124 and the first source/drain areas 172 are formed on opposite sides of each of the first and second normal gates NGA and NGB, a short circuit between the dummy gate DG and the first source/drain areas 172 adjacent to the dummy gate DG may be prevented by the upper insulating pattern 124.

Further, to perform the recess process of partially removing the first and second device isolation films 112A and 112B and the isotropic etching process of forming the upper insulating pattern 124 on the lower insulating pattern 122, a wet etching process may be used. Accordingly, the exposed upper portions of the plurality of preliminary active areas PA1, PA2, and PB in the first area I and the second area II may not be exposed to dry etching atmospheres, such as plasma. Thus, there is no concern about upper portions of the plurality of preliminary active areas PA1, PA2, and PB being damaged or deteriorated by dry etching atmospheres, e.g., plasma, during the recess process, and the first and second channel areas CH1 and CH2 each having a comparative large width may be secured. Thus, in a fin-shaped active area of a highly downscaled transistor, e.g., a transistor having a gate length of 10 nm or less, carrier mobility deterioration or defects, such as current density reduction or leakage current increase, may be reduced, and the performance of the highly scaled fin field effect transistor may be improved.

Figure 24A:
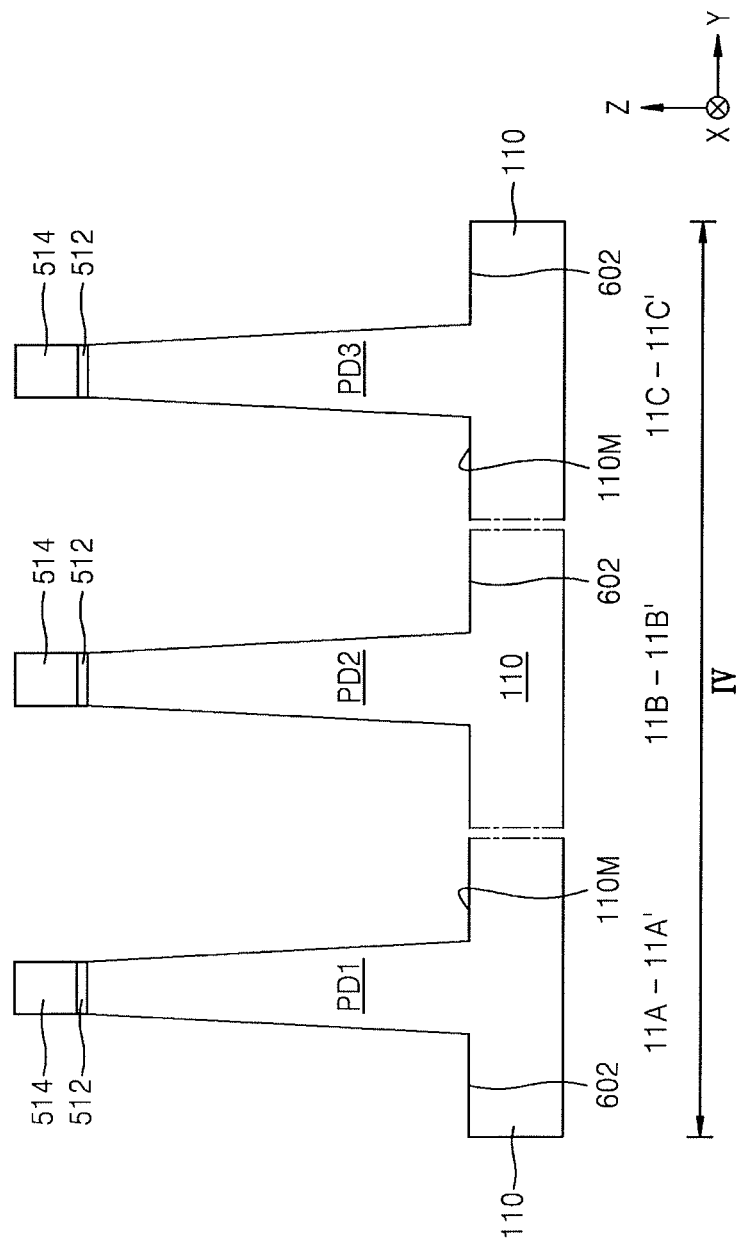
Figure 25A:
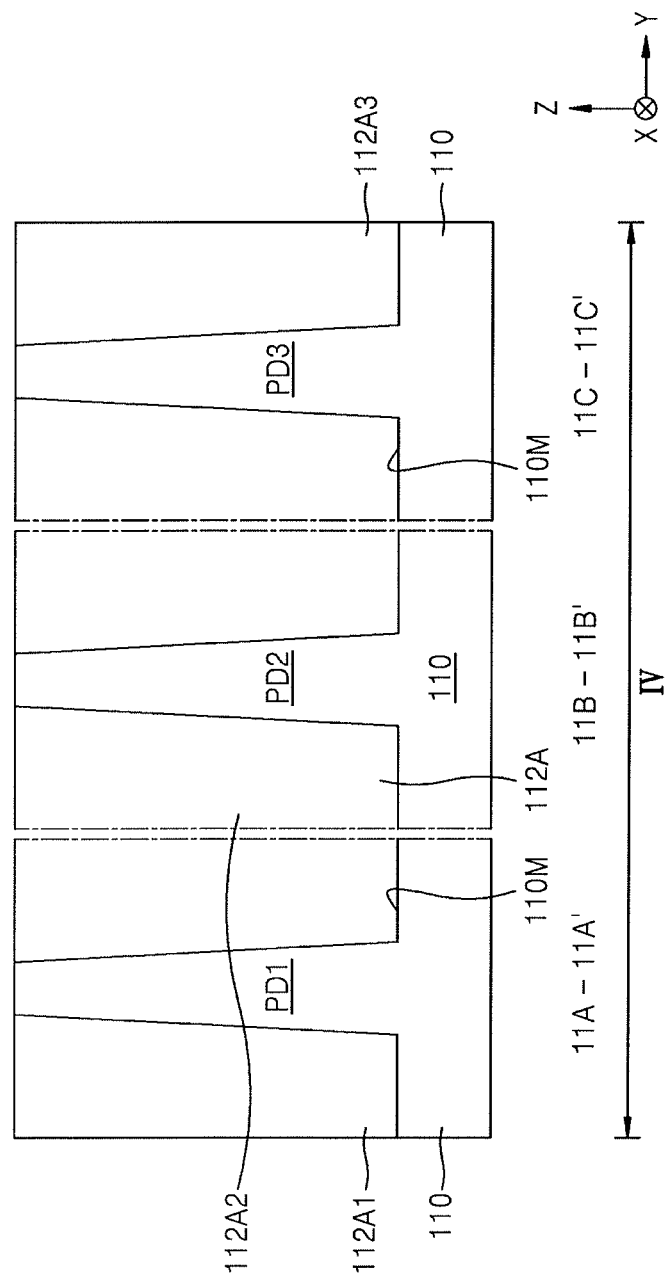
Figure 25B:
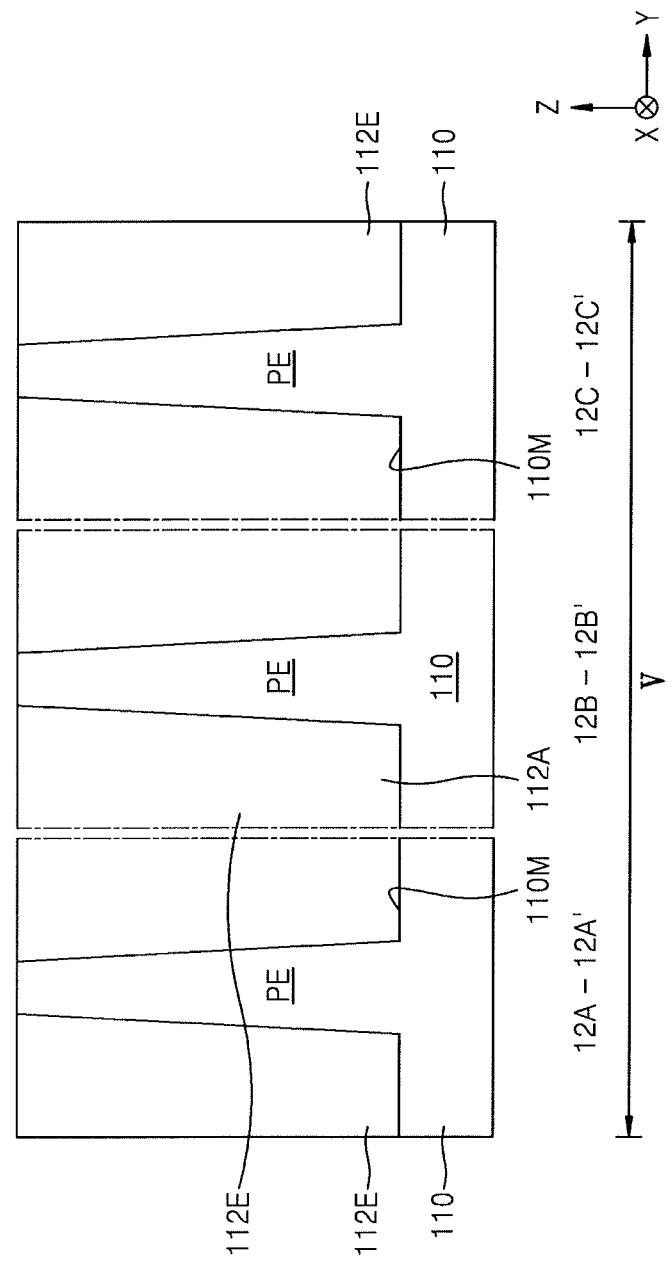
Figure 26A:
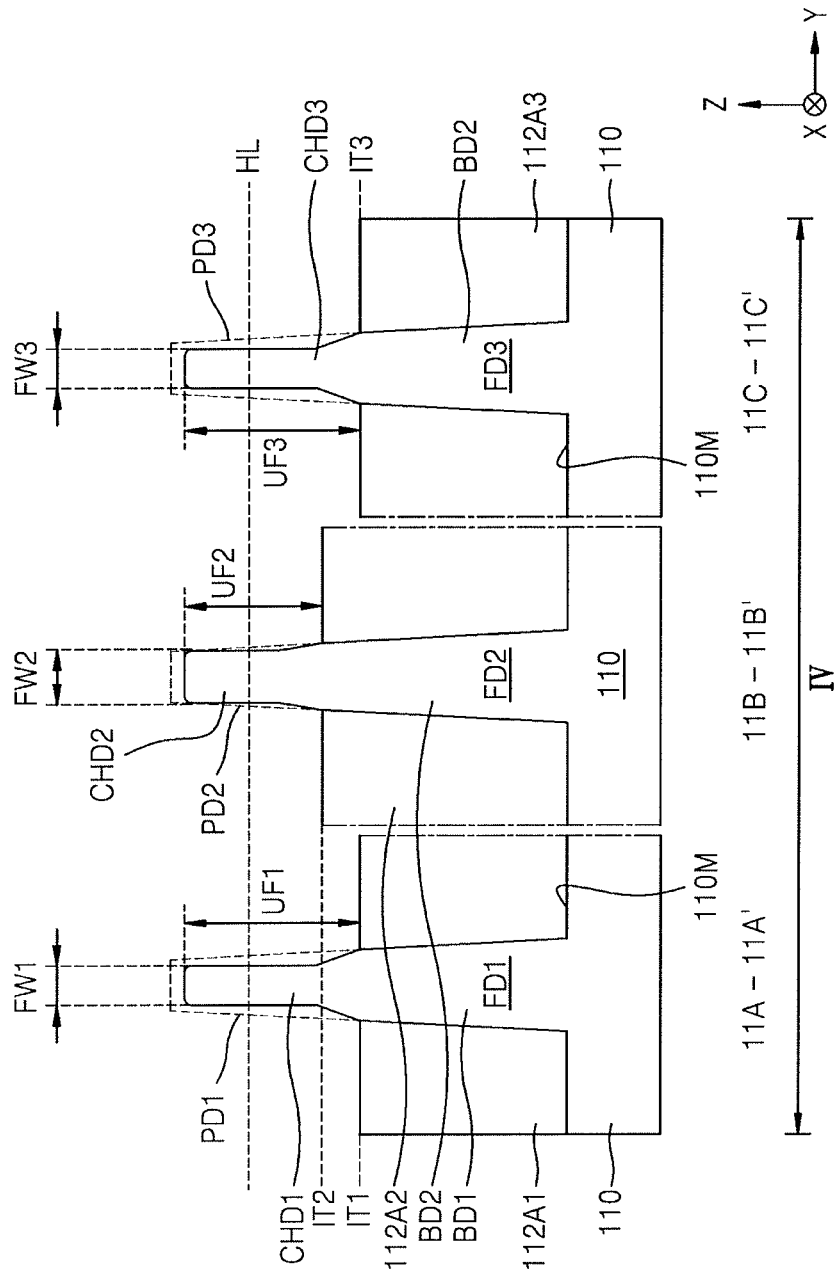
Figure 26B:
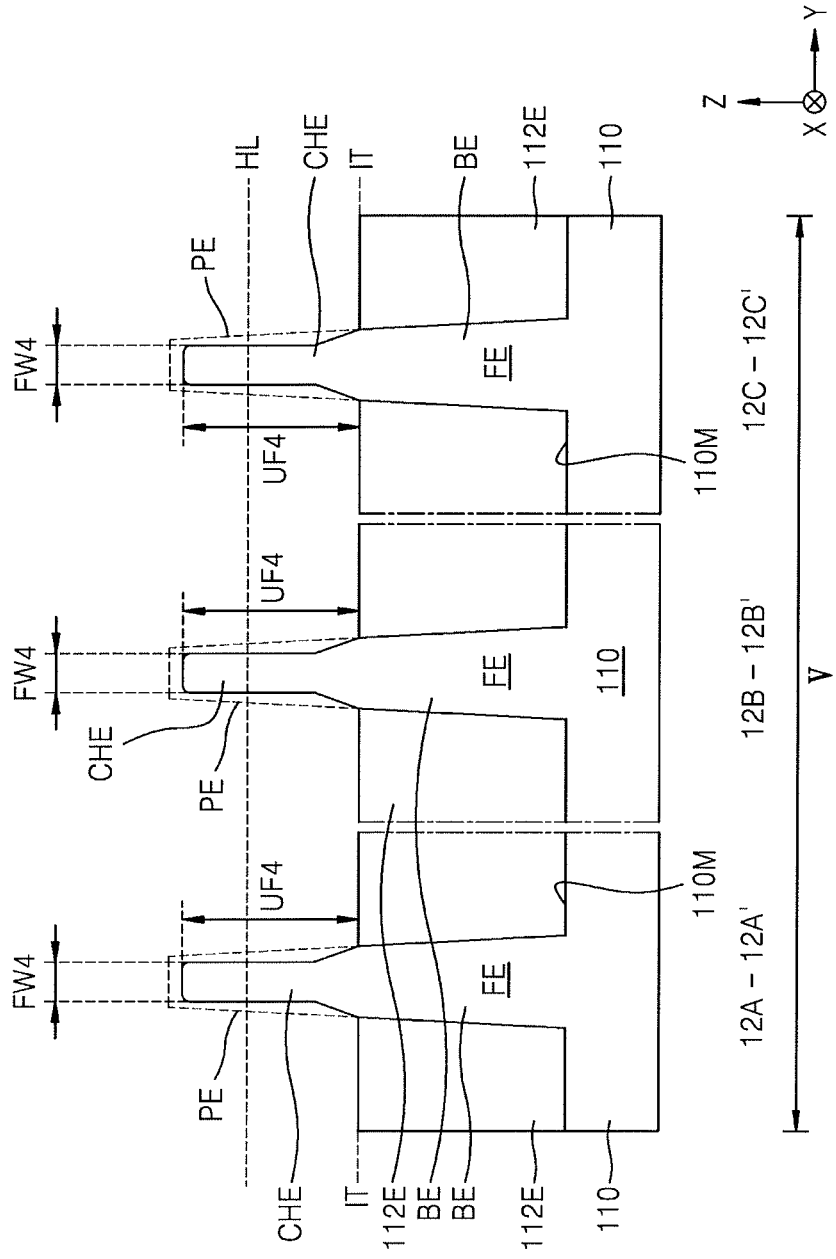

FIGS. 24A to 26B are cross-sectional views illustrating stages in a method of manufacturing an IC device 400, according to exemplary embodiments. In particular, FIGS. 24A, 25A, and 26A illustrate processes of forming the regions of the IC device 400 taken along line 11A-11A', line 11B-11B', and line 11C-11C' of FIG. 10. FIGS. 24B, 25B, and 26B illustrate processes of forming the regions of the IC device 400 taken along line 13A-13A', line 13B-13B', and line 13C-13C' of FIG. 12. An exemplary method of manufacturing the IC device 400 illustrated in FIGS. 10 to 13 will now be described with reference to FIGS. 24A to 26B. In FIGS. 12A to 26B, like reference numerals as those in FIGS. 1 to 13 denote like elements, and thus detailed description thereof will be omitted here.

Referring to FIGS. 24A and 24B, in the fourth area IV and the fifth area V of the substrate, the substrate 110 may be partially removed in a similar manner as described above with reference to FIGS. 14A to 14C, using a plurality of pad oxide film patterns 512 and a plurality of mask patterns 514 as an etch mask, to thereby form a plurality of fourth trenches 602 in the fourth area IV of the substrate 110 and a plurality of fifth trenches 604 in the fifth area V of the substrate 110. The plurality of fourth trenches 602 and the plurality of fifth trenches 604 may define a plurality of preliminary active areas PD1, PD2, and PD3 and a plurality of preliminary active areas PE.

Referring to FIGS. 25A and 25B, in a similar manner as described above with reference to FIGS. 15A to 15C, first to third device isolation films 112A1, 112A2, and 112A3 that have a planar top surface and fill the plurality of fourth trenches 602 (refer to FIG. 24A) may be formed in the fourth area IV of the substrate 100, and a device isolation film 112E that has a planar top surface and fills the plurality of fifth trenches 604 (refer to FIG. 24B) may be formed in the fifth area V of the substrate 110.

Referring to FIGS. 26A and 26B, according to the series of processes described above with reference to FIGS. 16A to 21C, the recess process of partially removing the first to third device isolation films 112A1, 112A2, and 112A3 in the fourth area IV of the substrate 110 and the device isolation film 112E in the fifth area V may be performed to form a plurality of first type fin-shaped active areas FD1, FD2, and FD3 in the fourth area IV, the plurality of first type fin-shape active areas FD1, FD2, and FD3 each having a reduced width at an upper portion thereof with respect to the widths of the plurality of preliminary active areas PD1, PD2, and PD3, and a plurality of second type fin-shaped active areas FE in the fifth area V, the plurality of second type fin-shaped active areas FE each having a reduced width at an upper portion thereof with respect to the widths of the plurality of preliminary active areas PE.

As illustrated in FIG. 10, the first fin separation area FSA and the second fin separation area FSB that may extend parallel to each other with a comparatively short distance therebetween may be disposed in the fourth area IV. During the recess process on the first to third device isolation films 112A1, 112A2, and 112A3 and the device isolation film 112E, isotropically etching the upper insulating layer 530 and the sacrificial spacer 540S that covers sidewalls of the upper insulating layer 530, as described above with reference to FIGS. 22A to 22C, may be performed in the first fin separation area FSA and the second fin separation area FSB of the fourth area IV. Thus, during the recess process on the first to third device isolation films 112A1, 112A2, and 112A3 and the device isolation film 112E, the upper insulating layer 530 and the sacrificial spacer 540S in the first fin separation area FSA and the second fin separation area FSB may serve as a comparatively high barrier for a region between the first fin separation area FSA and the second fin separation area FSB. Accordingly, the region between the first fin separation area FSA and the second fin separation area FSB may be affected less than the other regions by isotropic etching atmosphere due to the structural hindrance by the upper insulating layer 530 and the sacrificial spacer 540S. Thus, the second device isolation film 112A2 among the first to third device isolation films 112A1, 112A2, and 112A3, which is between the first fin separation area FSA and the second fin separation area FSB, may be removed less by the recess process, compared to the first and third device isolation films 112A1 and 112A3. Similar to this, as a result of the recess process on the second device isolation film 112A2, the channel area CHD2 of the second fin-shaped active area FD2 that protrudes above the second device isolation film 112A2 may also be affected less by the wet etching atmosphere in the recess process, compared to the other fin-shaped active areas.

As a result, in the fourth area IV the height IT2 of the top surface of the second device isolation film 112A2 may be higher than the respective heights IT2 and IT3 of the top surfaces of the first and third device isolation films 112A1 and 112A3. The height UF2 of the second channel area CHD2 in a vertical direction (Z direction) in the second fin-shaped active area FD2 may be lower than the respective heights UF1 and UF3 of the first and third channel areas CHD1 and CHD3 in the vertical direction (Z direction) in the first and third fin-shaped active areas FD1 and FD3. Along a horizontal line HL extending in the second direction (Y direction) at a constant level above the substrate 110, the width FW2 of the second channel area CHD2 of the second fin-shaped active area FD2 may be greater than the width FW1 of the first channel area CHD1 of the first fin-shaped active area FD1 and than the width FW3 of the third channel area CHD3 of the third fin-shaped active area FD3.

However, unlike the fourth area IV, the fifth area V may not include a first fin separation area FSA and a second fin separation area FSB that are disposed adjacent to each other. Thus, in the fifth area V a plurality of second type fin-shaped active areas FE may be formed to have a same or similar cross-sectional shape throughout the entire length thereof. In the fifth area V, the height IT of the top surface of the device isolation film 112E may be substantially the same or similar along a lengthwise direction of the second type fin-shaped active area FE. The height IT of the top surface of the device isolation film 112E in the fifth area V may be lower than the height IT2 of the top surface of the second device isolation film 112A2 in the fourth area IV, and be substantially the same as respective heights IT1 and IT3 of the first and third device isolation films 112A1 and 112A3 in the fourth area IV. In each of the plurality of second type fin-shaped active areas FE, a height UF4 of the channel area CHE in a vertical direction (Z direction) may be the same or similar. The height UF4 of the channel area CHE in each of the plurality of second type fin-shaped active areas FE in a vertical direction (Z direction) may be higher than the height UF2 of the second channel area CHD2 in a vertical direction (Z direction) in the second fin-shaped active area FD2 in the fourth area IV. Along a horizontal line HL extending in the second direction (Y direction) at a constant level above the substrate 110, the width FW4 of the channel area CHE in each of the plurality of second type fin-shaped active areas FE may be less than the width FW2 of the second channel area CHD2 in the second fin-shaped active area FD2 in the fourth area IV. Then, by performing the processes described above with reference to FIGS. 23A to 23C, the IC device 400 as illustrated in FIGS. 10 to 13 may be manufactured.

Although the exemplary methods of manufacturing the IC device 100 illustrated in FIGS. 1 to 4 and the IC device 400 illustrated in FIGS. 10 to 13 are described above with reference to FIGS. 14A to 26B, IC devices having various modified structures within the scope of embodiments, e.g., including the structures of the third area III of the IC device 100 illustrated in FIGS. 5 to 7, the IC device 200 illustrated in FIG. 8, and the IC devices 300A and 300b illustrated in FIGS. 9A and 9B, by using any methods changed or modified from the exemplary embodiments are within the scope of embodiments.

Although exemplary IC devices including fin field effect transistors (FinFET) having 3-dimensional channels and exemplary methods of manufacturing the IC devices are described above, embodiments are not limited thereto. It will be obvious to one of ordinary skill in the art to provide, e.g., IC devices including planar metal-oxide-semiconductor field-effect transistors (MOSFET), which have features of embodiments, and methods of manufacturing the same through various modifications and changes within the scope of embodiments.

Figure 27:
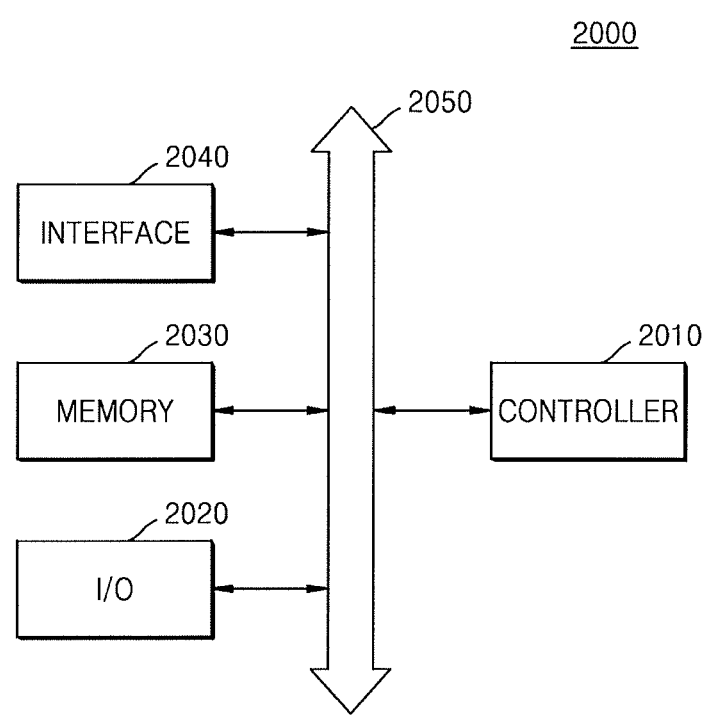
FIG. 27 illustrates a block diagram of an electronic system according to an embodiment.

FIG. 27 is a block diagram of an electronic system 2000 according to an example embodiment.

The electronic system 2000 may include a controller 2010, an input/output (I/O) device 2020, a memory 2030, and an interface 2040 connected to each other through a bus 2050.

The controller 2010 may include at least one of a microprocessor, a digital signal processor, and a similar processor. The I/O device 2020 may include at least one of a keypad, a keyboard, and a display. The memory 2030 may be used for storing commend executed by the controller 2010. For example, the memory 2030 may be used for storing user data.

The electronic system 2000 may constitute a device capable of transmitting and/or receiving information in a wireless communication device or under a wireless environment. The interface 2040 of the electronic system 2000 may be configured with a wireless interface to transmit and receive data through a wireless communication network. The interface 2040 may include an antenna and/or a wireless transceiver. In an example embodiment, the electronic system 2000 may be used for a communication interface protocol of third generation communication system such as a code division multiple access (CDMA), a global system for mobile communications (GSM), a north American digital cellular (NADC), an extended-time division multiple access (E-TDMA), and a wide band code division multiple access (WCMA). The electronic system 2000 may include at least one of the IC devices 100, 200, 300, and 400 according to example embodiments described with reference to FIGS. 1 to 13 and modified IC devices within the scope of embodiments from these.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An integrated circuit (IC) device, comprising:
a pair of fin-shaped active areas that are adjacent to each other with a fin separation area therebetween, the pair of fin-shaped active areas extend in a line; and
a fin separation insulating structure in the fin separation area,
wherein the pair of fin-shaped active areas includes a first fin-shaped active area having a first corner defining part of the fin separation area, and
wherein the fin separation insulating structure includes:
a lower insulating pattern that covers sidewalls of the pair of fin-shaped active areas, and
an upper insulating pattern on the lower insulating pattern to cover at least part of the first corner, the upper insulating pattern having a top surface at a level higher than a top surface of each of the pair of fin-shaped active areas.

2. The IC device as claimed in claim 1, wherein the top surface of the upper insulating pattern has a convex rounded surface profile.

3. The IC device as claimed in claim 1, further comprising a semiconductor epitaxial pattern on a region of the first fin-shaped active area, top surfaces of the first fin-shaped active area at opposite sides of the semiconductor epitaxial pattern having different heights.

4. The IC device as claimed in claim 1, wherein the pair of fin-shaped active areas further comprise a second fin-shaped active area having a second corner defining part of the fin separation area, the upper insulating pattern covering at least part of the second corner.

5. The IC device as claimed in claim 3, wherein an outer top surface of the first fin-shaped active area at an edge thereof has a higher height than an inner top surface of the first fin-shaped active area, the outer top surface being between the semiconductor epitaxial pattern and the fin separation insulating structure, and the inner top surface being farther from the edge of the first fin-shaped active area than the outer top surface.

6. An integrated circuit (IC) device, comprising:
a pair of fin-shaped active areas that are adjacent to each other with a fin separation area therebetween, the pair of fin-shaped active areas extend in a line along a first direction, and the fin separation area having a first width in the first direction;
a fin separation insulating structure in the fin separation area between the pair of fin-shaped active areas, the fin separation insulating structure including a lower insulating pattern and an upper insulating pattern on the lower insulating pattern, the upper insulating pattern extending in a second direction that intersects the first direction, and the upper insulating pattern having a convex rounded top surface profile and having a second width greater than the first width in the first direction;

a normal gate that extends in the second direction in a first fin-shaped active area selected from the pair of fin-shaped active areas; and a semiconductor epitaxial pattern on a region of the first fin-shaped active area between the normal gate and the fin separation insulating structure, the semiconductor epitaxial pattern being spaced apart from the fin separation insulating structure, wherein top surfaces of the first fin-shaped active area at opposite sides of the semiconductor epitaxial pattern have different heights.

7. The IC device as claimed in claim 6, wherein an outer top surface of the first fin-shaped active area at an edge thereof has a higher height than an inner top surface of the first fin-shaped active area, the outer top surface being between the semiconductor epitaxial pattern and the fin separation insulating structure, and the inner top surface being farther from the edge of the first fin-shaped active area than the outer top surface.

8. The IC device as claimed in claim 6, wherein the upper insulating pattern has a top surface at a higher level than a top surface of each of the pair of fin-shaped active area.

9. The IC device as claimed in claim 6, further comprising a dummy gate on the upper insulating pattern, the dummy gate extending parallel to the normal gate.

10. The IC device as claimed in claim 6, wherein the semiconductor epitaxial pattern is in a recess area on the first fin-shaped active area, the semiconductor epitaxial pattern having a top surface at a higher level than a top surface of the first fin-shaped active area.

11. The IC device as claimed in claim 6, wherein the semiconductor epitaxial pattern includes Si or SiC.

12. The IC device as claimed in claim 6, wherein each one of the pair of fin-shaped active areas includes a chamfered corner at an upper portion of an edge region that faces the fin separation area, and the upper insulating pattern of the fin separation insulating structure covers at least part of the chamfered corner.

13. The IC device as claimed in claim 9, wherein a bottom level of the dummy gate is higher than a bottom level of the normal gate.

14. An integrated circuit (IC) device, comprising:
   a pair of fin-shaped active areas that are adjacent to each other with a fin separation area therebetween;
   a normal gate that intersects at least one of the pair of fin-shaped active areas;
   a source/drain area adjacent the normal gate; and
   a fin separation insulating structure in the fin separation area, the fin separation insulating structure including:
      a lower insulating pattern overlapping at least a portion of the source/drain area, and
      an upper insulating pattern on the lower insulating pattern and overlapping at least a portion of the source/drain area, the upper insulating pattern having a larger width than the lower insulating pattern, and having a top surface at a level higher than a top surface of each of the pair of fin-shaped active areas.

15. The IC device as claimed in claim 14, wherein the top surface of the upper insulating pattern has a semicircular cross-section.

16. The IC device as claimed in claim 14, wherein a first portion of the top surface of the fin-shaped active area adjacent the upper insulating pattern is higher than a second portion of the top surface of the fin-shaped active area, the second portion including a portion of the top surface of the fin-shaped active area other than the first portion.

17. The IC device as claimed in claim 14, further comprising a recess between the upper insulating pattern and a lateral side surface of the fin-shaped active area, the lateral side surface of the fin-shaped active area facing the upper insulating pattern.

18. The IC device as claimed in claim 17, further comprising a dummy gate on the upper insulating pattern, the recess separating the dummy gate with the upper insulating pattern from the fin-shaped active area.

* * * * *